US012809001B2

(12) United States Patent
Hirano

(10) Patent No.: US 12,809,001 B2
(45) Date of Patent: Nov. 24, 2026

(54) OSCILLATION CIRCUIT, DISTANCE MEASURING DEVICE, AND DISTANCE MEASURING METHOD

(71) Applicant: SONY SEMICONDUCTOR SOLUTIONS CORPORATION, Kanagawa (JP)

(72) Inventor: Hiroyuki Hirano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 882 days.

(21) Appl. No.: 18/044,497

(22) PCT Filed: Aug. 16, 2021

(86) PCT No.: PCT/JP2021/029948
§ 371 (c)(1),
(2) Date: Mar. 8, 2023

(87) PCT Pub. No.: WO2022/059400
PCT Pub. Date: Mar. 24, 2022

(65) Prior Publication Data

US 2023/0324525 A1 Oct. 12, 2023

(30) Foreign Application Priority Data

Sep. 16, 2020 (JP) ................................. 2020-155732

(51) Int. Cl.
*G01S 7/4865* (2020.01)
*G01S 7/4863* (2020.01)
(Continued)

(52) U.S. Cl.
CPC .......... *G01S 7/4865* (2013.01); *G01S 7/4863* (2013.01); *G01S 7/497* (2013.01); *G01S 17/10* (2013.01);
(Continued)

(58) Field of Classification Search
CPC ...... G01S 7/4865; G01S 7/4863; G01S 17/10; G01S 7/4815; G01S 7/497; H03L 7/099;
(Continued)

(56) References Cited

FOREIGN PATENT DOCUMENTS

| | | |
|---|---|---|
| JP | 11-074762 A | 3/1999 |
| JP | 2002-026696 A | 1/2002 |

(Continued)

OTHER PUBLICATIONS

Article: Sensors, MDPI, Sensors 2018, 18, 3413; doi:10.3390/s18103413 www.mdpi.com/journal/sensors Mutually Coupled Time-to-Digital Converters (TDCs) for Direct Time-of-Flight (dTOF) Image Sensors ‡ Augusto Ronchini Ximenes 1,*,† ID , Preethi Padmanabhan 2,† ID and Edoardo Charbon, Oct. 2018 (Year: 2018).*

(Continued)

*Primary Examiner* — Arnold M Kinkead
(74) *Attorney, Agent, or Firm* — CHIP LAW GROUP

(57) ABSTRACT

Provided is an oscillation circuit that includes a plurality of oscillators and a wiring that connects the plurality of oscillators. The wiring is arranged so as to form a closed path that passes through once each of the plurality of oscillators. The plurality of oscillators is arranged such that impedance viewed from each of the plurality of oscillators in the closed path satisfies a predetermined condition.

22 Claims, 39 Drawing Sheets

(51) Int. Cl.
*G01S 7/497* (2006.01)
*G01S 17/10* (2020.01)
*H03K 3/03* (2006.01)
*H03L 7/099* (2006.01)

(52) U.S. Cl.
CPC ......... *H03K 3/0315* (2013.01); *H03K 3/0322* (2013.01); *H03L 7/099* (2013.01)

(58) Field of Classification Search
CPC ....... H03L 7/0995; H03L 7/24; H03K 3/0322; H03K 3/0315; G01C 3/06
USPC ........................................... 331/2, 45, 57, 46
See application file for complete search history.

(56) References Cited

FOREIGN PATENT DOCUMENTS

| | | | |
|---|---|---|---|
| JP | 2007-208773 | A | 8/2007 |
| JP | 2008-529318 | A | 7/2008 |
| JP | 2011-019053 | A | 1/2011 |
| JP | 2013-090312 | A | 5/2013 |
| JP | 2020-024138 | A | 2/2020 |

OTHER PUBLICATIONS

Ximenes, et al., "Mutually Coupled Ring Oscillators for Large Array Time-of-Flight Imagers", Proceedings of the International Image Sensor Workshop, Hiroshima, Japan, R25, May 30-Jun. 2, 2017, pp. 258-261.

International Search Report and Written Opinion of PCT Application No. PCT/JP2021/029948, issued on Sep. 28, 2021, 11 pages of ISRWO.

* cited by examiner

OSCILLATION CIRCUIT, DISTANCE MEASURING DEVICE, AND DISTANCE MEASURING METHOD

CROSS REFERENCE TO RELATED APPLICATIONS

This application is a U.S. National Phase of International Patent Application No. PCT/JP2021/029948 filed on Aug. 16, 2021, which claims priority benefit of Japanese Patent Application No. JP 2020-155732 filed in the Japan Patent Office on Sep. 16, 2020. Each of the above-referenced applications is hereby incorporated herein by reference in its entirety.

FIELD

The present disclosure relates to an oscillation circuit, a distance measuring device, and a distance measuring method.

BACKGROUND

There is known a method of aligning (locking) frequencies of oscillation signals output from a plurality of oscillators by connecting the plurality of oscillators to each other via resistors (Non Patent Literature 1).

CITATION LIST

Non Patent Literature

Non Patent Literature 1: Augusto Ronchini Ximenes, Preethi Padmanabhan, and Edoardo Charbon1, Mutually Coupled Ring Oscillators for Large Array Time-of-Flight Imagers, Proceedings of the 2017 International Image SensorWorkshop, 2017, p. R25.

SUMMARY

Technical Problem

However, in a conventional oscillation circuit, frequencies of the oscillation signals can be aligned but phases cannot be reliably aligned when the oscillators are connected by wiring having a high resistance value R or capacitance value C. In this case, frequencies may be locked in a state the phases are misaligned.

Therefore, the present disclosure proposes an oscillation circuit, a distance measuring device, and a distance measuring method capable of more reliably aligning phases of oscillation signals.

Note that the above problem or object is merely one of a plurality of problems or objects that can be solved or achieved by a plurality of embodiments disclosed in the present specification.

Solution to Problem

According to the present disclosure, an oscillation circuit is provided. The oscillation circuit includes a plurality of oscillators and a wiring that connects the plurality of oscillators. The wiring is arranged so as to form a closed path that passes through once each of the plurality of oscillators. The plurality of oscillators is arranged such that impedance viewed from each of the plurality of oscillators in the closed path satisfies a predetermined condition.

DESCRIPTION OF EMBODIMENTS

Figure 1:
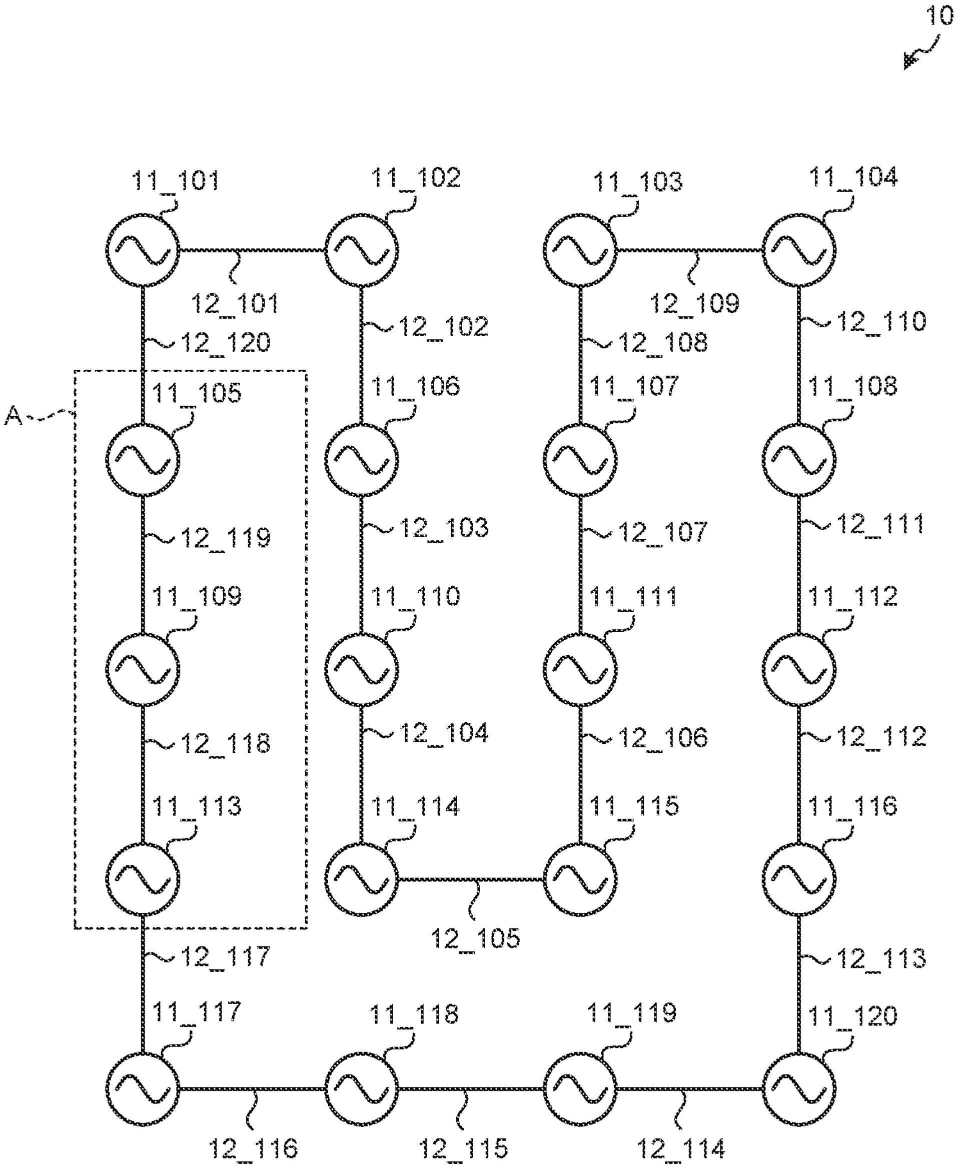
FIG. 1 is a diagram illustrating a configuration example of an oscillation circuit according to a first embodiment of the present disclosure.

In the present specification and the drawings, similar components of different embodiments may be distinguished by adding a different alphabet or number after the same reference sign. However, when it is not necessary to particularly distinguish each of similar components, only the same reference sign is assigned.

In addition, the drawings referred to in the following description intend to facilitate understanding of the description, and shapes, dimensions, ratios, and the like illustrated in the drawings may be different from the actual state for the sake of clarity.

Furthermore, in the following description of a circuit configuration, unless otherwise specified, "connection" means that a plurality of elements are connected such that electricity is conducted therebetween. In addition, "connection" in the following description includes not only a case of directly and electrically connecting a plurality of elements but also a case of indirectly and electrically connecting a plurality of elements via other elements.

In the following description, the description of specific lengths (numerical values) and shapes does not mean only the same values as mathematically defined values or geometrically defined shapes. Specifically, the description of the specific length (numerical value) and shape in the following description includes a case where there is an allowable difference (error/distortion) in the oscillation circuit, the manufacturing process thereof, and the use/operation thereof, and shapes similar to the shape. For example, in the following description, an expression "circular shape" means that the shape is not limited to a perfect circle but includes a shape similar to the perfect circle such as an elliptical shape.

In the following description, one or a plurality of embodiments (examples, applications, and modifications) may be implemented independently. On the other hand, at least some of the plurality of embodiments described below may be appropriately combined with at least some of other embodiments. The plurality of embodiments may include novel features different from each other. Therefore, the plurality of embodiments can contribute to solving different objects or problems, and can exhibit different effects.

Note that the description will be given in the following order.

1. First Embodiment
1.1. Oscillation circuit
1.2. Modified Example 1-1
1.3. Modified Example 1-2
1.4. Modified Example 1-3
2. Second Embodiment
3. Third Embodiment
3.1. Oscillation circuit
3.2. Modified Example 3-1
3.3. Modified Example 3-2
3.4. Modified Example 3-3
4. Fourth Embodiment
5. Fifth Embodiment
5.1. Oscillation circuit
5.2. Modified Example 5-1
6. Sixth Embodiment
6.1. Oscillation circuit
6.2. Modified Example 6-1
7. Seventh Embodiment
7.1. Oscillation circuit
7.2. Modified Example 7-1
8. Eighth Embodiment
9. Ninth Embodiment
9.1. Oscillation circuit
9.2. Modified Example 9-1
10. Tenth Embodiment
10.1. Distance measuring method
10.2. Configuration example of distance measuring device
10.3. Signal delay
10.4. Calculation of correction amount
10.5. Correction process
11. Eleventh Embodiment
12. Twelfth Embodiment
12.1. Configuration example of distance measuring device
12.2. Outline of distance measurement by indirect ToF method
12.3. Generation of exposure control signal
13. Summary

1. First Embodiment

1.1. Oscillation Circuit

FIG. 1 is a diagram illustrating a configuration example of an oscillation circuit 10 according to a first embodiment of the present disclosure. As illustrated in FIG. 1, the oscillation circuit 10 includes a plurality of oscillators 11_101 to 11_120 and wiring 12. Note that, in the following description, when the plurality of oscillators 11_101 to 11_120 is not distinguished, it is simply referred to as an oscillator 11.

In an example in FIG. 1, the oscillation circuit 10 includes 20 oscillators 11_101 to 11_120 arranged in a two-dimensional plane in a matrix. The oscillators 11_101 to 11_120 are oscillators of the same size, and generate oscillation signals of a predetermined frequency and phase.

The wiring 12 includes a plurality of wirings 12_101 to 12_120. The plurality of wirings 12_101 to 12_120 has substantially the same electrical length.

The wiring 12 connects the plurality of oscillators 11_101 to 11_120 to each other. The wiring 12 is arranged so as to form a closed path that passes through once each of the plurality of oscillators 11_101 to 11_120. The closed path visiting each vertex (oscillator 11 in this case) exactly once on a graph is referred to as a Hamiltonian path.

In the example in FIG. 1, the wiring 12 forms the closed path so as to surround a periphery of a U-shaped surface, and the plurality of oscillators 11_101 to 11_120 are arranged on the closed path at substantially equal intervals.

More specifically, the oscillator 11_101 arranged on the upper left in FIG. 1 is connected to the oscillator 11_102 arranged on the right by the wiring 12_101, and the oscillator 11_102 is connected to the oscillator 11_106 arranged below by the wiring 12_102. The oscillator 11_106 is connected to the oscillator 11_110 arranged below by the wiring 12_103, and the oscillator 11_110 is connected to the oscillator 11_114 arranged below by the wiring 12_104.

The oscillator 11_114 is connected to the oscillator 11_115 arranged on the right by the wiring 12_105, and the oscillator 115 is connected to the oscillator 11_111 arranged above by the wiring 12_106. The oscillator 11_111 is connected to the oscillator 11_107 arranged above by the wiring 12_107, and the oscillator 11_107 is connected to the oscillator 11_103 arranged above by the wiring 12_108.

The oscillator 11_103 is connected to the oscillator 11_104 on the right by the wiring 12_109, and the oscillator 11_104 is connected to the oscillator 11_108 below by the wiring 12_110. The oscillator 11_108 is connected to the oscillator 11_112 below by the wiring 12_111, and the oscillator 11_112 is connected to the oscillator 11_116 below by the wiring 12_112.

The oscillator 11_116 is connected to the oscillator 11_120 below by the wiring 12_113, and the oscillator 11_120 is connected to the oscillator 11_119 on the left by the wiring 12_114. The oscillator 11_119 is connected to the oscillator 11_118 on the left by the wiring 12_115, and the oscillator 11_118 is connected to the oscillator 11_117 on the left by the wiring 12_116.

The oscillator 11_117 is connected to the oscillator 11_113 above by the wiring 12_117, and the oscillator 11_113 is connected to the oscillator 11_109 above by the wiring 12_118. The oscillator 11_109 is connected to the oscillator 11_105 above by the wiring 12_119, and the oscillator 11_105 is connected to the oscillator 11_101 above by the wiring 12_120.

Note that the directions indicated by above, below, left, and right here are directions in FIG. 1, and may be different from directions in an actual circuit.

In this manner, the wirings 12_101 to 12_120 connect two oscillators 11 to each other, so that the wiring 12 forms the Hamiltonian path. The Hamiltonian path formed by the wiring 12 and the oscillator 11 has a plurality of turns. In in FIG. 1, for example, the Hamiltonian path is bent at eight positions where the oscillators 11_101, 11_102, 11_114, 11_115, 11_103, 11_104, 11_120, and 11_117 are disposed.

Figure 2:
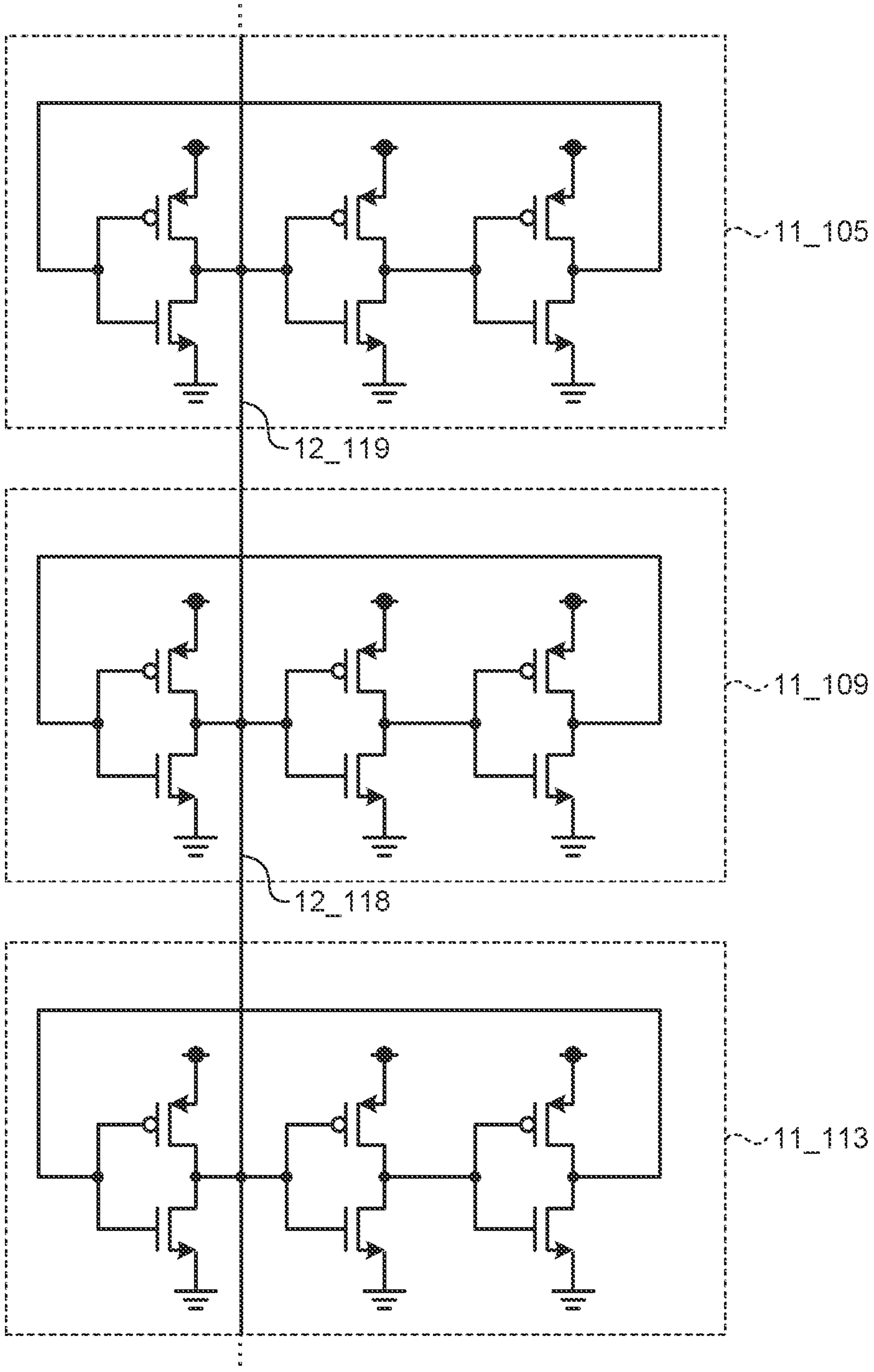
FIG. 2 is a diagram illustrating a connection example of oscillators according to the first embodiment of the present disclosure.

Here, an example of the configuration of the oscillator 11 and the connection of each oscillator 11 will be described. FIG. 2 is a diagram illustrating a connection example of the oscillator 11 according to the first embodiment of the present disclosure.

FIG. 2 illustrates connection examples of the oscillators 11_105, 11_109, and 11_113 illustrated in A of FIG. 1.

As illustrated in FIG. 2, the oscillator 11 includes a plurality of inverters connected in a ring shape. In the example in FIG. 2, the oscillator 11 has three inverters.

Intermediate nodes of one of the plurality of inverters are connected to each other in the oscillators 11. For example, an intermediate node of one inverter of the oscillator 11_105 is connected to an intermediate node of one inverter of the oscillator 11_109 by the wiring 12_119. Furthermore, an intermediate node of one inverter of the oscillator 11_109 is connected to an intermediate node of one inverter of the oscillator 11_113 by the wiring 12_118.

In this manner, the intermediate nodes of one of the plurality of inverters in the oscillators 11 are connected to each other via the wiring 12.

Description returns to FIG. 1. As described above, the wiring 12_101 to 12_120 connect the plurality of oscillators 11_101 to 11_120. As a result, frequencies of oscillation signals generated by the plurality of oscillators 11_101 to 11_120 are locked (synchronized).

Figure 3:
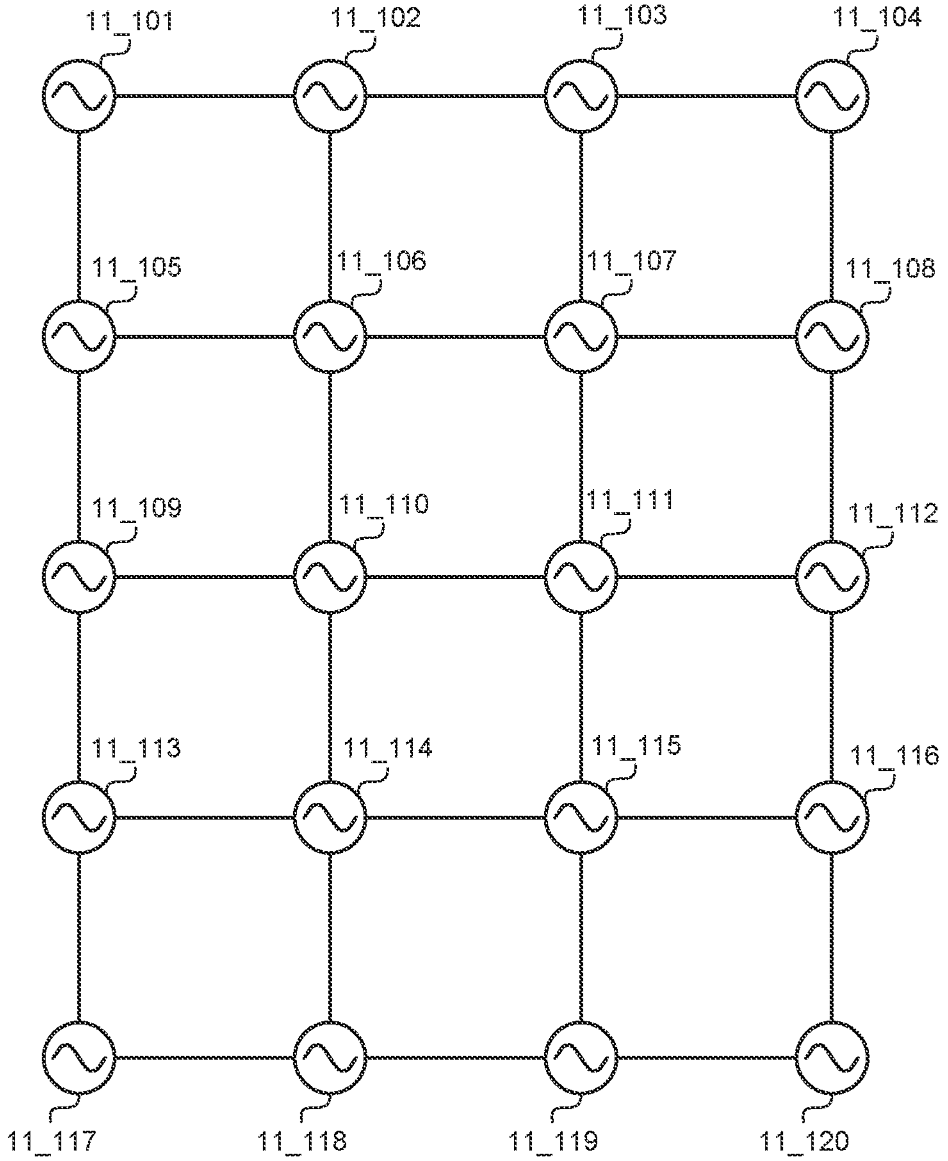
FIG. 3 is a diagram illustrating the operation of the oscillation circuit according to the first embodiment of the present disclosure.

In addition, a phase of the oscillation signal generated by each oscillator 11 of the oscillation circuit 10 is also locked (synchronized). This point will be described with reference to FIG. 3. FIG. 3 is a diagram illustrating the operation of the oscillation circuit 10 according to the first embodiment of the present disclosure.

In the example illustrated in FIG. 3, the oscillators arranged in a two-dimensional plane in a matrix are connected to the oscillators adjacent to each other vertically or horizontally. Therefore, the number of wirings connected to one oscillator is two to four, which is different for each oscillator.

As a result, impedance viewed from the oscillator, in other words, a value of the impedance of a load connected to the oscillator varies depending on the number of wirings connected to the oscillator. When the impedance value viewed from the oscillator varies, the phase of the oscillation signal generated by the oscillator deviates and is hardly locked.

On the other hand, in the oscillation circuit 10 according to the first embodiment of the present disclosure, the number of wirings 12 connected to one oscillator 11 is two, and the same number of wirings 12 are connected to every oscillator 11. Also as described above, the electrical lengths of the wirings 12 are substantially the same. Therefore, the value of the impedance viewed from each oscillator 11 in the Hamiltonian path also has a small variation regardless of the impedance value of the wiring, and the values are matched. In other words, the impedance of each oscillator 11 is substantially symmetrical.

As a result, the phase of the oscillation signal generated by each oscillator 11 can be more reliably locked. In other words, the values of the impedance viewed from the oscillators 11 can be made substantially the same to an extent that the phases of the oscillation signals can be locked in the Hamiltonian path. As described above, the electrical length of the wiring is substantially the same as long as the value of the impedance is substantially the same to the extent that the phase of the oscillation signal is locked.

The oscillation circuit 10 according to the present embodiment can lock the frequency and the phase of the oscillation signal generated by each oscillator 11 regardless of a resistance value and a capacitance value of the wiring 12. Therefore, for example, even when a wiring having a large parasitic resistance value or a parasitic capacitance value (hereinafter referred to as high RC and low RC performance) is used as the wiring 12, the oscillation circuit 10 can more reliably lock the frequency and phase of the oscillation signal. As a result, a degree of freedom of a circuit layout is further improved.

Figure 4:
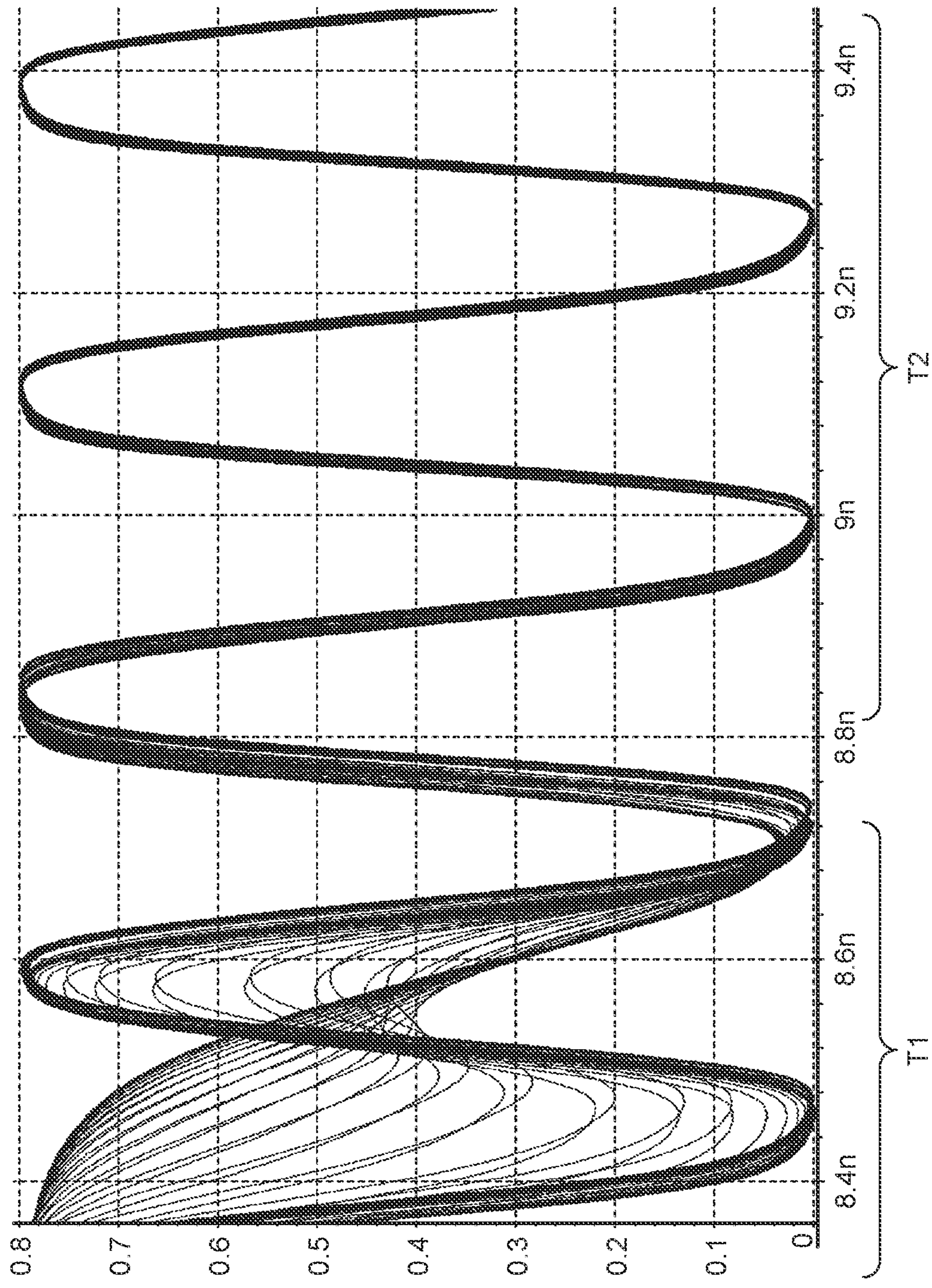
FIG. 4 is a diagram illustrating a simulation result of an oscillation signal of each oscillator of the oscillation circuit according to the first embodiment of the present disclosure.

FIG. 4 is a diagram illustrating a simulation result of the oscillation signal of each oscillator 11 of the oscillation circuit 10 according to the first embodiment of the present disclosure.

A period T1 in FIG. 4 is a period until the oscillation signal is locked after the oscillator 11 is activated, and in this period, neither the phase nor the frequency of each oscillator 11 is locked. On the other hand, in a period T2 after the period T1, both the phase and the frequency of the oscillation signal generated by each oscillator 11 are locked.

As described above, the oscillation circuit 10 according to the first embodiment of the present disclosure includes the plurality of oscillators 11_101 to 11_120 and the wirings 12 that connects the plurality of oscillators 11_101 to 11_120. The wiring 12 is arranged so as to form a closed path that passes through once each of the plurality of oscillators 11_101 to 11_120. The plurality of oscillators 11_101 to 11_120 are arranged such that the impedance viewed from each of the oscillators 11_101 to 11_120 satisfies a predetermined condition in the closed path.

As a result, the oscillation circuit 10 can more reliably lock the frequency and phase of the oscillation signal generated by each of the oscillators 11_101 to 11_120.

In the present embodiment, as an example of the predetermined condition, the plurality of oscillators 11_101 to 11_120 is arranged on a closed path such that values of impedance viewed from each of the oscillators 11_101 to 11_120 are matched (substantially the same).

As a result, the oscillation circuit 10 can more reliably lock the frequency and phase of the oscillation signal generated by each of the oscillators 11_101 to 11_120.

Furthermore, in the present embodiment, as an example of the predetermined condition, the plurality of oscillators 11_101 to 11_120 are arranged on a closed path that is bent a plurality of times.

As a result, the oscillation circuit 10 can more reliably lock the frequency and phase of the oscillation signal generated by each of the oscillators 11_101 to 11_120.

Furthermore, in the present embodiment, as an example of the predetermined condition, the plurality of oscillators 11_101 to 11_120 is arranged on the closed path such that electrical lengths of the wirings are substantially the same.

As a result, the oscillation circuit 10 can more reliably lock the frequency and phase of the oscillation signal generated by each of the oscillators 11_101 to 11_120.

1.2. Modified Example 1-1

Figure 5:
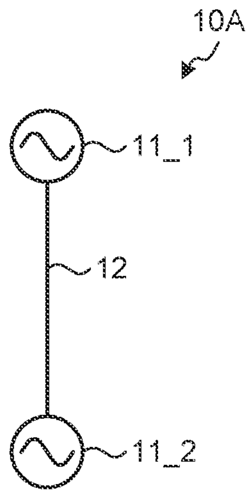
FIG. 5 is a diagram illustrating a configuration example of an oscillation circuit according to Modified Example 1-1 of the first embodiment of the present disclosure.

In Modified Example 1-1 of the first embodiment of the present disclosure, a case where the plurality of oscillators 11 is two will be described. FIG. 5 is a diagram illustrating a configuration example of an oscillation circuit 10A according to Modified Example 1-1 of the first embodiment of the present disclosure.

As illustrated in FIG. 5, the oscillation circuit 10A includes two oscillators 11_1 and 11_2 and a first wiring 12_1 that connects the two oscillators 11_1 and 11_2.

As described above, in the present modified example, when the number of oscillators 11 included in the oscillation circuit 10A is two, a closed path formed by the wiring 12 is a path formed by the first wiring 12_1. As described above, the number of the plurality of oscillators 11 connected by the wiring 12 to form the closed path also includes two oscillators.

As illustrated in FIG. 5, also when there are two oscillators 11, one wiring 12 is connected to each oscillator 11, which is also the same number of wirings. Thus, the variation in values of the impedance viewed from the oscillators 11 is small, and the values of the impedance are matched. As a result, the oscillation circuit 10A can more reliably lock the phase and frequency of the oscillation signal generated by each oscillator 11.

Figure 6:
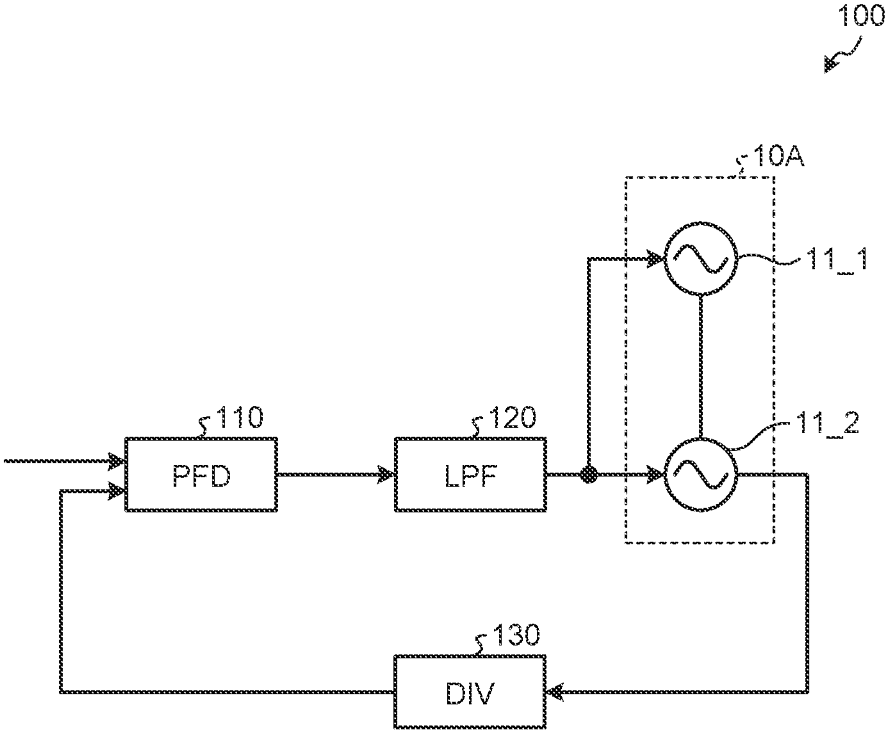
FIG. 6 is a diagram illustrating an example in which the oscillation circuit illustrated in FIG. 5 is applied to a PLL circuit.

FIG. 6 is a diagram illustrating an example in which the oscillation circuit 10A illustrated in FIG. 5 is applied to a PLL circuit 100. The PLL circuit 100 illustrated in FIG. 6 includes a phase frequency detector (PFD) 110, a low pass filter 120, the oscillation circuit 10A, and a frequency divider (DIV) 130.

The phase frequency detector 110 compares phases of a reference signal and a frequency divided signal output from the frequency divider 130, and outputs a control signal corresponding to a phase difference. The low pass filter 120 smooths the control signal output from the phase frequency detector 110 and converts the control signal into a voltage signal. The voltage signal is input to each of the oscillators 11_1 and 11_2 of the oscillation circuit 10A.

The oscillators 11_1 and 11_2 of the oscillation circuit 10A generate an oscillation signal having a frequency corresponding to the voltage signal. The frequency divider 130 outputs, to the phase frequency detector 110, a divided frequency signal obtained by dividing the oscillation signal generated by the oscillator 11_2.

Here, it is assumed that the oscillation circuit 10A includes a frequency variable oscillator 11 that can change the frequency according to the voltage signal.

As described above, by using the oscillation circuit 10A as a VCO of the PLL circuit 100, it is possible to simultaneously generate a plurality of oscillation signals having a variable frequency with locked phase.

1.3. Modified Example 1-2

In the first embodiment, the case where the intermediate nodes of one inverter among the plurality of inverters are connected has been described as an example of connection between the oscillators 11, but the example of connection of the oscillators 11 is not limited thereto. For example, all the intermediate nodes of the plurality of inverters may be connected to each other.

Figure 7:
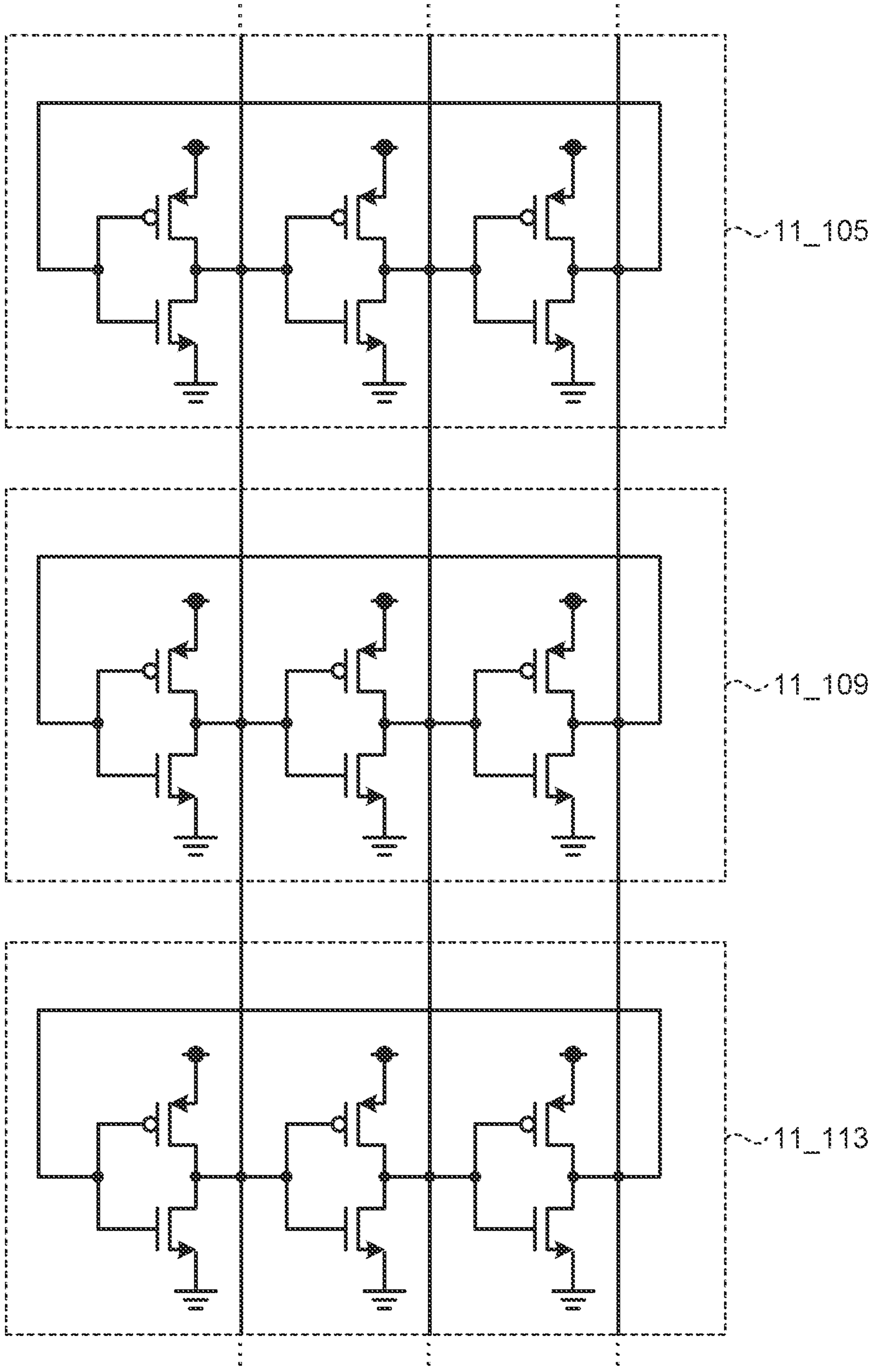
FIG. 7 is a diagram illustrating a connection example of an oscillator according to Modified Example 1-2 of the first embodiment of the present disclosure.

FIG. 7 is a diagram illustrating a connection example of the oscillator 11 according to Modified Example 1-2 of the first embodiment of the present disclosure.

FIG. 7 illustrates another example of connection of the oscillators 11_105, 11_109, and 11_113 illustrated in A of FIG. 1.

As illustrated in FIG. 7, the oscillator 11 includes a plurality of inverters connected in a ring shape. In the example in FIG. 7, each oscillator 11 includes three inverters. In the oscillator 11, intermediate nodes of the plurality of inverters are connected to each other.

For example, an intermediate node of one inverter of the oscillator 11_105 is connected to an intermediate node of one inverter of the oscillator 11_109. In addition, an intermediate node of one inverter of the oscillator 11_109 is connected to an intermediate node of the one inverter of the oscillator 11_113.

Furthermore, in the present modified example, an intermediate node of another inverter of the oscillator 11_105 is connected to an intermediate node of another inverter of the oscillator 11_109. Furthermore, an intermediate node of another inverter of the oscillator 11_109 is connected to an intermediate node of the another inverter of the oscillator 11_113.

Furthermore, in the present modified example, an intermediate node of a remaining inverter of the oscillator 11_105 is connected to an intermediate node of a remaining inverter of the oscillator 11_109. In addition, an intermediate node of the remaining inverter of the oscillator 11_109 is connected to an intermediate node of a remaining inverter of the oscillator 11_113.

As described above, in the present modified example, all the intermediate nodes of the plurality of inverters are connected to each other. As a result, variation in the values of the impedance viewed from the inverters can be reduced, and the phase of the oscillation signal generated by each oscillator 11 of the oscillation circuit 10 can be more reliably locked.

In FIG. 7, all the intermediate nodes of the plurality of inverters are connected to each other, but the present invention is not limited thereto. In order to connect the oscillators 11 to each other, one (FIG. 2) or two intermediate nodes of the plurality of inverters may be connected to each other by the wiring 12.

1.4. Modified Example 1-3

In the above embodiment and modified examples, case where the oscillator 11 includes the plurality of inverters has been described, but the present invention is not limited thereto. For example, the oscillator 11 may include a plurality of NAND gate circuits.

Figure 8:
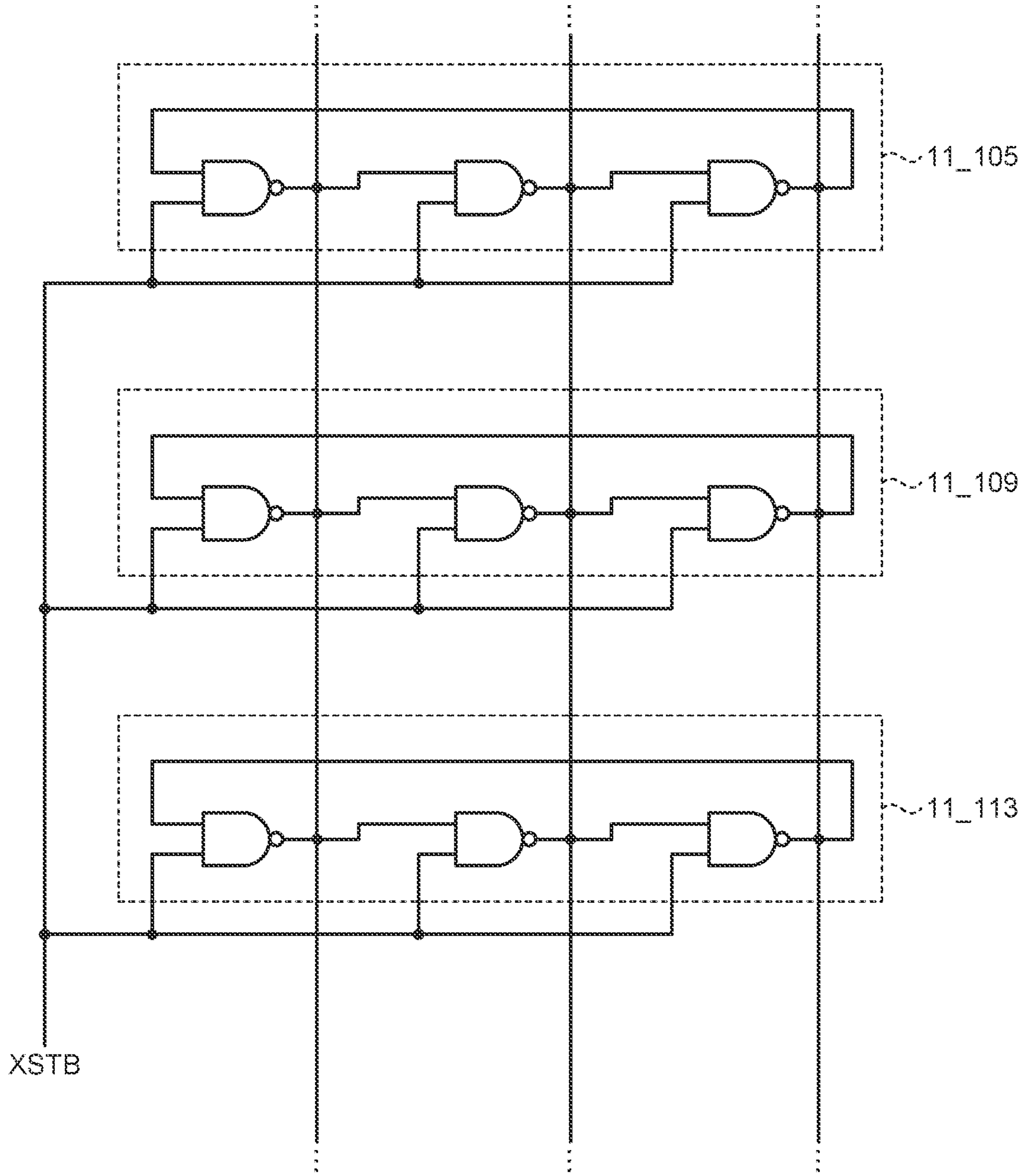
FIG. 8 is a diagram illustrating an example of an oscillator according to Modified Example 1-3 of the first embodiment of the present disclosure.

FIG. 8 is a diagram illustrating an example of the oscillator 11 according to Modified Example 1-3 of the first embodiment of the present disclosure.

FIG. 8 illustrates another example of connection of the oscillators 11_105, 11_109, and 11_113 illustrated in A of FIG. 1.

As illustrated in FIG. 8, the oscillator 11 includes a plurality of NAND gate circuits connected in a ring shape. In the example in FIG. 8, the oscillator 11 includes three NAND gate circuits. In the oscillator 11, intermediate nodes of the plurality of NAND gate circuits are connected to each other.

An output signal of an adjacent NAND gate circuit and a standby signal XSTB are input to each NAND gate circuit. The oscillator 11 generates the oscillation signal according to the standby signal XSTB.

As described above, since the oscillator 11 includes the NAND gate circuits, the oscillation circuit 10 can have a standby function.

Note that, in the first embodiment and Modified Examples 1-2 and 1-3, the case where the oscillator 11 is a single-phase ring oscillator (ROSC) has been described, but the oscillator 11 may be a differential or pseudo differential ring oscillator. Alternatively, the oscillator 11 is not limited to a ring oscillator, and may be, for example, an LC-tank based oscillator.

In addition, a parasitic resistance or a parasitic capacitance is naturally attached to a node to which the wiring 12 of the oscillator 11 is connected, but the value of the impedance can be adjusted by an adjustment circuit or the like described later. As a result, it is possible to reduce the variation in the value of the impedance viewed from each oscillator 11 or each intermediate node of the oscillator 11. In addition, when the oscillator 11 is a ring oscillator, the oscillation frequency can be delayed to some extent by loading a capacitance to each intermediate node. Alternatively, a frequency divider may be used as a method of lowering the frequency.

Furthermore, when the oscillator 11 is the ring oscillator, the oscillation frequency of the oscillator 11 can be adjusted by vertically stacking MOS transistors on each node and increasing effective reactance to increase Ron (on-resistance). This configuration will be described later.

2. Second Embodiment

In the above embodiment, the case where the wiring 12 forms one closed path has been described, but the present invention is not limited thereto. The wiring 12 may form a plurality of closed paths.

Figure 9:
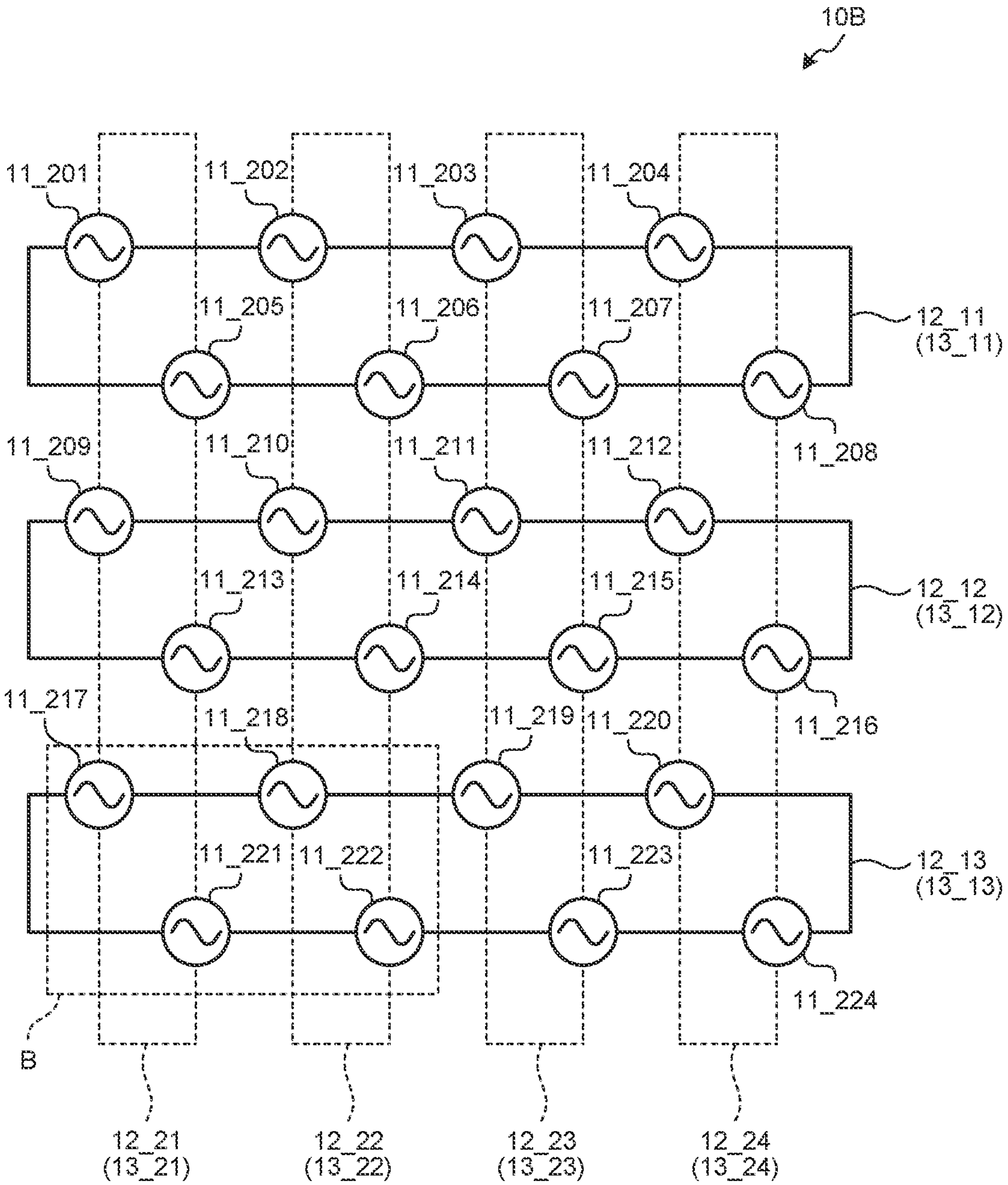
FIG. 9 is a diagram illustrating a configuration example of an oscillation circuit according to a second embodiment of the present disclosure.

FIG. 9 is a diagram illustrating a configuration example of an oscillation circuit 10B according to a second embodiment of the present disclosure. The oscillation circuit 10B illustrated in FIG. 9 includes a plurality of oscillators 11_201 to 11_224 and wiring 12.

The plurality of oscillators 11_201 to 11_224 are arranged in a mesh shape on a two-dimensional plane.

The wiring 12 is arranged so as to form a plurality of closed paths that passes through once each of at least two oscillators 11 among the plurality of oscillators 11_201 to 11_224. More specifically, the wiring 12 is arranged to form a first closed path group including at least one first closed path passing through once each of k pieces of the oscillator 11, and a second closed path group including at least one second closed path passing through once each of m pieces of the oscillator 11.

In the example in FIG. 9, the wiring 12 is arranged to form the first closed path group including first closed paths 13_11 to 13_13 that passes through once each of k=8 oscillators 11 and the second closed path group including second closed paths 13_21 to 13_24 that passes through once each of m=6 oscillators 11.

More specifically, the first closed path 13_11 is formed by the wiring 12_11 connecting the oscillators 11_201 to 11_208. The first closed path 13_12 is formed by the wiring 12_12 connecting the oscillators 11_209 to 11_216. The first closed path 13_13 is formed by wiring 12_13 connecting the oscillators 11_217 to 11_224.

The second closed path 13_21 is formed by wiring 12_21 connecting the oscillators 11_201, 11_205, 11_209, 11_213, 11_217, and 11_221. The second closed path 13_22 is formed by wiring 12_22 connecting the oscillators 11_202, 11_206, 11_210, 11_214, 11_218, and 11_222. The second closed path 13_23 is formed by wiring 12_23 connecting the oscillators 11_203, 11_207, 11_211, 11_215, 11_219, and 11_223. The second closed path 13_24 is formed by wiring 12_24 connecting the oscillators 11_204, 11_208, 11_212, 11_216, 11_220, and 11_224.

The plurality of oscillators 11_201 to 11_224 are arranged to be included in both the first closed path and the second closed path. For example, the oscillator 11_201 is disposed on the first closed path 13_11 and is also disposed on the second closed path 13_21. As described above, the oscillators 11 are arranged on a plurality of closed paths included in different closed path groups.

Note that, in FIG. 9, the wirings 12_21 to 12_24 are indicated by dotted lines, but this is for distinguishing from the wirings 12_11 to 12_13, and are actually the same wirings as the wirings 12_11 to 12_13.

In addition, in FIG. 9, the lengths of the wirings connecting the oscillators 11 may be different, but this is for making the drawing easy to see. Practically, the electrical lengths of the wirings connecting the oscillators 11 are substantially the same to the extent that the phases of the oscillators 11 are locked.

Figure 10:
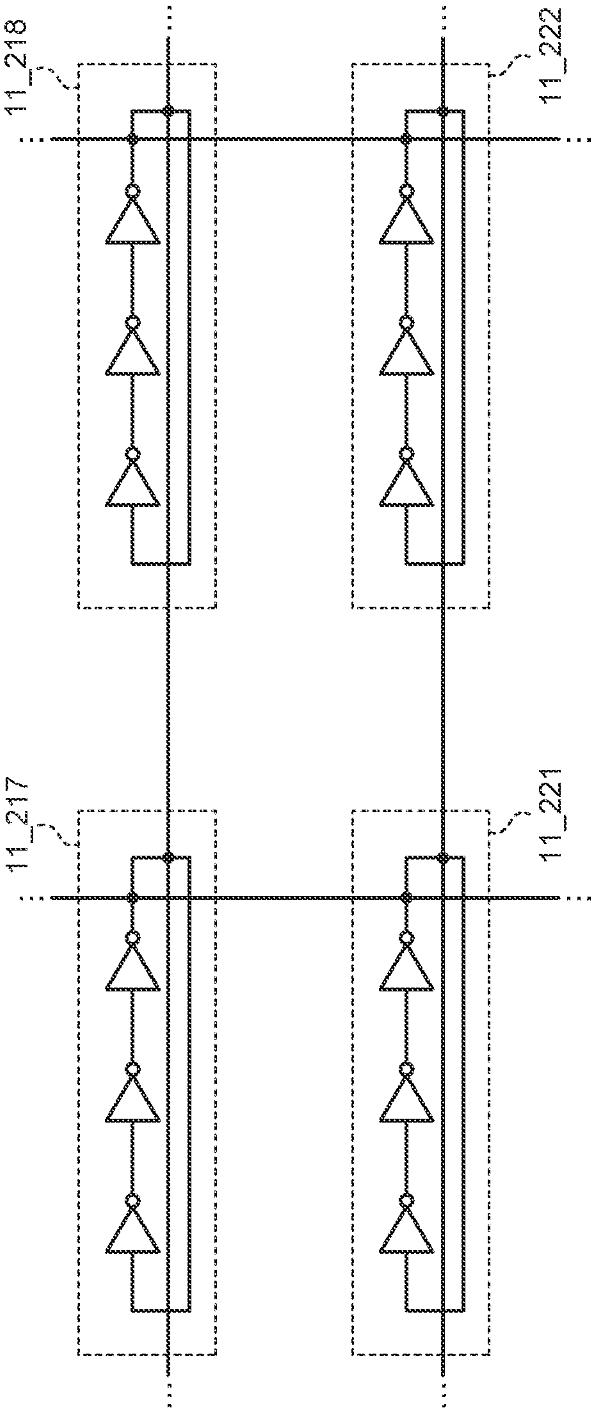
FIG. 10 is a diagram illustrating a connection example of oscillators according to the second embodiment of the present disclosure.

Here, an example of connection between the oscillators 11 will be described. FIG. 10 is a diagram illustrating a connection example of the oscillators 11 according to the second embodiment of the present disclosure.

FIG. 10 illustrates the connection example of the oscillators 11_217, 11_218, 11_221, and 11_222 illustrated in B of FIG. 9.

As illustrated in FIG. 10, the oscillator 11 includes a plurality of inverters connected in a ring shape. In the example in FIG. 10, the oscillator 11 includes three inverters.

Intermediate nodes of one of the plurality of inverters are connected to each other in the oscillators 11. For example, an intermediate node of one inverter of the oscillator 11_217 is connected to an intermediate node of one inverter of the oscillator 11_218 and one intermediate node of the oscillator 11_221. Furthermore, an intermediate node of one inverter of the oscillator 11_222 is connected to an intermediate node of one inverter of the oscillator 11_221 and one intermediate node of the oscillator 11_118.

Note that FIG. 10 illustrates a case where the oscillators 11 are connected by connecting intermediate nodes of one of the plurality of inverters to each other, but the present invention is not limited thereto. For example, the oscillators 11 may be connected by connecting all the intermediate nodes of the plurality of inverters. In this manner, at least one intermediate node of one of the plurality of inverters in the oscillator 11 is connected to that in another oscillator 11 to connect the oscillators 11.

As described above, in the oscillation circuit 10B according to the present embodiment, the wiring 12 is arranged so as to form the s-th closed path group including at least one of the s-th closed path (s is an integer of 1 or above). For example, in FIGS. 9, s=1 and 2, and the wiring 12 is arranged so as to form the first closed path group including the first closed paths 13_11 to 13_13 and the second closed path group including the second closed path 13_21 to 13_24.

The s-th closed path is a closed path that passes through once each of p pieces of the oscillators 11 (p is an integer of 1 or above). In FIG. 9, the first closed paths 13_11 to 13_13 (s=1) are a closed path that passes through once each of eight (p=8) pieces of the oscillators 11, and the second closed paths 13_21 to 13_24 (s=2) are a closed path that passes through once each of six (p=6) pieces of the oscillators 11. The p pieces of the oscillators 11 are electrically arranged at substantially equal intervals on the s-th closed path.

Further, the oscillators 11 are formed on a plurality of s-th closed paths. The plurality of s-th closed paths is a closed path included in different s-th closed path groups. For example, in FIG. 9, the oscillators 11 are formed on the first closed path (s=1) and the second closed path (s=2). Specifically, for example, the oscillator 11_201 is formed on the first closed path 13_11 and the second closed path 13_21.

As described above, in the oscillation circuit 10B, by connecting the oscillators 11 with the wirings 12 forming a plurality of different closed paths, the impedance values in the respective closed paths viewed from the oscillators 11 are aligned to reduce variations. As a result, the phase of the oscillation signal generated by the oscillator 11 can be more reliably locked.

3. Third Embodiment

3.1. Oscillation Circuit

In the second embodiment, the case where the oscillators 11 are included in the plurality of closed paths has been described, but the present invention is not limited thereto. The oscillators 11 may be included in one of the plurality of closed paths.

Figure 11:
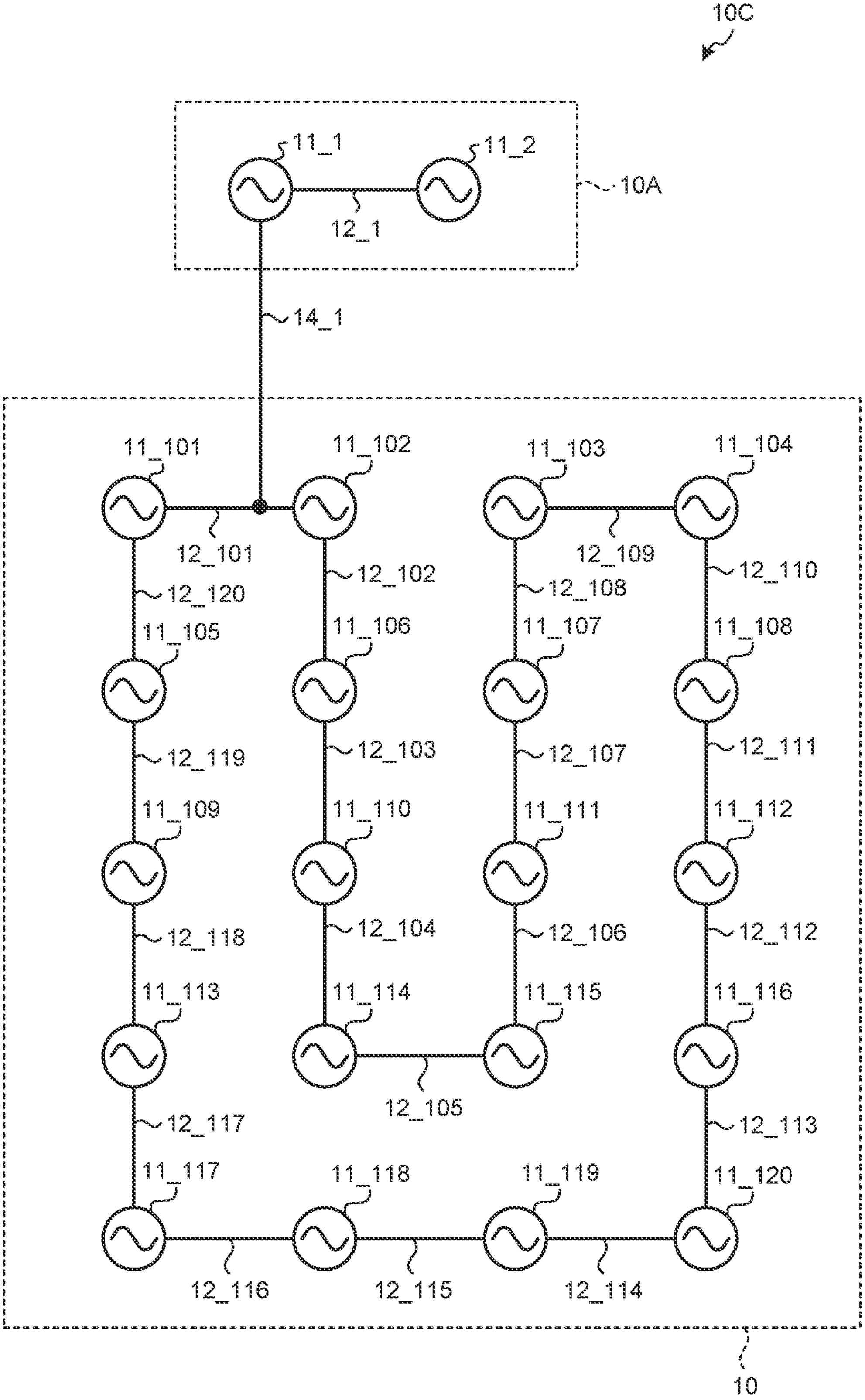
FIG. 11 is a diagram illustrating a configuration example of an oscillation circuit according to a third embodiment of the present disclosure.

FIG. 11 is a diagram illustrating a configuration example of an oscillation circuit 10C according to a third embodiment of the present disclosure. The oscillation circuit 10C illustrated in FIG. 11 includes the oscillation circuit 10 illustrated in FIG. 1, the oscillation circuit 10A illustrated in FIG. 5, and a second wiring 14_1 that connects the oscillation circuit 10 and the oscillation circuit 10A.

The second wiring 14_1 is, for example, a wiring having a smaller RC than the wiring 12 of the oscillation circuits 10 and 10A. The second wiring 14_1 can be formed of, for example, a global wiring. In addition, the wiring 12 can be formed of, for example, a local wiring having RC larger than that of the second wiring 14_1.

As described above, even in the oscillators 11 arranged on different closed paths, it is possible to more reliably lock the oscillators 11 of different closed paths at the same frequency and phase by connecting the different closed paths by the wiring having a low RC.

In addition, by arranging the plurality of oscillators 11 in different closed paths, the degree of freedom of the circuit layout of the oscillators 11 is improved.

Figure 12:
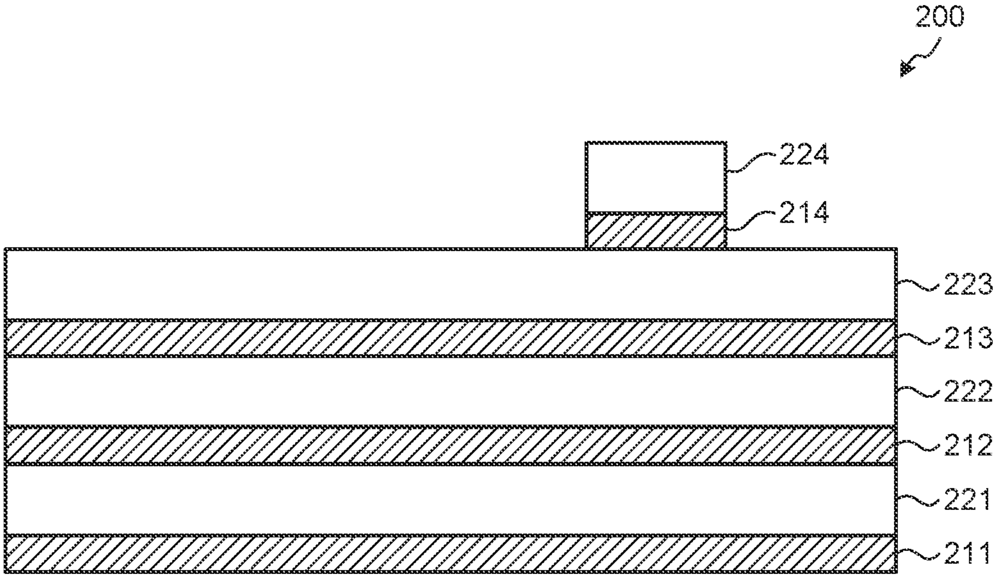
FIG. 12 is a diagram illustrating a layout of the oscillation circuit according to the third embodiment of the present disclosure.

FIG. 12 is a diagram illustrating a layout of the oscillation circuit 10C according to the third embodiment of the present disclosure.

For example, it is assumed that the oscillation circuit 10C is arranged in a layout 200 illustrated in FIG. 12. Here, the layout 200 includes regions 211 to 214 in which a plurality of oscillators can be arranged and regions 221 to 224 in which the oscillators cannot be arranged.

Here, the region 224 in which an oscillator arrangement is not possible is, for example, a region in which a read circuit of a reference pixel is arranged, and the regions 221 to 223 are, for example, regions in which a read circuit of a normal pixel is arranged. In addition, it is assumed that a circuit including the oscillation circuit, wiring, and the like can be arranged in the region 11 to 214.

In the layout 200 having the above constraint, when an oscillation circuit group is arranged so as to be phase-synchronized with each other, there is a possibility that the oscillation circuit group cannot be arranged so as to be phase-synchronized depending on a ratio of a scale of the regions 221 to 223 to a scale of the regions 211 to 214.

As described above, the oscillation circuit 10C connects the plurality of closed paths by the second wiring 14_1. Therefore, each of the closed paths can be arranged in a different region. For example, in FIG. 12, the oscillation circuit 10 is arranged in the region 213, the oscillation circuit 10A is arranged in the region 214, and the oscillation circuits 10 and 10A are connected by the second wiring 14_1. As a result, the oscillation circuit 10C can lock the oscillators 11 arranged in the different regions 213 and 214 at the same phase and frequency.

Note that the oscillators 11 included in different closed paths may have different sizes. In other words, the size of the oscillators 11 included in the oscillation circuit 10 and the size of the oscillators 11 included in the oscillation circuit 10A may be different. In this case, the phase of the oscillation signal can be locked more reliably by reducing the size of the oscillators 11 in the closed path having a smaller number of oscillators 11.

As described above, the wiring 12 of the oscillation circuit 10C according to the third embodiment of the present disclosure is disposed so as to form a plurality of closed paths (the closed path of the oscillation circuit 10 and the closed path of the oscillation circuit 10A) that passes through once each of at least two oscillators 11 in the plurality of oscillators 11. In addition, the plurality of oscillators 11 is arranged to be included in one of the plurality of closed paths. In addition, the plurality of closed paths is connected by the second wiring 14_1 having a smaller resistance value than the wiring 12.

As a result, the oscillation circuit 10C can more reliably lock the phases and frequencies of the oscillators 11 arranged in different closed paths, and thus the degree of freedom of the circuit layout can be improved.

3.2. Modified Example 3-1

In the third embodiment, the case where the oscillation circuit 10 and the oscillation circuit 10A are connected by the second wiring 14_1 has been described, but the present invention is not limited thereto. Other oscillation circuits may be connected by the second wiring.

Figure 13:
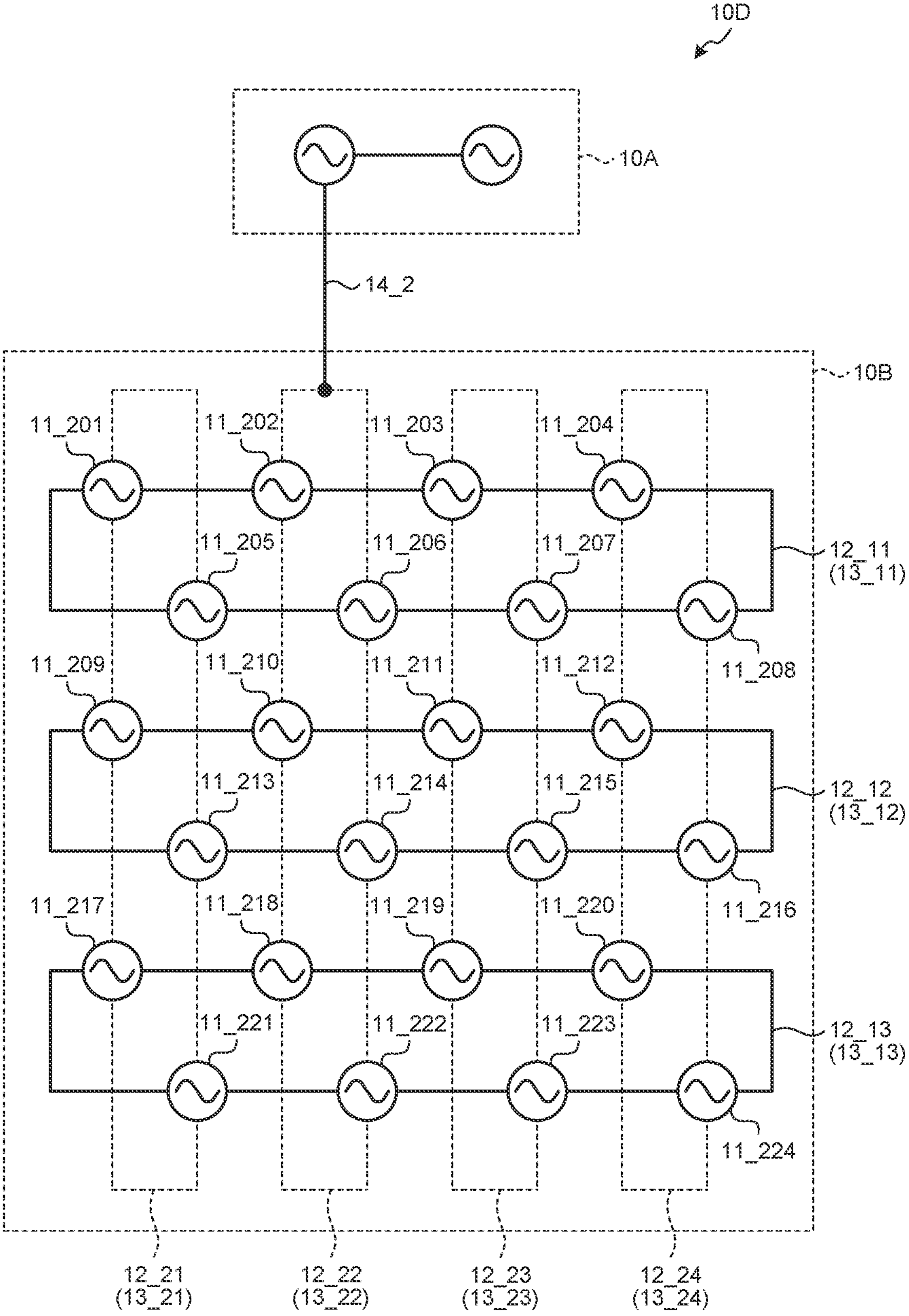
FIG. 13 is a diagram illustrating a configuration example of an oscillation circuit according to Modified Example 3-1 of the third embodiment of the present disclosure.

FIG. 13 is a diagram illustrating a configuration example of an oscillation circuit 10D according to Modified Example 3-1 of the third embodiment of the present disclosure. The oscillation circuit 10D illustrated in FIG. 13 includes the oscillation circuit 10B illustrated in FIG. 9, the oscillation circuit 10A illustrated in FIG. 5, and a second wiring 14_2 that connects the oscillation circuit 10B and the oscillation circuit 10A.

Similarly to the second wiring 14_1, the second wiring 14_2 is, for example, a wiring having a smaller RC than the wiring 12 of the oscillation circuits 10B and 10A. Hereinafter, when the second wirings 14_1 and 14_2 are not distinguished, they are also simply referred to as the second wiring 14.

In this manner, the oscillation circuit 10B illustrated in FIG. 9 can also be connected to another oscillation circuit 10A using the second wiring 14.

The case where the oscillation circuit 10B and the oscillation circuit 10A are connected using the second wiring 14 has been described here, but, for example, the oscillation circuit 10 and the oscillation circuit 10B may be connected using the second wiring 14.

3.3. Modified Example 3-2

In the third embodiment and Modified Example 3-1 described above, the case where two oscillation circuits are connected by the second wiring 14 has been described, but the present invention is not limited thereto. The second wiring 14 may connect three or more oscillation circuits.

Figure 14:
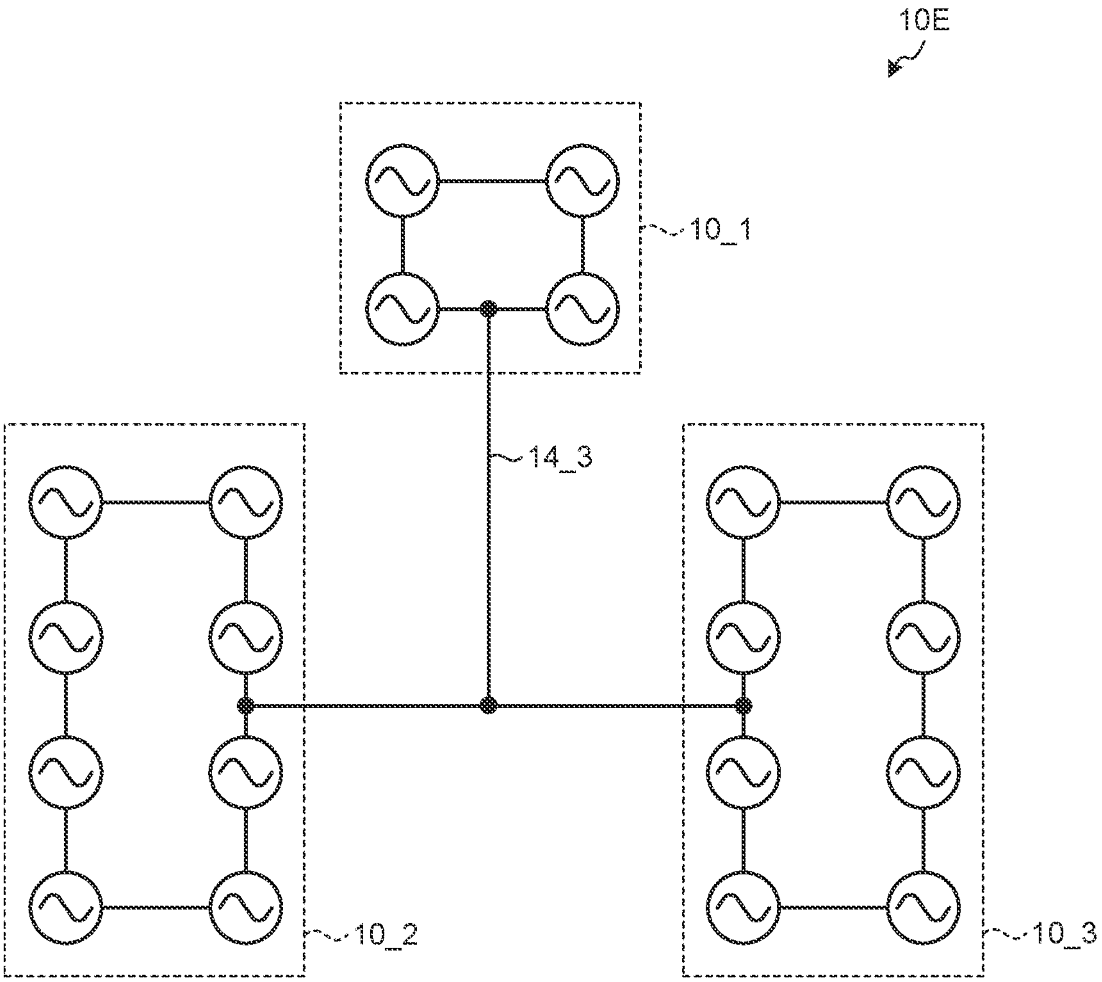
FIG. 14 is a diagram illustrating a configuration example of an oscillation circuit according to Modified Example 3-2 of the third embodiment of the present disclosure.

FIG. 14 is a diagram illustrating a configuration example of an oscillation circuit 10E according to Modified Example 3-2 of the third embodiment of the present disclosure. The oscillation circuit 10E illustrated in FIG. 14 includes oscillation circuits 10_1 to 10_3 and a second wiring 14_3.

The oscillation circuit 10_1 has a configuration in which the oscillators are connected by wiring so as to form a closed path that passes through once each of the four oscillators. The oscillators of the oscillation circuit 10_1 are arranged, for example, at respective vertexes of a quadrangular closed path, and the wiring is arranged on a side connecting the vertices.

The oscillation circuits 10_2 and 10_3 have a configuration in which the oscillators are connected by wiring so as to form a closed path that passes through once each of eight oscillators. For example, two oscillators of the oscillation circuits 10_2 and 10_3 are arranged at vertexes and long sides of the quadrangular closed path.

The second wiring 14_3 is connected to the wiring of each of the oscillation circuits 10_1 to 10_3.

As described above, the number of closed paths connected by the second wiring 14 is not limited to two, and may be three or more.

Here, for example, in a large scale integrated circuit (LSI), two types of wiring layers for signals and for power supply are generally prepared. The wiring layer for signals is a local wiring layer having high sheet resistance, and the wiring layer for power supply is a global wiring layer having low sheet resistance.

In the oscillation circuit 10E of the present modified example, for example, the closed paths of the oscillation circuits 10_1 to 10_3 are formed by a local interconnect having high sheet resistance. In the oscillation circuit 10E, the closed paths formed by the local interconnect are connected by a global interconnect having low sheet resistance. As a result, the phases of the oscillators 11 included in the closed paths of the oscillation circuits 10_1 to 10_3 can be more reliably locked.

3.4. Modified Example 3-3

A closed path can also be formed by the second wiring 14.

Figure 15:
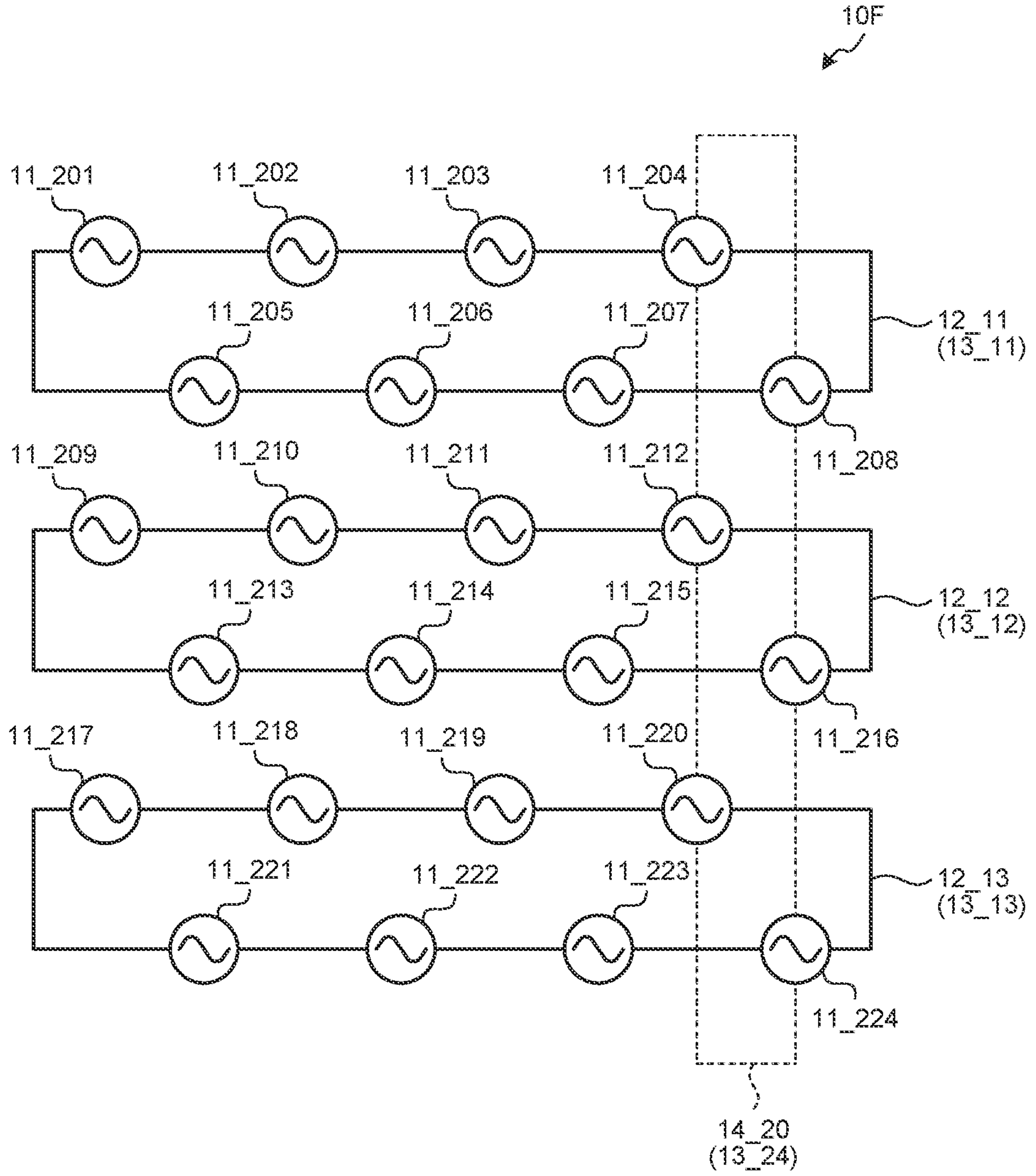
FIG. 15 is a diagram illustrating a configuration example of an oscillation circuit according to Modified Example 3-3 of the third embodiment of the present disclosure.

FIG. 15 is a diagram illustrating a configuration example of an oscillation circuit 10F according to Modified Example 3-3 of the third embodiment of the present disclosure. The oscillation circuit 10F illustrated in FIG. 15 has the same configuration as the oscillation circuit 10B illustrated in FIG. 9 except that the wirings 12_21 to 12_23 are not provided and the second wiring 14_20 is provided instead of the wiring 12_24.

Similarly to the wiring 12_214, the second wiring 14_20 forms a second closed path 13_24 and connects the oscillators 11_204, 11_208, 11_212, 11_216, 11_220, and 11_224. The second wiring 14_20 is a wiring having a smaller resistance value than the wiring 12.

In this manner, by forming the second closed paths 13_21 using the second wiring 14_20 connecting the first closed paths 13_11 to 13_13, the oscillation circuit 10F can more reliably lock the phases of the oscillators 11.

Although FIG. 15 illustrates the oscillation circuit 10F that does not include the second closed paths 13_21 to 13_23, third closed paths 13_31 and 13_34 and a fourth closed path 14_41 may be included, for example, instead of the second closed paths 13_21 and 13_23 as illustrated in an oscillation circuit 10G.

Figure 16:
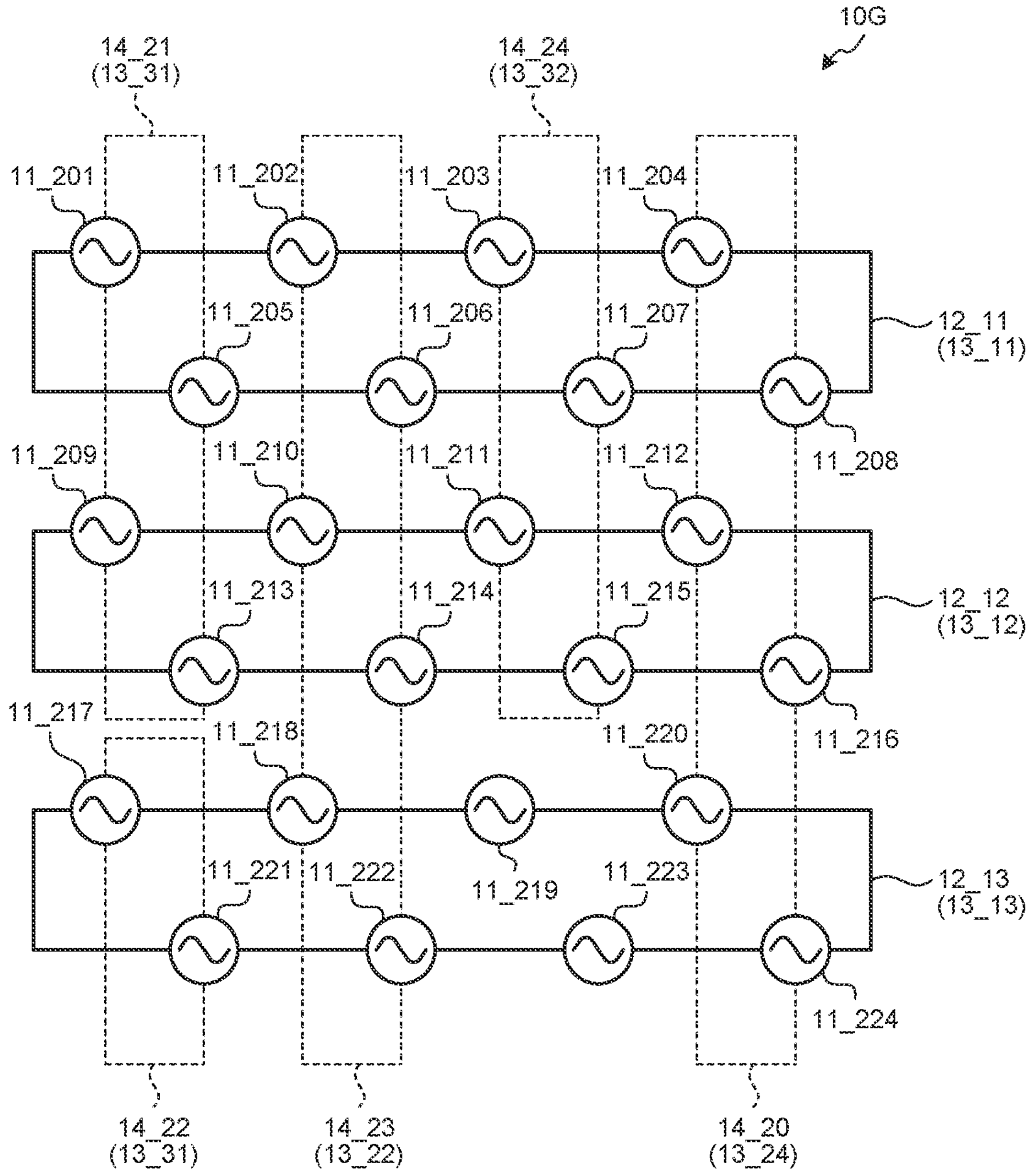
FIG. 16 is a diagram illustrating a configuration example of the oscillation circuit according to Modified Example 3-3 of the third embodiment of the present disclosure.

FIG. 16 is a diagram illustrating a configuration example of the oscillation circuit 10G according to Modified Example 3-3 of the third embodiment of the present disclosure. The oscillation circuit 10G illustrated in FIG. 16 is different from the oscillation circuit 10B illustrated in FIG. 9 in that the second wirings 14_21 and 14_22 are included instead of the wiring 12_21, and the second wirings 14_23 and 14_20 are included instead of the wirings 12_22 and 12_24. Further, the oscillation circuit 10G is different from the oscillation circuit 10B in that the second wiring 14_24 is provided instead of the wiring 12_23.

The second wiring 14_21 connects the oscillators 11_201, 11_205, 11_209, and 11_213 to form the third closed path 13_31. The second wiring 14_24 connects the oscillators 11_203, 11_207, 11_211, and 11_215 to form a third closed path 13_32.

The second wiring 14_22 connects the oscillators 11_217 and 11_221 to form a fourth closed path 13_41.

The second wiring 14_23 connects the oscillators 11_202, 11_206, 11_210, 11_214, 11_218, and 11_222 to form the second closed path 13_22.

The oscillators 11 of the oscillation circuit 10B illustrated in FIG. 9 are included in both the first closed path and the second closed path, but the oscillators 11 of the oscillation circuits 10F and 10G according to the present modified example are included in at least one of the first to fourth closed paths.

As described above, by connecting the plurality of closed paths using the second wiring 14 having a smaller resistance value than the wiring 12, the phases of the oscillators 11 can be more reliably locked regardless of the number of oscillators 11 included in each closed path, or in other words, the number of closed paths to which the oscillators 11 belong.

4. Fourth Embodiment

In the above embodiment, the case where the oscillation circuit includes the plurality of oscillators and wirings has been described, but the present invention is not limited thereto. For example, the oscillation circuit may include an adjustment circuit.

Figure 17:
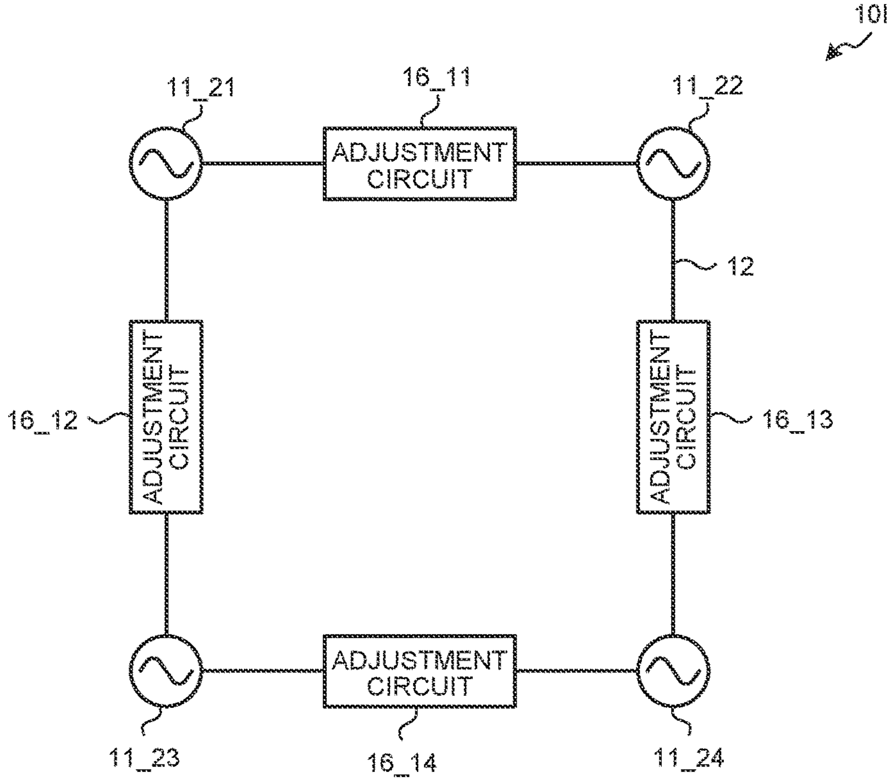
FIG. 17 is a diagram illustrating a configuration example of an oscillation circuit according to a fourth embodiment of the present disclosure.

FIG. 17 is a diagram illustrating a configuration example of an oscillation circuit 10I according to a fourth embodiment of the present disclosure. The oscillation circuit 10I illustrated in FIG. 17 includes a plurality of oscillators 11_21 to 11_24 and adjustment circuits 16_11 to 16_14. Hereinafter, the adjustment circuits 16_11 to 16_14 are also simply referred to as an adjustment circuit 16.

The oscillators 11_21 to 11_24 are arranged so as to be positioned at respective vertexes of a quadrangular closed path, and are connected to each other by wirings 12 arranged on sides of the quadrangular shape. A configuration of the oscillation circuit 10I is the same as that of the oscillation circuit 10_1 illustrated in FIG. 14 except that the adjustment circuits 16_11 to 16_14 are provided.

The adjustment circuit 16 is a circuit that is disposed on the wiring 12 connecting the oscillators 11 and adjusts impedance of the wiring 12. In other words, the adjustment circuit 16 adjusts a value of the impedance viewed from the oscillator 11.

The adjustment circuit 16 includes, for example, a passive element such as a resistor, a capacitor, or an inductor. The adjustment circuit 16 may include a resistance element or a MOS transistor as resistance. When the adjustment circuit 16 includes the MOS transistor as the resistance, the adjustment circuit 16 may include means for adjusting a source-gate voltage VGS of the MOS transistor.

In the example in FIG. 17, the adjustment circuit 16_11 is arranged on the wiring 12 connecting the oscillators 11_21 and 11_22. The adjustment circuit 16_13 is arranged on the wiring 12 connecting the oscillators 11_22 and 11_24. The adjustment circuit 16_14 is arranged on the wiring 12 connecting the oscillators 11_23 and 11_24.

Here, the case where the adjustment circuit 16 is arranged on all the wirings 12 connecting the oscillators 11 has been described, but the present invention is not limited thereto. The adjustment circuit 16 may be disposed on at least one of the wirings 12 connecting the oscillators 11.

As described above, by arranging the adjustment circuit 16 for adjusting the impedance on the wiring 12, the oscillation circuit 10I can adjust a physical length of the wiring 12 while keeping the electrical length of the wiring 12 substantially the same. As a result, the oscillation circuit 10I can further improve the degree of freedom of the circuit layout while more reliably locking the phase of each oscillator 11.

5. Fifth Embodiment

5.1. Oscillation Circuit

In the above embodiment, the case where the oscillators 11 are directly connected by the wiring has been described, but the present invention is not limited thereto. For example, the oscillators 11 may be connected using a common line.

Figure 18:
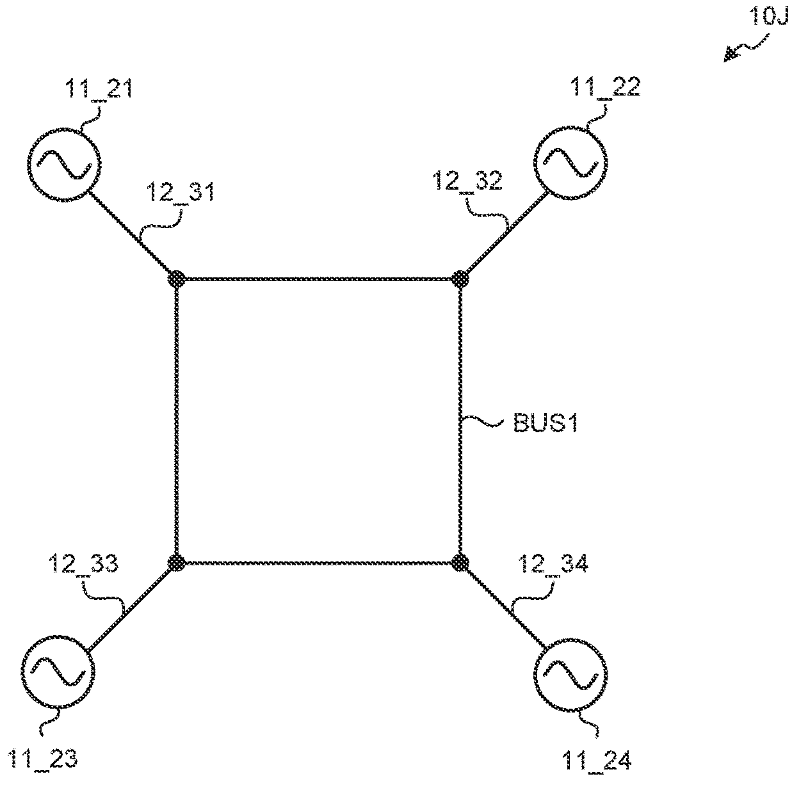
FIG. 18 is a diagram illustrating a configuration example of an oscillation circuit according to a fifth embodiment of the present disclosure.

FIG. 18 is a diagram illustrating a configuration example of an oscillation circuit 10J according to a fifth embodiment of the present disclosure. The oscillation circuit 10J illustrated in FIG. 18 includes a plurality of oscillators 11_21 to 11_24, a common line BUS1, and wirings 12_31 to 12_34.

The plurality of oscillators 11_21 to 11_24 are connected via the common line BUS1. The oscillator 11_21 is connected to the common line BUS1 via the wiring 12_31. The oscillator 11_22 is connected to the common line BUS1 via the wiring 12_32. The oscillator 11_23 is connected to the common line BUS1 via the wiring 12_33. The oscillator 11_24 is connected to the common line BUS1 via the wiring 12_34.

In this manner, the oscillation circuit 10J can connect the plurality of oscillators 11 using the common line BUS1.

5.2. Modified Example 5-1

The oscillation circuit 10J according to the fifth embodiment may include the adjustment circuit 16. As Modified Example 5-1 of the fifth embodiment of the present disclosure, an oscillation circuit 10K having the adjustment circuit 16 will be described.

Figure 19:
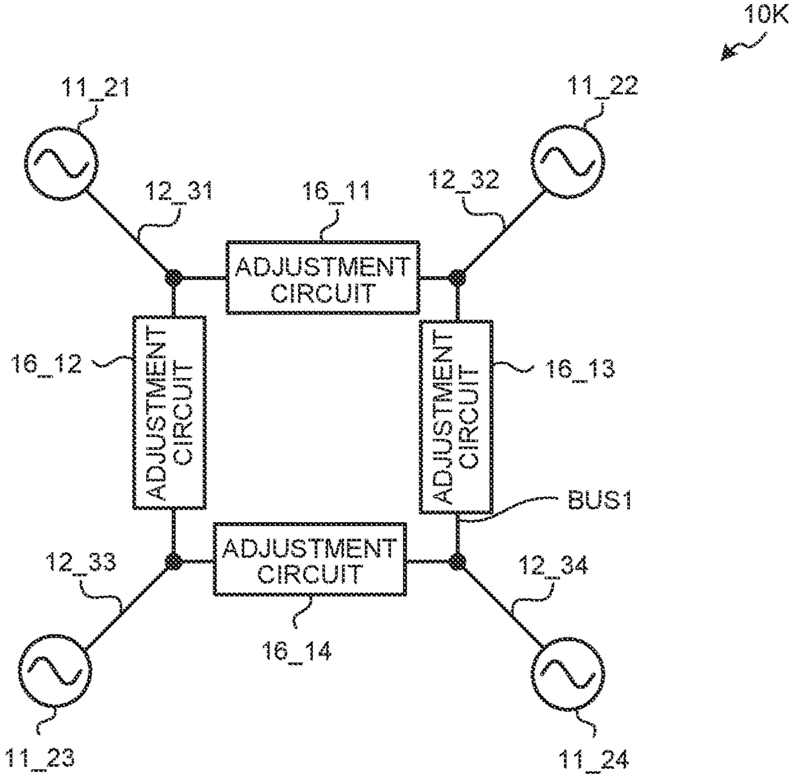
FIG. 19 is a diagram illustrating a configuration example of an oscillation circuit according to Modified Example 5-1 of the fifth embodiment of the present disclosure.

FIG. 19 is a diagram illustrating a configuration example of the oscillation circuit 10K according to Modified Example 5-1 of the fifth embodiment of the present disclosure. The oscillation circuit 10K illustrated in FIG. 19 includes the adjustment circuits 16_11 to 16_14 in addition to the configuration of the oscillation circuit 10J illustrated in FIG. 18.

The adjustment circuits 16_11 to 16_14 are the same as the adjustment circuits 16_11 to 16_14 of the oscillation circuit 10I illustrated in FIG. 17.

In the example in FIG. 19, the adjustment circuit 16_11 is arranged on the common line BUS1 between connection points with the wirings 12_31 and 12_32. The adjustment circuit 16_12 is arranged on the common line BUS1 between connection points with the wirings 12_31 and 12_33. The adjustment circuit 16_13 is arranged on the common line BUS1 between connection points with the wirings 12_32 and 12_34. The adjustment circuit 16_14 is arranged on the common line BUS1 between connection points with the wirings 12_23 and 12_34.

Here, the case where the adjustment circuit 16 is arranged on the common line BUS1 between the connection points with all the wirings 12 has been described, but the present invention is not limited thereto. The adjustment circuit 16 may be disposed between at least one of connection points with the wiring 12.

Figure 20:
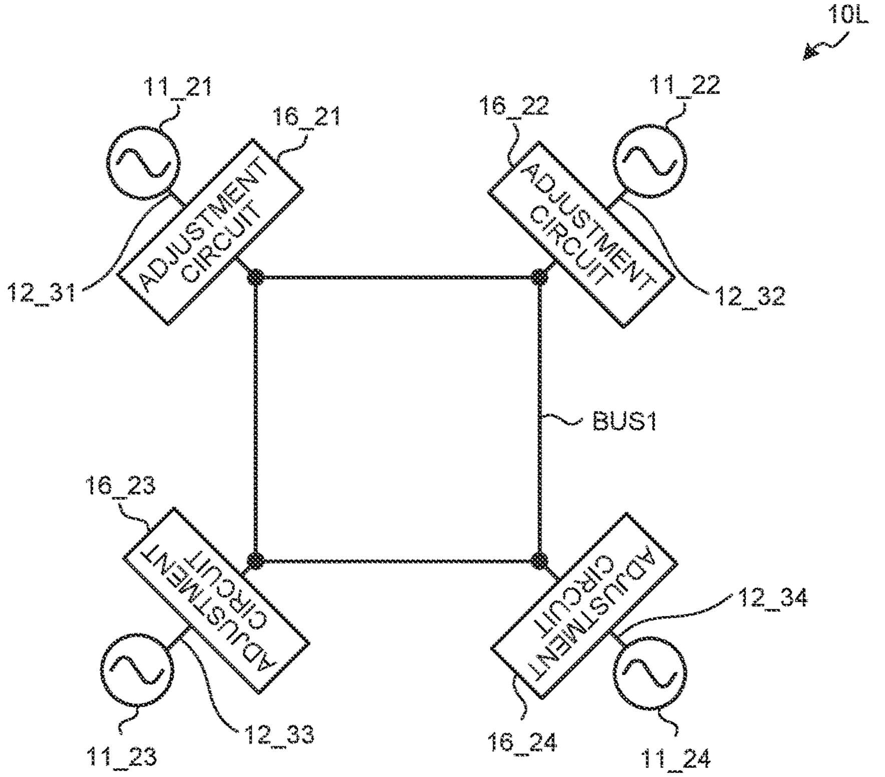
FIG. 20 is a diagram illustrating a configuration example of the oscillation circuit according to Modified Example 5-1 of the fifth embodiment of the present disclosure.

A place where the adjustment circuit 16 is disposed is not limited to the common line BUS1. As illustrated in FIG. 20, the adjustment circuits 16_21 to 16_24 may be arranged on the wirings 12_31 to 12_34 connecting the common line BUS1 and the oscillators 11_11 to 11_14. FIG. 20 is a diagram illustrating a configuration example of an oscillation circuit 10L according to Modified Example 5-1 of the fifth embodiment of the present disclosure.

In FIG. 20, a case where the adjustment circuit 16 is arranged on all the wirings 12 connecting the oscillators 11 has been described, but the present invention is not limited thereto. The oscillation circuit 10L may have a configuration in which the adjustment circuit 16 is disposed on at least one wiring 12.

Figure 21:
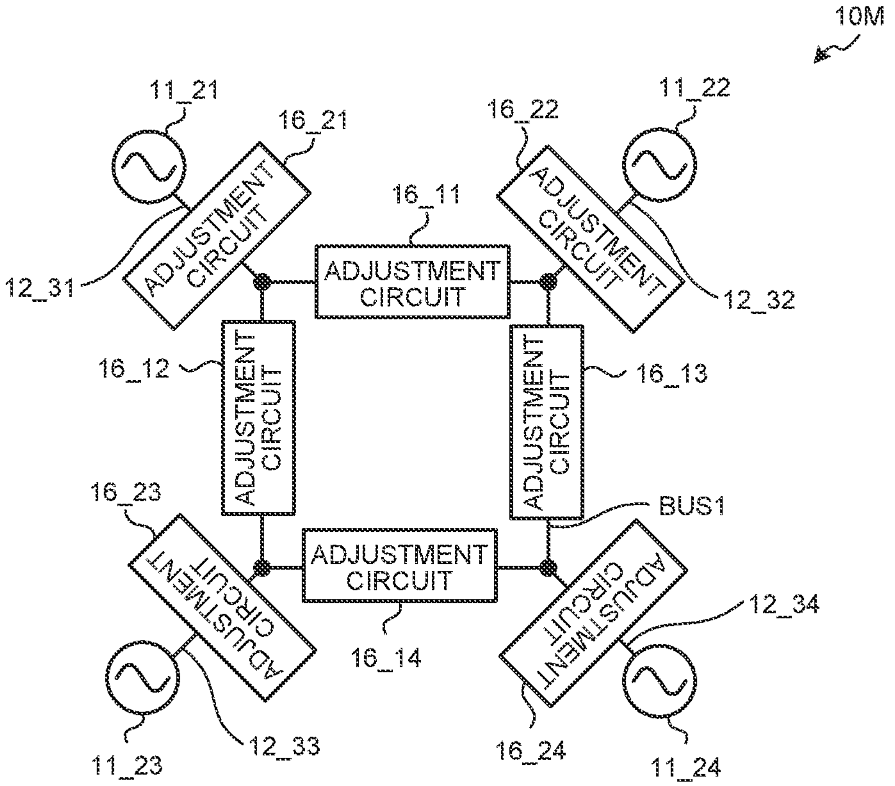
FIG. 21 is a diagram illustrating a configuration example of the oscillation circuit according to Modified Example 5-1 of the fifth embodiment of the present disclosure.

As illustrated in FIG. 21, the adjustment circuits 16_11 to 16_14 and 16_21 to 16_24 may be arranged on the common wiring BUS1 and the wirings 12_31 to 12_34. FIG. 21 is a diagram illustrating a configuration example of an oscillation circuit 10M according to Modified Example 5-1 of the fifth embodiment of the present disclosure.

Note that the adjustment circuits 16_11 to 16_14 and 16_21 to 16_24 illustrated in FIG. 21 are arranged in the same manner as the adjustment circuits 16_11 to 16_14 and 16_21 to 16_24 in FIGS. 19 and 20.

In this manner, in the oscillation circuits 10K to 10M according to the present modified example, even in a case where the oscillators 11 are connected by the common line BUS1, the adjustment circuit 16 for adjusting the impedance is arranged on at least one of the common line BUS1 and the wiring 12. As a result, the oscillation circuits 10K to 10M can adjust a coupling degree between the oscillators 11 and the common wiring BUS1, and can further improve the degree of freedom of the circuit layout while more reliably locking the phase of each oscillator 11.

6. Sixth Embodiment

6.1. Oscillation Circuit

In the above embodiment, the case where the oscillators 11 are connected by wiring has been described, but the present invention is not limited thereto. For example, the oscillators 11 may be connected via a switch.

Figure 22:
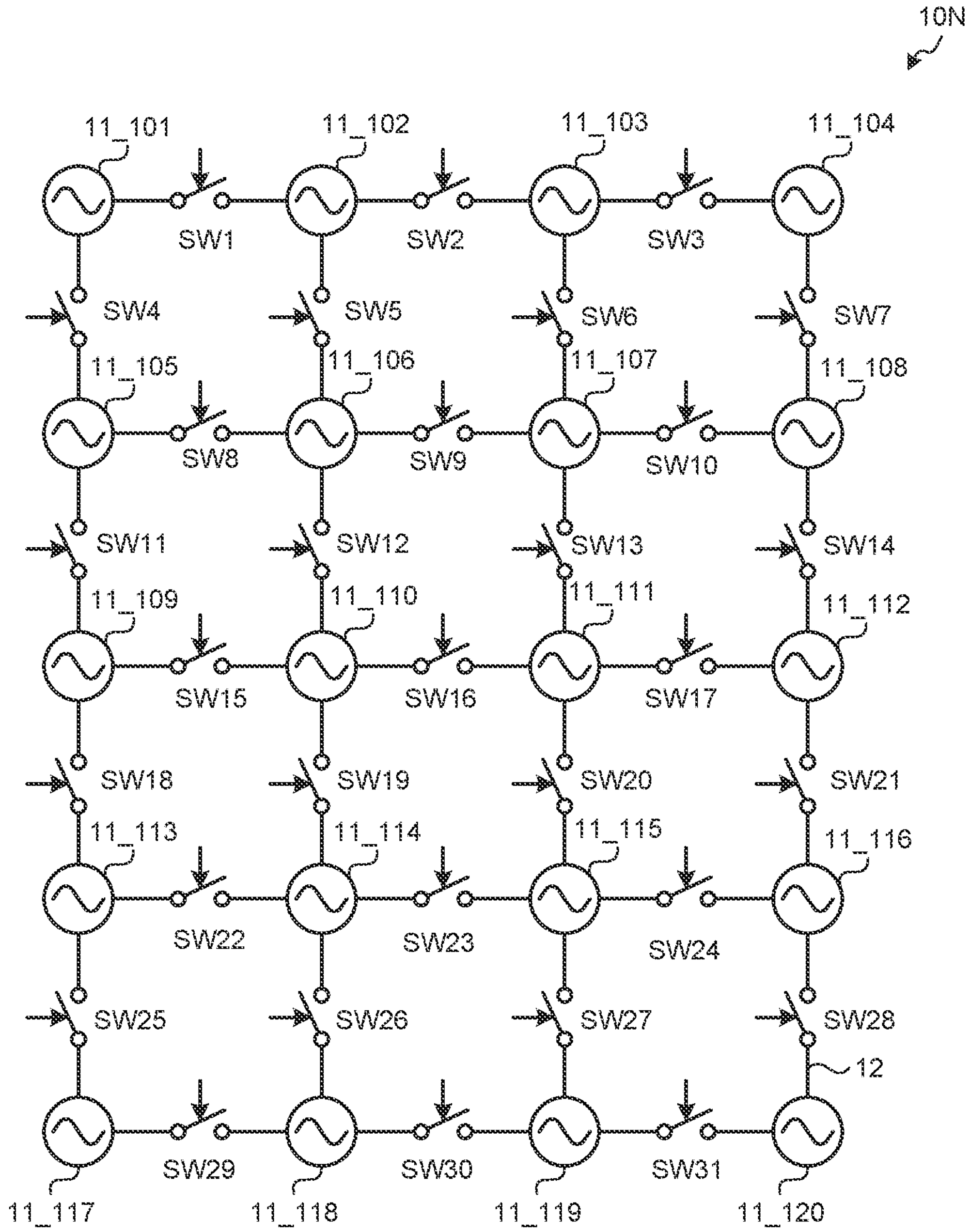
FIG. 22 is a diagram illustrating a configuration example of an oscillation circuit according to a sixth embodiment of the present disclosure.

FIG. 22 is a diagram illustrating a configuration example of an oscillation circuit 10N according to a sixth embodiment of the present disclosure. The oscillation circuit 10N includes the oscillators 11_101 to 11_120, the wiring 12, and switches SW1 to SW31.

The oscillators 11_101 to 11_120 are arranged in a matrix on a two-dimensional plane. The wiring 12 is different from the wiring 12 of the oscillation circuit 10 illustrated in FIG. 1 in that the wiring 12 connects the oscillators 11 adjacent to each other in the vertical and horizontal directions in FIG. 22.

The switches SW1 to SW31 are provided on the wiring 12 and between the adjacent oscillators 11 to switch a connection state of the adjacent oscillators 11. For example, the switch SW1 is provided on the wiring 12 between the oscillators 11_101 and 11_102. For example, when a switch control unit (not illustrated) switches on/off of the switch SW1, the connection state of the oscillators 11_101 and 11_102 is switched. For example, in a case where the switch SW1 is turned on, the oscillators 11_101 and 11_102 are connected, and in a case where the switch SW1 is turned off, the connection is opened.

In this manner, the switch control unit (not illustrated) can switch the connection state of the oscillators 11 by switching on and off of the switches SW1 to SW31. As a result, the oscillation circuit 10N can achieve a variable shape of the closed path formed by the wiring 12, and, for example, can dynamically switch the closed path.

For example, by turning on the switches SW1, SW3 to SW7, SW11 to SW14, SW18 to SW21, SW23, SW25, and SW28 to SW31, a closed path similar to that of the oscillation circuit 10 illustrated in FIG. 1 is formed in the oscillation circuit 10N.

Figure 23:
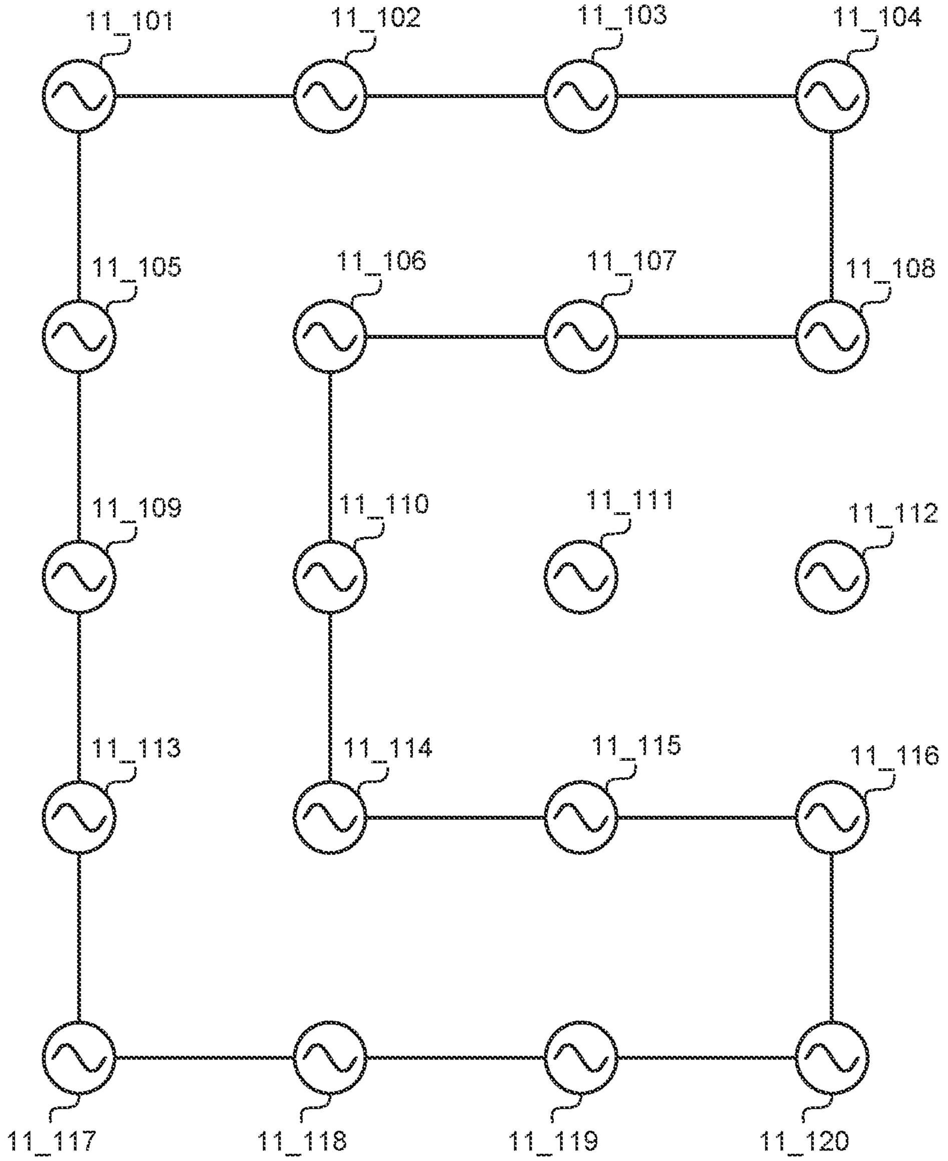
FIG. 23 is a diagram illustrating a configuration example of a closed path of the oscillation circuit according to the sixth embodiment of the present disclosure.

Note that, at this point, the oscillation circuit 10N may not form a closed path that passes through once each of all the oscillators 11_101 to 11_120. For example, as illustrated in FIG. 23, a closed path that does not pass through some oscillators 11 (oscillators 11_111 and 11_112 in FIG. 23) but passes through once each of the remaining oscillators 11 may be formed. Note that FIG. 23 is a diagram illustrating a configuration example of the closed path of the oscillation circuit 10N according to the sixth embodiment of the present disclosure.

For example, when some oscillators 11_111 and 11_112 fail, the oscillation circuit 10N excludes the failed oscillators 11_111 and 11_112 from the closed path, and forms a closed path using the remaining oscillators 11_101 to 11_110 and 11_113 to 11_120 that are not in failure. As a result, even when some of the oscillators 11 fail, the oscillation circuit 10N can perform the oscillating operation, and a yield rate of the oscillation circuit 10N can be further improved.

In addition, a failure of the oscillator 11 can be detected by performing the oscillating operation while dynamically switching the closed path of the oscillation circuit 10N.

Note that closing patterns of the oscillation circuit 10N, or in other words, switching patterns of the plurality of switches SW1 to SW31 are stored in, for example, a memory (not illustrated). The switch control unit (not illustrated) switches on and off of the switches SW1 to SW31 based on the switching patterns of the switches SW1 to SW30 stored in the memory, thereby switching the closed path of the oscillation circuit 10N.

As described above, the oscillation circuit 10N connects the oscillator 11 via the switches SW, so that the configuration of the closed path formed by the wiring 12 and the oscillators 11 can be reconfigurable. As a result, the yield rate of the oscillation circuit 10N can be further improved, and the failure detection of the oscillators 11 can also be performed.

6.2. Modified Example 6-1

In the sixth embodiment, the case where the oscillators 11 adjacent in the vertical and horizontal directions in FIG. 22 are connected to each other via the switches SW has been described, but the present invention is not limited thereto. For example, the oscillators 11 adjacent in an oblique direction may be connected via the switches SW.

Figure 24:
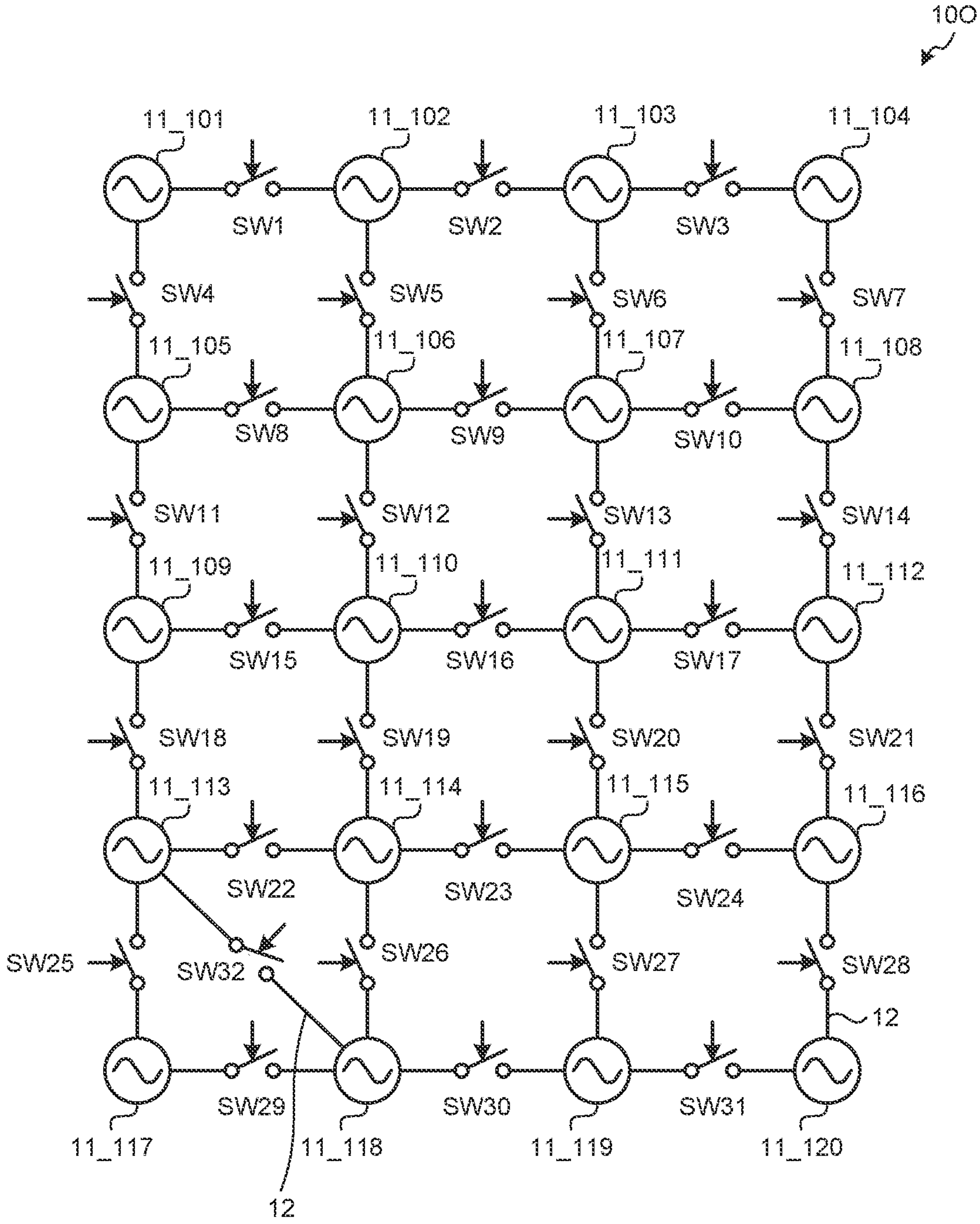
FIG. 24 is a diagram illustrating a configuration example of an oscillation circuit according to Modified Example 6-1 of the sixth embodiment of the present disclosure.

FIG. 24 is a diagram illustrating a configuration example of an oscillation circuit 100 according to Modified Example 6-1 of the sixth embodiment of the present disclosure. The oscillation circuit 100 has the same configuration as the oscillation circuit 10N in FIG. 22 except that a switch SW32 arranged on the wiring 12 connecting the oscillators 11_113 and 11_118 is further provided.

Note that, in FIG. 24, the switch SW is provided only between the oscillators 11_113 and 11_118 in order to make the drawing easily viewable, but for example, all the oscillators 11 adjacent in the oblique direction in FIG. 24 may be connected via the switches SW.

Here, a length of the wiring 12 connecting the adjacent oscillators 11 on a diagonal line (oblique direction in FIG. 24) in the oscillators 11 arranged in a matrix is √2 times longer than a length of the wiring 12 connecting the adjacent oscillators 11 in the vertical or horizontal direction. As described above, it has been confirmed by simulation that the phases of the oscillators 11 connected so as to form the Hamiltonian path are locked even when there is a difference in wiring length of about √2 times.

Therefore, in the oscillation circuit 100 according to the present modified example, the wiring 12 connecting the oscillators 11 adjacent in the diagonal direction and the switch SW provided on this wiring 12 and connecting the oscillators 11 adjacent in the diagonal direction are provided.

As a result, for example, closed path patterns that can be formed in the oscillation circuit 100 can be increased.

Figure 25:
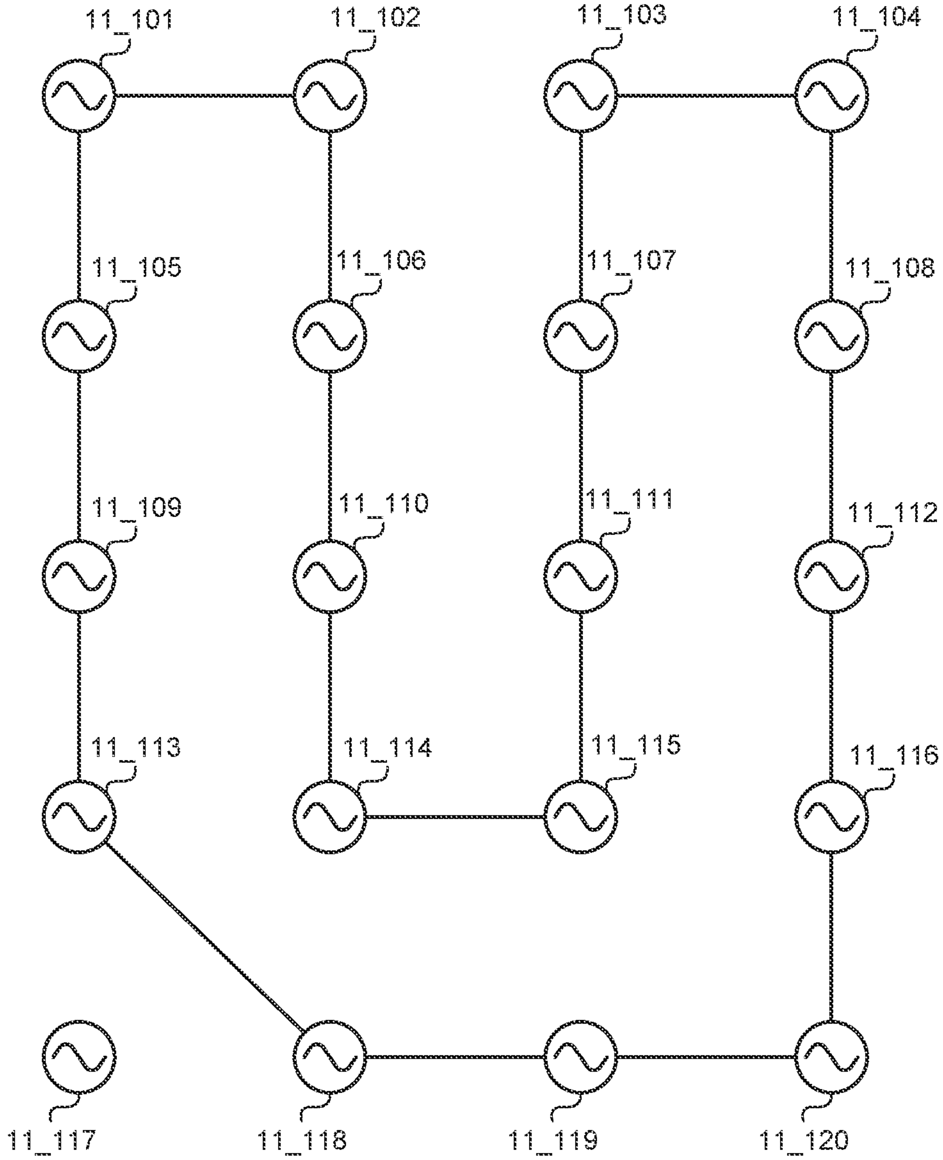
FIG. 25 is a diagram illustrating a configuration example of a closed path of the oscillation circuit according to Modified Example 6-1 of the sixth embodiment of the present disclosure.

FIG. 25 is a diagram illustrating a configuration example of the closed path of the oscillation circuit 100 according to Modified Example 6-1 of the sixth embodiment of the present disclosure. For example, it is assumed that the oscillator 11_117 fails in a state where the same closed path as the oscillation circuit 10 illustrated in FIG. 1 is formed in the oscillation circuit 100.

In this case, the oscillation circuit 100 turns off the switches SW25 and SW29 and turns on the switch SW32. As a result, the oscillators 11_113 and 11_118 are connected, and the closed path illustrated in FIG. 25 is formed.

Even when the length of the wiring 12 connecting the oscillators 11 is shifted by about √2 times, it is confirmed by simulation that the phase of the oscillation signal of each oscillator 11 is locked. Therefore, the oscillation circuit 100 illustrated in FIG. 25 can more reliably lock the phase of each oscillator 11 even when the length of the wiring 12 forming the closed path is partially shifted by about √2 times.

Here, in the embodiment and the modified example described above, when values of the impedance viewed from the oscillators 11 are uniform, the phases of the oscillators 11 can be more reliably locked. As described above, even when the length of the wiring 12 connecting the oscillators 11 is shifted by about √2 times, it is confirmed by simulation that the phase of the oscillation signal of each oscillator 11 is locked.

Therefore, in the present disclosure, even when the length of the wiring 12 connecting the oscillators 11 is shifted by about √2 times, the values of the impedance viewed from the oscillators 11 are aligned to an extent that the phase can be locked. Similarly, in the present disclosure, even when the length of the wiring 12 connecting the oscillators 11 is shifted by about √2 times, the values of the impedance viewed from the oscillators 11 are substantially the same to the extent that the phase can be locked. In the present disclosure, it is assumed that shifting of about √2 times is included in a range in which the electrical length of the wiring 12 is substantially the same.

7. Seventh Embodiment

7.1. Oscillation Circuit

In the above embodiment, the oscillator 11 forming the closed path is arranged on the two-dimensional plane, but the present invention is not limited thereto. The oscillator 11 may be arranged in a three-dimensional space.

Figure 26:
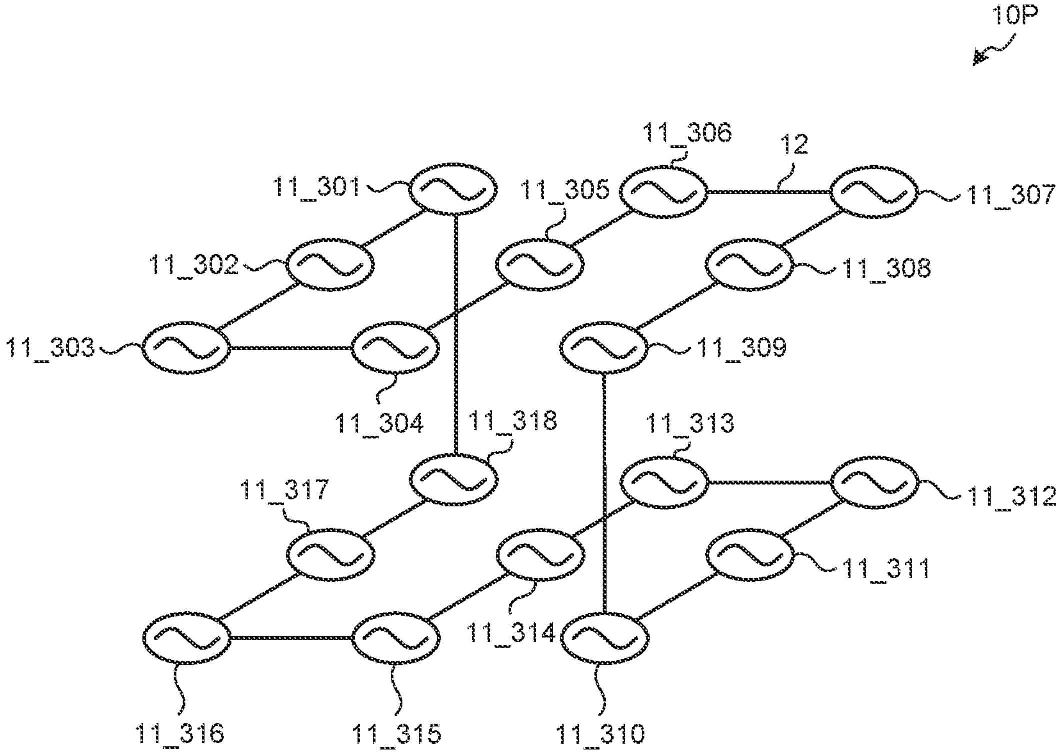
FIG. 26 is a diagram illustrating a configuration example of an oscillation circuit according to a seventh embodiment of the present disclosure.

FIG. 26 is a diagram illustrating a configuration example of an oscillation circuit 10P according to a seventh embodiment of the present disclosure. The oscillation circuit 10P includes oscillators 11_301 to 11_318 and the wiring 12.

The oscillators 11_301 to 11_309 are arranged in a matrix (3×3 in FIG. 26) on a first two-dimensional plane. The oscillators 11_310 to 11_318 are arranged in a matrix (3×3 in FIG. 26) on a second two-dimensional plane different from the first two-dimensional plane.

The oscillators 11_301 to 11_309 are connected in, for example, a meander shape (S shape in FIG. 26) so as to form a path passing through once each of the oscillators 11 by the wiring 12 on the first two-dimensional plane. Similarly, the oscillators 11_310 to 11_318 are connected in, for example, the meander shape (S shape in FIG. 26) by the wiring 12 so as to form a path passing through once each of the oscillators 11 on the second two-dimensional plane.

In FIG. 26, the oscillator 11_301 arranged at one end of the S-shaped path in the first two-dimensional plane and the oscillator 11_318 arranged at one end of the S-shaped path in the second two-dimensional plane are connected by the wiring 12 substantially perpendicular to the first and second two-dimensional planes. Further, the oscillator 11_309 arranged at the other end of the S-shaped path in the first two-dimensional plane and the oscillator 11_310 arranged at the other end of the S-shaped path in the second two-dimensional plane are connected by the wiring 12 substantially perpendicular to the first and second two-dimensional planes. As a result, in the oscillation circuit 10P, a closed path is formed across the first and second two-dimensional planes.

For example, the oscillators 11_301 to 11_309 are disposed on a first substrate (or a first semiconductor layer). Furthermore, the oscillators 11_301 to 11_318 are arranged on a second substrate different from the first substrate (or a second semiconductor layer different from the first semiconductor layer). The wiring 12 substantially perpendicular to the first and second two-dimensional planes includes a through electrode (VIA) that connects the first and second substrates (or first and second semiconductor layers). The oscillation circuit 10P may be configured in this manner.

7.2. Modified Example 7-1

In the seventh embodiment, an example in which the oscillators 11 forming one closed path are arranged in the three-dimensional space has been described, but the present invention is not limited thereto. The oscillators 11 of the oscillation circuit that form two or more closed paths may be arranged in the three-dimensional space.

Figure 27:
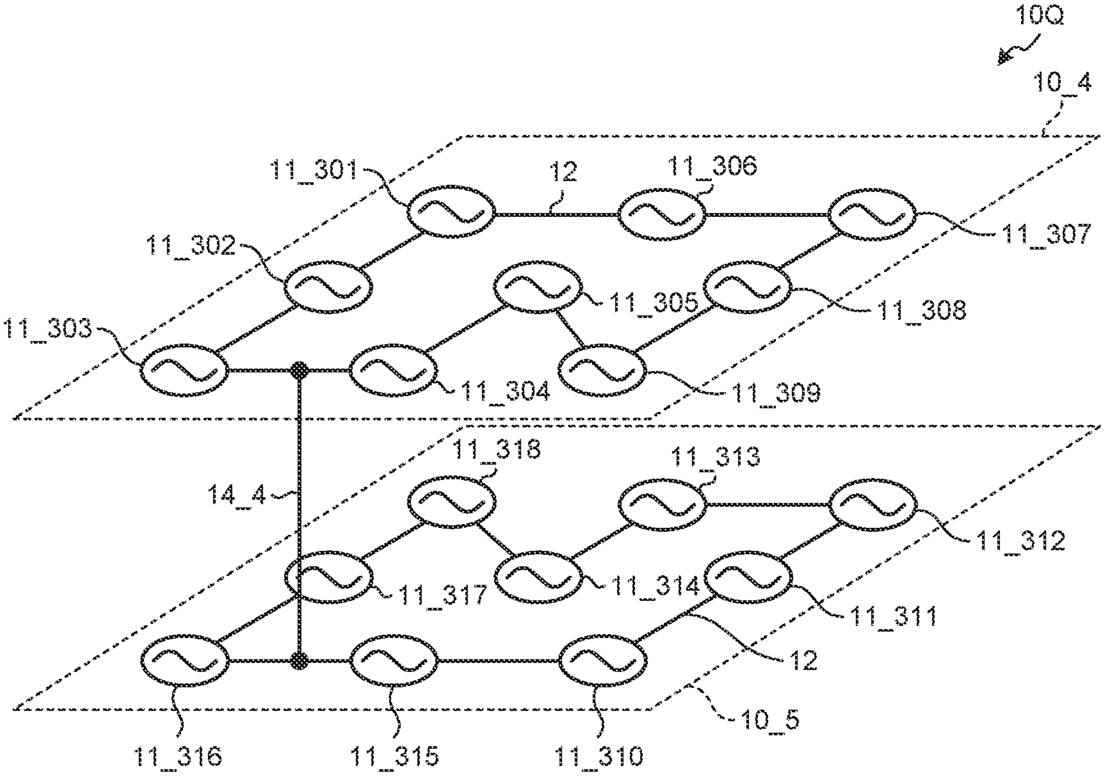
FIG. 27 is a diagram illustrating a configuration example of an oscillation circuit according to Modified Example 7-1 of the seventh embodiment of the present disclosure.

FIG. 27 is a diagram illustrating a configuration example of an oscillation circuit 10Q according to Modified Example 7-1 of the seventh embodiment of the present disclosure. The oscillation circuit 10Q includes oscillation circuits 10_4 and 10_5, the wiring 12, and a second wiring 14_4.

The oscillation circuit 10_4 includes the oscillators 11_301 to 11_309. The oscillators 11_301 to 11_309 are arranged in a matrix (3×3 in FIG. 27) on a first two-dimensional plane. The oscillators 11_301 to 11_309 are connected to form a closed path by the wiring 12.

Here, in the example in FIG. 27, the oscillators 11_305 and 11_309 are diagonally connected by the wiring 12 in a matrix. As described above, even when the length of the wiring 12 connecting the oscillators 11 is shifted by about $\sqrt{2}$ times, the phase of each oscillator 11 is locked. Therefore, the phases of the oscillators 11_305 and 11_309 connected to form the closed path can also be locked.

The oscillation circuit 10_5 includes the oscillators 11_310 to 11_318. The oscillators 11_310 to 11_318 are arranged in a matrix (3×3 in FIG. 27) on a second two-dimensional plane different from the first two-dimensional plane. The oscillators 11_310 to 11_318 are connected to form a closed path by the wiring 12.

Here, in the example in FIG. 27, the oscillators 11_314 and 11_318 are diagonally connected by the wiring 12 in a matrix, but similarly to the oscillation circuit 10_4, the phase of each of the oscillators 11_310 to 11_318 of the oscillation circuit 10_5 is also locked.

The second wiring 14_4 is arranged to connect the closed path formed in the oscillation circuit 10_4 and the closed path formed in the oscillation circuit 10_5. For example, the second wiring 14_4 is arranged substantially perpendicular to the first and second two-dimensional planes. The second wiring 14_4 is a wiring having a smaller resistance value than the wiring 12.

In the example in FIG. 27, the second wiring 14_4 is arranged to connect the wiring 12 connecting the oscillators 11_303 and 11_304 and the wiring 12 connecting the oscillators 11_315 and 11_316.

For example, the oscillators 11_301 to 11_309 of the oscillation circuit 10_4 are arranged on a first substrate (or a first semiconductor layer). Furthermore, the oscillators 11_301 to 11_318 of the oscillation circuit 10_5 are arranged on a second substrate different from the first substrate (or a second semiconductor layer different from the first semiconductor layer). The second wiring 14_4 includes the through electrode (VIA) that connects the first and second substrates (or first and second semiconductor layers). The oscillation circuit 10P may be configured in this manner. In general, since the through electrode has lower resistance than the wiring of the substrate, the resistance value of the second wiring 14_4 can be made smaller than that of the wiring 12 by connecting the oscillation circuit 10_4 and the oscillation circuit 10_5 using the through electrode.

In the seventh embodiment and Modified Example 7-1, the oscillators 11 forming the closed path are arranged in the three-dimensional space configured by the two-dimensional planes, but the present invention is not limited thereto. For example, the oscillators 11 forming a closed path may be arranged on a curved surface so as to arrange the oscillators 11 in the three-dimensional space.

8. Eighth Embodiment

Figure 28:
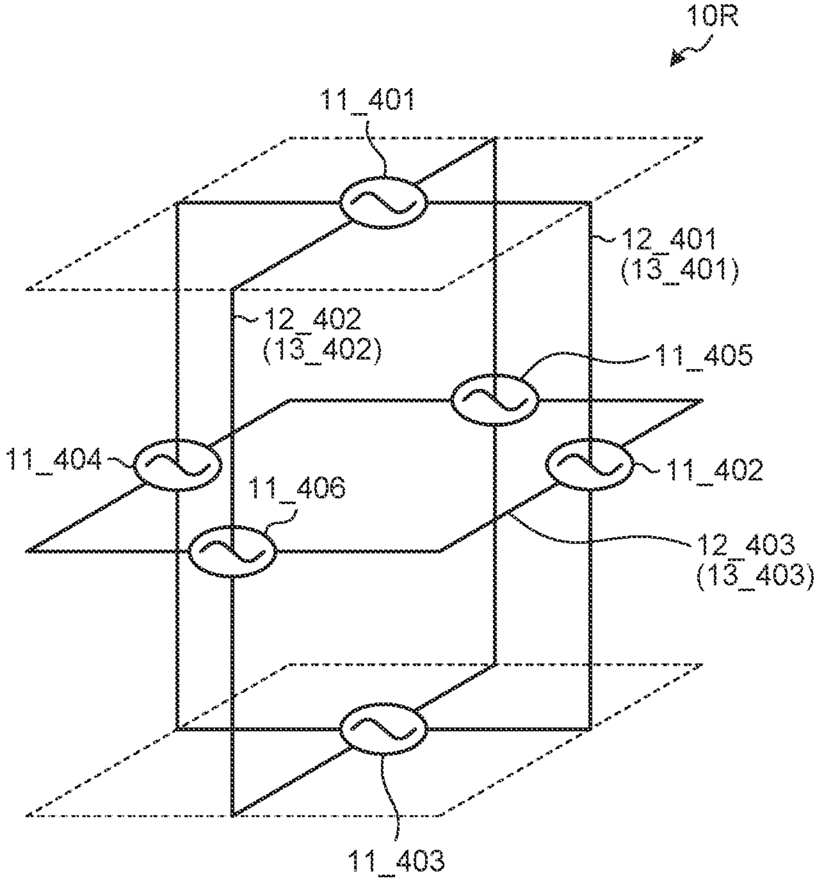
FIG. 28 is a diagram illustrating a configuration example of an oscillation circuit according to an eighth embodiment of the present disclosure.

Next, another example in which the oscillators 11 are arranged in a three-dimensional space will be described. FIG. 28 is a diagram illustrating a configuration example of an oscillation circuit 10R according to an eighth embodiment of the present disclosure.

The oscillation circuit 10R illustrated in FIG. 28 includes a plurality of oscillators 11_401 to 11_406 and the wiring 12.

The plurality of oscillators 11 are arranged on a polyhedron having substantially the same side lengths. In the example in FIG. 28, the plurality of oscillators 11_401 to 11_406 is arranged substantially at respective centers of surfaces of a cube. Note that, here, the oscillators 11 are arranged on surfaces of the polyhedron, but the present invention is not limited thereto. The oscillators 11 may be disposed at respective vertexes or sides of the polyhedron having substantially the same side lengths. In a case where the oscillators 11 are arranged on the sides, the oscillators 11 are arranged, for example, substantially at respective centers of the sides.

In the example in FIG. 28, the oscillator 11_401 may be disposed in a first semiconductor layer, the oscillators 11_402 and 11_404 to 11_406 may be disposed in a second semiconductor layer, and the oscillator 11_403 may be disposed in a third semiconductor layer. The first to third semiconductor layers are stacked in this order.

As described above, the oscillation circuit 10R may be formed in a semiconductor device in which a plurality of semiconductor layers (or a plurality of substrates) are stacked. Alternatively, the oscillation circuit 10R may be formed using a technique of manufacturing a three-dimensional semiconductor such as a spherical semiconductor, or may be formed using a multilayer laminated chip.

The wiring 12 connects the oscillators 11 so as to form a plurality of closed paths passing through once each of at least two of the plurality of oscillators 11. The wiring 12 includes wirings 12_401 to 12_403.

The wiring 12_401 connects the oscillators 11_401 to 11_404 and forms a first closed path 13_401 having a substantially square shape. The oscillators 11_401 to 11_404 are arranged on respective sides of the first closed path 13_401.

The wiring 12_402 connects the oscillators 11_401, 11_403, 11_105, and 11_406 to form a second closed path 13_402 having a substantially square shape. The oscillators 11_401, 11_403, 11_105, and 11_406 are arranged on respective sides of the second closed path 13_402.

The wiring 12_403 connects the oscillators 11_402 and 11_404 to 11_406 to form a third closed path 13_403 having a substantially square shape. Oscillators 11_402 and 11_404 to 11_406 are arranged on respective sides of the third closed path 13_403.

When the oscillators 11 are disposed in a plurality of semiconductor layers, the oscillators 11 disposed in different semiconductor layers are connected using a through electrode (VIA). As described above, the through electrode generally has a smaller resistance value than the wiring formed in the semiconductor layer, but matching the resistance value of the through electrode with the resistance value of the wiring formed in the semiconductor layer can be realized by using an existing technology. Alternatively, for example, when a difference in the resistance values between the VIA and the wiring 12 is large, an additional wiring may be inserted into the wiring 12 in order to reduce an impedance difference between the VIA and the wiring 12.

As described above, even when the oscillators 11 are arranged on the polyhedron having substantially the same side lengths and the adjacent oscillators 11 are connected, the number of oscillators 11 connected to one oscillator 11 is the same in all the oscillators 11. For example, in the example in FIG. 28, each oscillator 11 is connected to four oscillators 11. In addition, the wiring 12 connecting the oscillators 11 can be substantially the same.

As a result, the impedance of each of the oscillators 11 can be symmetrical, in other words, variations in impedance viewed from the oscillators 11 can be suppressed. The values of the impedances can be aligned, and the phases of the oscillation signals generated by the oscillators 11 can be locked.

In the oscillation circuit 10R, it can also be said that the wiring 12 is arranged so as to form the first to third closed paths 13_401 to 13_403 including the four oscillators 11, and each oscillator 11 is arranged so as to be included in two of the first to third closed paths 13_401 to 13_403.

Figure 29:
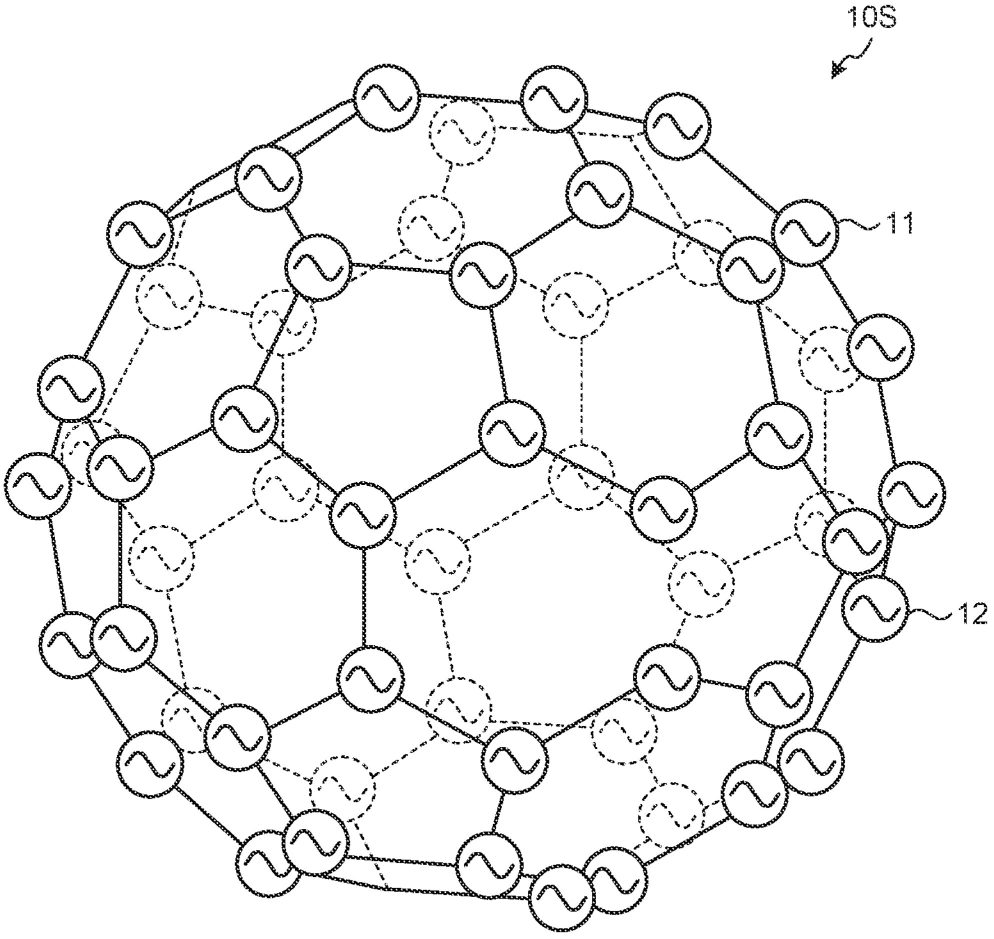
FIG. 29 is a diagram illustrating a configuration example of the oscillation circuit according to the eighth embodiment of the present disclosure.

In addition, the polyhedron in which the oscillators 11 are disposed is not limited to a cube. Another configuration example of the oscillation circuit according to the eighth embodiment of the present disclosure will be described with reference to FIG. 29. FIG. 29 is a diagram illustrating a configuration example of an oscillation circuit 10S according to the eighth embodiment of the present disclosure.

As illustrated in FIG. 29, in the oscillation circuit 10S, the oscillators 11 are arranged at respective vertexes of a truncated icosahedron, a so-called football-like polyhedron. The oscillators 11 are connected to each other by the wiring 12 arranged on each side of the truncated icosahedron.

In this manner, the oscillators 11 may be disposed on at least one of the side, the vertex, and the surface of the polyhedron other than the cube.

Note that the oscillation circuit 10S in FIG. 29 may be formed using a technique of manufacturing a three-dimensional semiconductor such as a spherical semiconductor, or may be formed using a multilayer laminated chip. Alternatively, the oscillation circuit 10S may be formed by, for example, connecting the oscillators 11 with a cable instead of the semiconductor.

9. Ninth Embodiment

9.1. Oscillation Circuit

Figure 30:
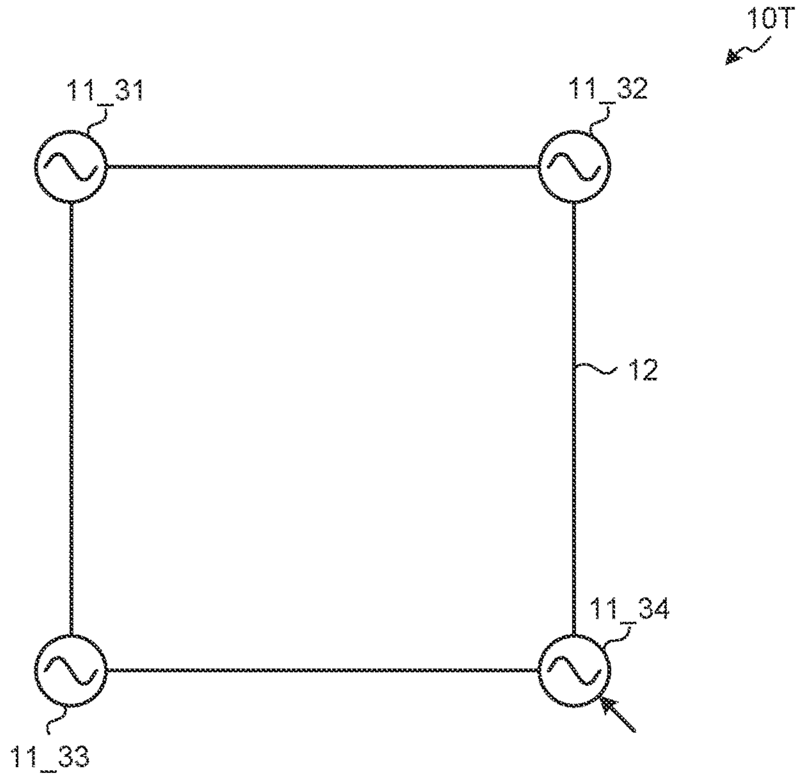
FIG. 30 is a diagram illustrating a configuration example of an oscillation circuit according to a ninth embodiment of the present disclosure.

Next, a case where the frequency of the oscillation signal generated by the oscillator 11 is adjusted will be described. FIG. 30 is a diagram illustrating a configuration example of an oscillation circuit 10T according to a ninth embodiment of the present disclosure.

The oscillation circuit 10T illustrated in FIG. 30 includes a plurality of oscillators 11_31 to 11_34 and the wiring 12.

The plurality of oscillators 11_31 to 11_34 are arranged at respective vertexes of a quadrangular closed path. The wiring 12 is arranged on each side of the quadrangular closed path to connect the oscillators 11.

Oscillator 11_34 of the oscillation circuit 10T receives an input of a control signal for controlling the frequency of the oscillation signal.

Here, a case where the oscillation circuit 10T is a digitally controlled oscillator (DCO) will be described. In this case, the oscillator 11_34 switches an oscillation frequency according to the control signal. As a result, the oscillator 11_34 generates an oscillation signal having a frequency corresponding to the control signal.

Furthermore, the oscillators 11_31 to 11_33 are connected to the oscillator 11_34 on a closed path formed by the wiring 12. Therefore, the oscillation signals generated by the oscillators 11_31 to 11_33 are synchronized with the frequency and phase of the oscillation signal generated by the oscillator 11_34.

In this way, by controlling the frequency of the oscillation signal of the oscillator 11_34 using the control signal, the frequency of other oscillators 11_31 to 11_33 can be controlled.

Figure 31:
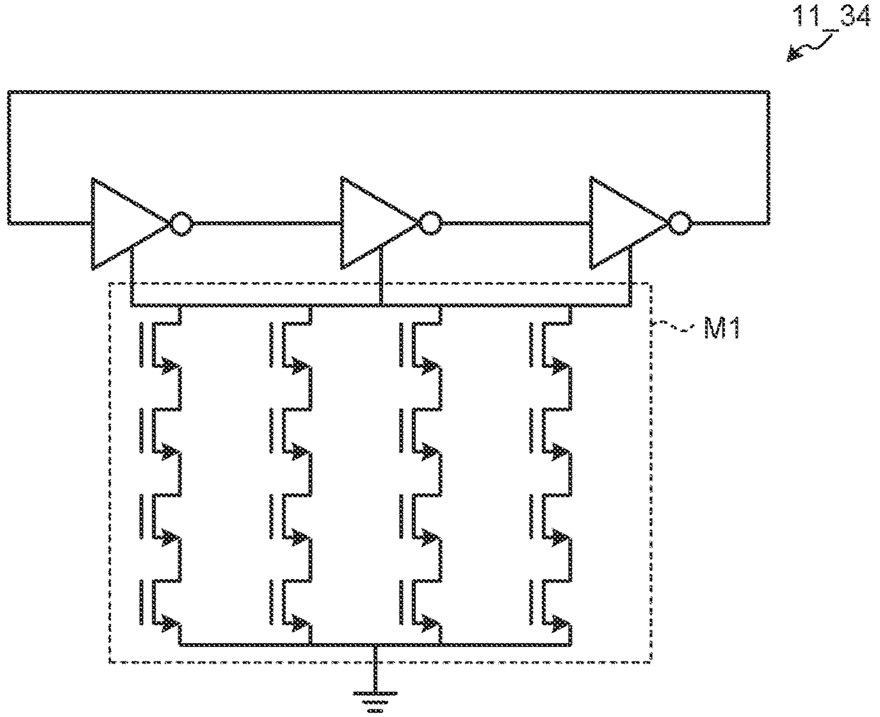
FIG. 31 is a diagram illustrating an example of an oscillator according to the ninth embodiment of the present disclosure.

FIG. 31 is a diagram illustrating an example of the oscillator 11_34 according to the ninth embodiment of the present disclosure. The oscillator 11_34 illustrated in FIG. 31 includes a plurality of inverters connected in a ring shape and a MOS transistor group M1 (example of a variable resistor).

The MOS transistor group M1 is configured by connecting m1 (m1=4 in FIG. 31) pieces of MOS transistors in series and connecting m2 (m2=4 in FIG. 31) columns of these MOS transistors in parallel. In the MOS transistor group M1, one end is connected to each of the plurality of inverters, and the other end is grounded.

A resistance value of the MOS transistor group M1 is switched by switching on/off of the MOS transistors by a control signal input to a gate terminal of each of the MOS transistors. As a result, the frequency of the oscillation signal generated by the oscillator 11_34 is switched.

The oscillator 11_34 illustrated in FIG. 31 includes 16 pieces of MOS transistors. Therefore, the control signal includes 16 binary signals for controlling each of the 16 pieces of MOS transistors.

Note that, although the case where the oscillation circuit 10T is the DCO is described here, the oscillation circuit 10T may be a voltage controlled oscillator (VCO).

As described above, each oscillator 11 can generate the oscillation signal of a desired frequency by using the DCO (or VCO) as the oscillation circuit 10T.

Figure 32:
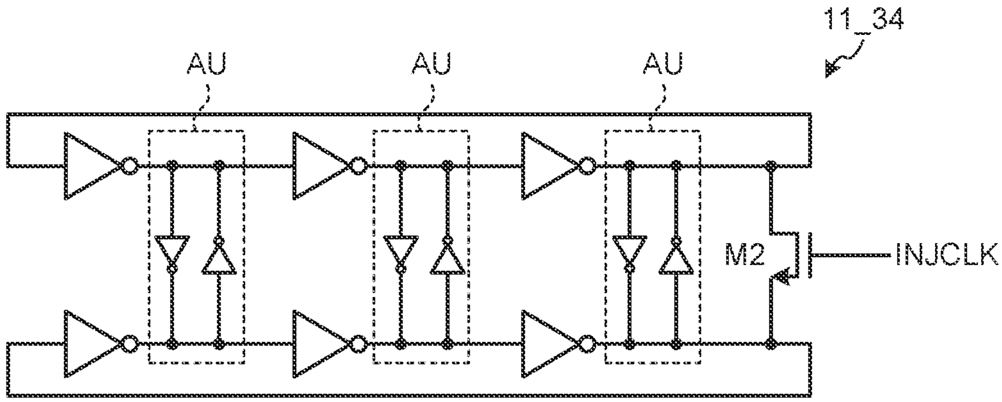
FIG. 32 is a diagram illustrating another example of the oscillator according to the ninth embodiment of the present disclosure.

Next, a case where the oscillation frequency of the oscillation circuit 10T is adjusted by injection lock will be described with reference to FIG. 32. FIG. 32 is a diagram illustrating another example of the oscillator 11_34 according to the ninth embodiment of the present disclosure.

The oscillator 11_34 includes two ring oscillators having three inverters, an auxiliary inverter circuit AU that connects each of the ring oscillators, and a MOS transistor M2.

The auxiliary inverter circuit AU has two inverters that are cross-coupled and arranged to respectively connect corresponding intermediate nodes of the two ring oscillators.

The MOS transistor M2 connects the intermediate nodes of the two ring oscillators. A control signal INJCLK is input to the gate terminal of the MOS transistor M2.

Figure 33:
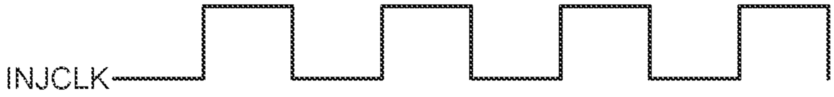
FIG. 33 is a diagram illustrating an example of a control signal input to the oscillator according to the ninth embodiment of the present disclosure.

FIG. 33 is a diagram illustrating an example of the control signal INJCKL input to the oscillator 11_34 according to the ninth embodiment of the present disclosure. As illustrated in FIG. 33, a clock signal having a desired frequency is input to the oscillator 11_34 as the control signal INJCLK.

The oscillator 11_34 generates an oscillation signal in synchronization with the frequency of the control signal INJCLK. Further, the oscillators 11_31 to 11_33 are synchronized with the frequency and the phase of the oscillation signal generated by the oscillator 11_34, similarly to the case where the oscillation circuit 10T is the DCO.

In this manner, by inputting the control signal INJCLK to the oscillation circuit 10T, each oscillator 11 can generate the oscillation signal synchronized with the frequency of the control signal INJCLK.

Here, the case where the oscillation frequency of the oscillation circuit 10T is adjusted by one of the DCO (or VCO) and the injection lock has been described, but the oscillation frequency may be adjusted by using both the DCO (or VCO) and the injection lock.

9.2. Modified Example 9-1

In the ninth embodiment, the case where the oscillation frequency of the oscillator 11 is controlled by inputting the control signal to one of the plurality of oscillators 11 has been described, but the present invention is not limited thereto. For example, the control signal may be input to two or more oscillators 11 among the plurality of oscillators 11.

Figure 34:
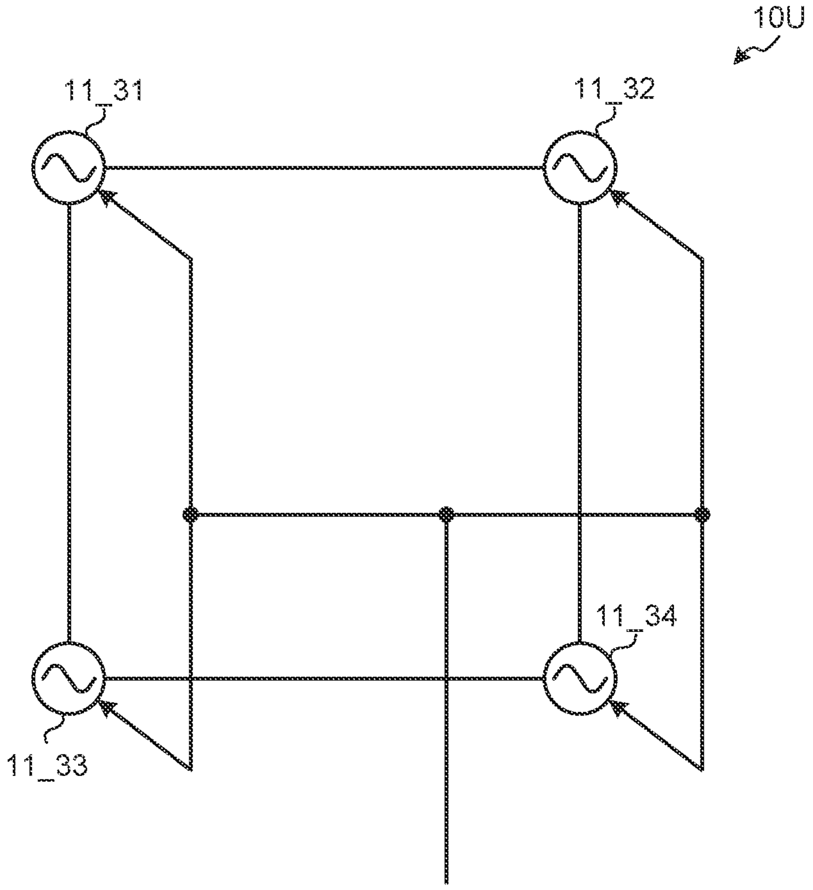
FIG. 34 is a diagram illustrating a configuration example of an oscillation circuit according to Modified Example 9-1 of the ninth embodiment of the present disclosure.

FIG. 34 is a diagram illustrating a configuration example of an oscillation circuit 10U according to Modified Example 9-1 of the ninth embodiment of the present disclosure. The oscillation circuit 10U illustrated in FIG. 34 has the same configuration as the oscillation circuit 10T in FIG. 30 except that the control signal is input to all of the plurality of oscillators 11_31 to 11_34. In this case, the oscillators 11_31 to 11_34 can have a configuration, for example, similar to that of the oscillator 11_34 illustrated in FIGS. 31 and 32.

The control signal is input to the oscillators 11 from, for example, a control line wired in a tree shape. As described above, by setting the lengths of the control lines connected to the respective oscillators 11 to substantially the same length (equal length wiring), it is possible to further reduce variations in impedance viewed from the respective oscillators 11. As a result, the phase of the oscillation signal generated by each oscillator 11 can be more reliably locked.

Here, the control signal is input to all the oscillators 11 included in the oscillation circuit 10U, but the present invention is not limited thereto, and the control signal may be input to at least one of the plurality of oscillators 11. For example, as illustrated in FIG. 30, the control signal may be input to one oscillator 11. Alternatively, the control signal may be input to two or three oscillators 11 among the four oscillators 11 included in the oscillation circuit 10U in FIG. 34.

10. Tenth Embodiment

The oscillation circuit 10 of the above embodiment and modified example can be applied to, for example, a distance measuring device using a direct ToF method. In the tenth embodiment, a case where the oscillation circuit 10 is applied to the distance measuring device will be described.

10.1. Distance Measuring Method

First, an outline of a distance measuring method of a distance measuring device 301 to which the oscillation circuit 10 can be applied will be described. The distance measuring device 301 measures a distance using light. As one of distance measuring methods for measuring a distance to a measurement object using light, a distance measuring method called the direct time of flight (ToF) method is known. In the direct ToF method, reflected light obtained by reflecting light emitted from a light source by the measurement object is received by a light receiving element, and a distance to the object is measured based on time from when the light is emitted until when the light is received as the reflected light.

Figure 35:
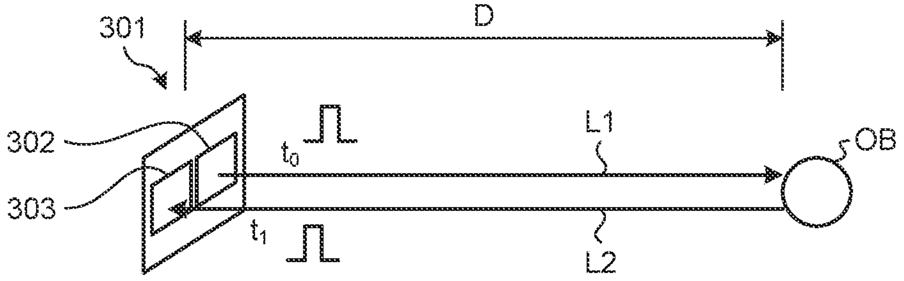
FIG. 35 is a diagram schematically illustrating distance measurement by a direct ToF method applicable to a tenth embodiment of the present disclosure.

FIG. 35 is a diagram schematically illustrating distance measurement by the direct ToF method according to the tenth embodiment of the present disclosure. In the present embodiment, the direct ToF method is applied to the distance measuring method.

The direct ToF method is a method in which reflected light L2 obtained by emission light L1 from a light source 302 being reflected by a measurement object OB is received by a light receiving element 303, and the distance measurement is performed based on a time difference between the light emission timing and the light reception timing.

The distance measuring device 301 includes the light source 302 and the light receiving element 303. The light source 302 is, for example, a laser diode, and is driven to emit laser light in a pulsed manner.

The emission light L1 from the light source 302 is reflected by the measurement object OB and received by the light receiving element 303 as the reflected light L2. The light receiving element 303 converts light into an electrical signal by photoelectric conversion, and outputs a signal corresponding to the received light.

Here, time $t_0$ is a time at which the light source 302 emits light (light emission timing), and time $t_1$ is a time at which the light receiving element 303 receives the reflected light L2 obtained by the emission light L1 from the light source 302 being reflected by the measurement object OB (light reception timing).

When a constant c is a light velocity ($2.9979\times10^8$ [m/sec]), a distance D between the distance measuring device 301 and the measurement object OB can be calculated by the following Expression (1).

$$D=(c/2)\times(t_1-t_0) \quad (1)$$

More specifically, the distance measuring device 301 classifies a time $t_m$ (hereinafter also referred to as a "light receiving time $t_m$") from time $t_0$ of the light emission timing to the light reception timing at which the light is received by the light receiving element 303 based on classes (bins) and generates a histogram.

Figure 36:
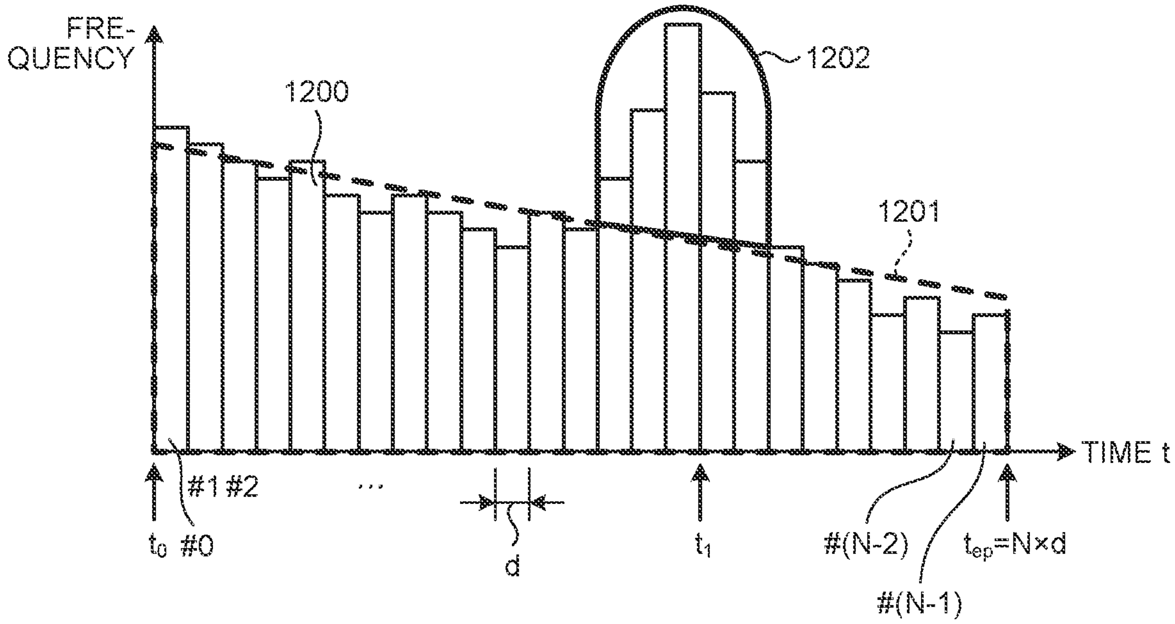
FIG. 36 is a diagram illustrating an example of a histogram based on time when light is received by a light receiving element applicable to the embodiment of the present disclosure.

FIG. 36 is a diagram illustrating an example of a histogram based on the time at which the light is received by the light receiving element 303 applicable to the embodiment of the present disclosure. In FIG. 36, a horizontal axis represents a bin, and a vertical axis represents a frequency in each bin. The bin is obtained by classifying the light receiving time $t_m$ by predetermined unit time d.

Specifically, bin #0 is $0 \le t_m < d$, bin #1 is $d \le t_m < 2 \times d$, bin #2 is $2 \times d \le t_m < 3 \times d$, and bin #(N−2) is $(N-2) \times d \le t_m < (N-1) \times d$. In a case where an exposure time of the light receiving element 303 is time $t_{ep}$, $t_{ep} = N \times d$.

The distance measuring device 301 counts the number of times of acquiring the light receiving time $t_m$ based on the bin, obtains a frequency 1200 for each bin, and generates a histogram. Here, the light receiving element 303 also receives light other than the reflected light L2 obtained by reflecting the emission light L1 from the light source 302.

For example, as an example of light other than the target reflected light L2, there is ambient light around the distance measuring device 301. Such ambient light is light that randomly enters the light receiving element 303, and an ambient light component 1201 due to the ambient light in the histogram is noise with respect to the target reflected light L2.

On the other hand, the target reflected light L2 is light received according to a specific distance, and appears as an active light component 1202 in the histogram. A bin corresponding to a peak frequency in the active light component 1202 is a bin corresponding to the distance D of the measurement object OB.

By acquiring a representative time of the bin (e.g., time at the center of the bin) as the above-described time $t_1$, the distance measuring device 301 can calculate the distance D to the measurement object OB according to the above-described Expression (1). In this way, by using the plurality of light reception results, appropriate distance measurement can be executed against random noise.

10.2. Configuration Example of Distance Measuring Device

Figure 37:
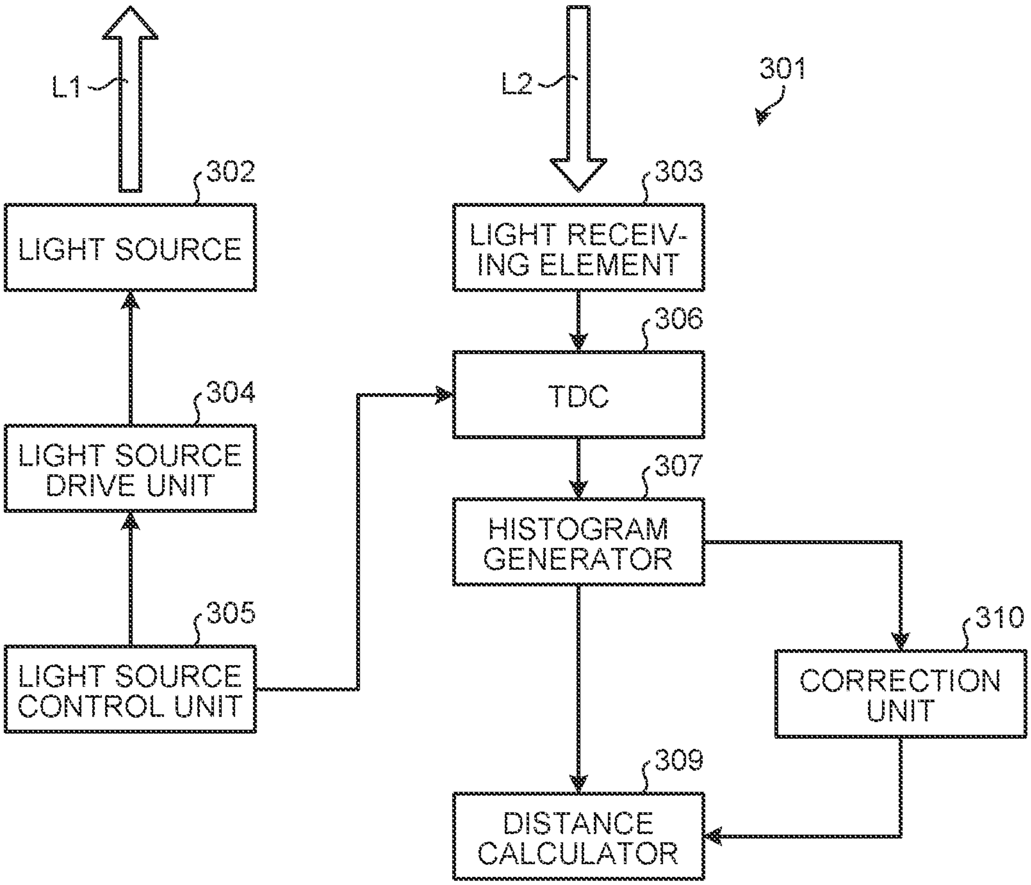
FIG. 37 is a block diagram illustrating a configuration example of a distance measuring device according to an embodiment of the present disclosure.

FIG. 37 is a block diagram illustrating a configuration example of the distance measuring device 301 according to the embodiment of the present disclosure.

As illustrated in FIG. 37, the distance measuring device 301 includes the light source 302, the light receiving element 303, a light source drive unit 304, a light source control unit 305, a time to digital converter (TDC) 306, a histogram generator 307, a distance calculator 309, and a correction unit 310. The TDC 306 is an example of a time measurement unit. The TDC 306, the histogram generator 307, and the distance calculator 309 are also collectively referred to as a distance measuring unit.

The light source 302 is configured with, for example, a laser diode such as a vertical cavity surface emitting laser (VCSEL). Note that the light source 302 is not limited to the VCSEL, and a laser diode array or the like in which laser diodes are arranged on a line may be used.

The light receiving element 303 converts light into an electrical signal by photoelectric conversion, and outputs a signal corresponding to the received light. The light receiving element 303 includes, for example, a single photon avalanche diode (SPAD) element.

In the SPAD element, when a large reverse bias voltage at which avalanche multiplication occurs is applied to a cathode, the avalanche multiplication occurs inside due to electrons generated in response to incidence of one photon.

In other words, the SPAD element has a characteristic that a large current flows in response to the incidence of one photon. Then, in the SPAD element, the incidence of one photon included in the reflected light L2 can be detected with high sensitivity by using the characteristics of the SPAD element. A signal generated by the SPAD element of the light receiving element 303 is supplied to the TDC 306.

Note that the distance measuring device 301 includes a plurality of light receiving elements 303 and a signal processing circuit that outputs a pixel signal corresponding to light detected by the light receiving elements 303. The plurality of light receiving elements 303 and the signal processing circuit are also collectively referred to as, for example, a pixel unit. Furthermore, the light receiving element 303 is also simply referred to as a pixel 303. The plurality of light receiving elements 303 is arranged in a two-dimensional lattice pattern.

The light source drive unit 304 drives the light source 302. For example, the light source drive unit 304 drives the light source 302 so that the emission light L1 having a predetermined timing and pulse width is emitted from the light source 302 based on a light emission control signal from the light source control unit 305.

The light source drive unit 304 can drive the light source 302 such that the laser light is scanned in a direction perpendicular to a line on which the laser diodes of the light source 302 are arranged.

The light source control unit 305 controls the entire operation of the distance measuring device 301 according to, for example, a program incorporated in advance. For example, the light source control unit 305 controls the light emission timing of the light source 302.

Furthermore, the light source control unit 305 controls the operation of the plurality of light receiving elements 303. For example, the light source control unit 305 can cause the light source control unit 305 to independently read a signal from each SPAD element.

In the embodiment, reading of the signal from each light receiving element 303 may be controlled for each block including (n×m) pieces of the light receiving elements 303 that are n pixels in a row direction and m pixels in a column direction.

Furthermore, the light source control unit 305 may scan each light receiving element 303 in the row direction and further scan in the column direction for each row, in a unit of block, to read the signal from each light receiving element 303.

The TDC 306 converts the pixel signal supplied from the light receiving element 303 into time information indicating timing. Specifically, the TDC 306 regards the light emission timing of the light source 302 sent from the light source control unit 305 as time $t_0$ (see FIG. 36).

Then, based on the time $t_0$, the TDC 306 measures the time from the light emission timing at which the light source 302 emits the light to the light reception timing at which the light receiving element 303 receives the light, and outputs the measured result in a digital value as the time information.

The TDC 306 is provided for each light receiving element 303. Therefore, the distance measuring device 301 includes a plurality of TDCs 306.

The histogram generator 307 creates the histogram as illustrated in FIG. 36 based on the time information output from the TDC 306. Specifically, the histogram generator 307 classifies the time information sent from the TDC 306 according to the histogram, and increments a value of the corresponding bin of the histogram.

Then, a series of processing including an output of a light emission command to the light source drive unit 304, light emission from the light source 302 according to the light emission command, conversion to the time information by the TDC 306, and increment of the bin of the histogram based on the time information by the histogram generator 307 is repeated for a predetermined number of times (e.g., tens of thousands of times). As a result, the histogram generator 307 completes the generation of the histogram for one frame.

Note that the histogram generator 307 is provided for each light receiving element 303. Therefore, the distance measuring device 301 includes a plurality of histogram generators 307.

The correction unit 310 detects an error caused by a signal delay between the light receiving element 303 and the TDC 306, and calculates a correction amount.

The distance calculator 309 calculates the distance D to the object based on the histogram generated by the histogram generator 307 and the correction amount calculated by the correction unit 310.

10.3. Signal Delay

Figure 38:
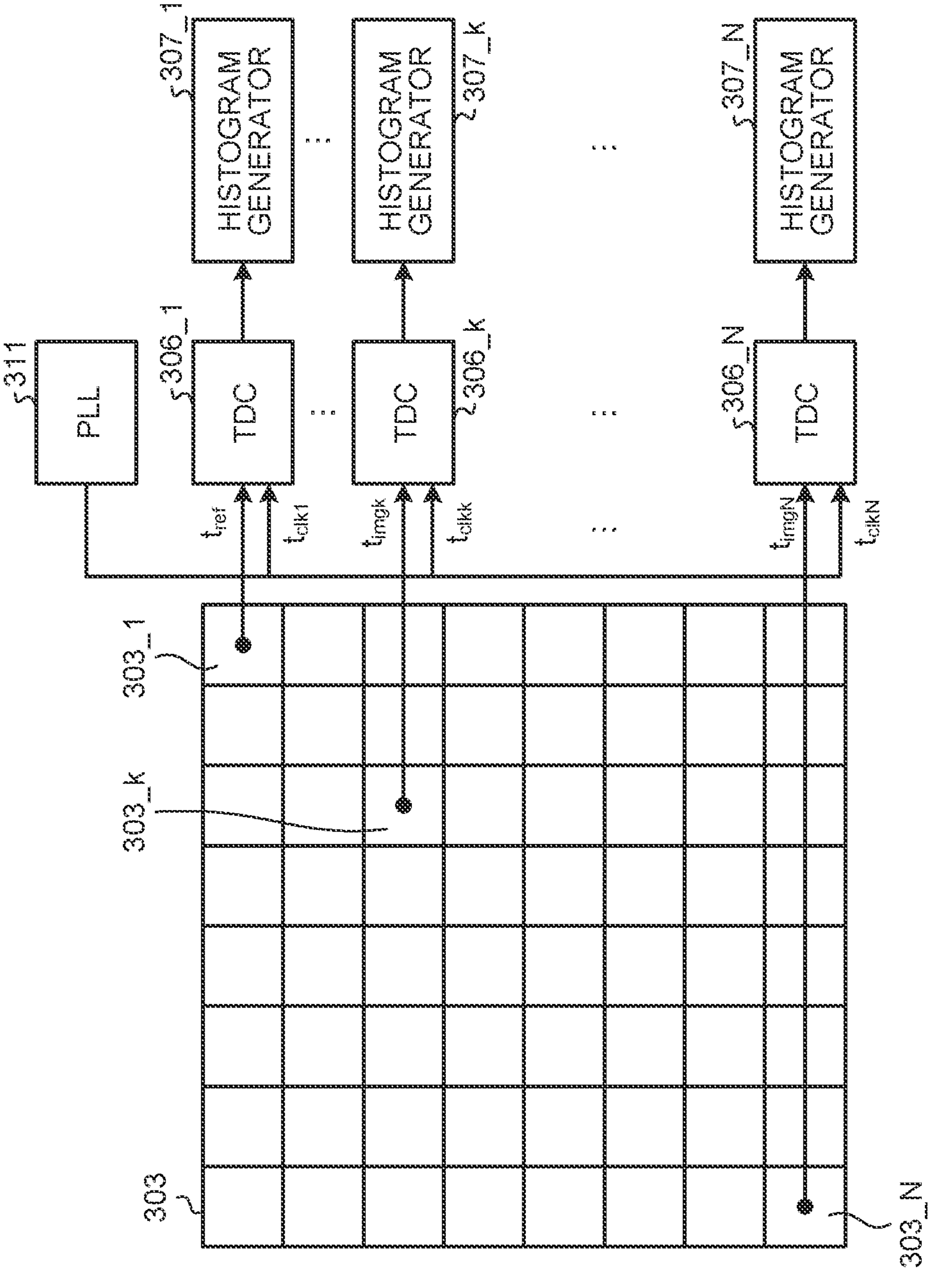
FIG. 38 is a diagram illustrating a signal delay generated in a distance measuring device according to the tenth embodiment of the present disclosure.

Here, a signal delay generated between the light receiving element 303 and the TDC 306 will be described with reference to FIG. 38. FIG. 38 is a diagram illustrating a signal delay generated in the distance measuring device 301 according to the tenth embodiment of the present disclosure.

As illustrated in FIG. 38, the plurality of light receiving elements 303 arranged in a matrix are connected to the plurality of TDCs 306_1 to 306_N, respectively. The light receiving elements 303 output a light receiving signal generated to the corresponding TDC 306.

The clock signal generated by a PLL 311 is input to the TDCs 306_1 to 306_N. Based on the clock signal, the TDC 306 measures time from when the light source 302 emits light to when the light receiving signal is input.

As described above, the plurality of TDCs 306 is provided corresponding to the light receiving elements 303. Therefore, the wiring length between the PLL 311 and the TDC 306 differs depending on the TDC 306. For example, in FIG. 38, the TDC 306_1 is arranged closest to the PLL 311, and the TDC 306 is arranged farthest from the PLL 311. Note that the arrangement illustrated in FIG. 38 is an example, and is different from an actual arrangement of the light receiving elements 303, the PLL 311, the TDCs 306, and the histogram generators 307.

As described above, when the wiring length between the PLL 311 and the TDC 306 varies depending on the TDC 306, a signal delay corresponding to the wiring length occurs in the clock signal input to each TDC 306.

For example, it is assumed that the clock signal is input to the TDC 306_1 at time $t_{clk1}$. In this case, the clock signal is input to the TDC 306_N later than the time $t_{clk1}$ by time $t_{csN}$. The $t_{csN}$ is a skew generated in the TDC 306_N, and is determined according to the wiring length between the PLL 311 and the TDC 306_N. Hereinafter, the signal delay generated in the clock signal input to the TDC 306 is also referred to as a clock skew.

Similarly, since the wiring length between the light receiving element 303 and the TDC 306 is different for each light receiving element 303, a signal delay also occurs in the light receiving signal input to the TDC 306. For example, among the plurality of light receiving elements 303 arranged in the two-dimensional lattice pattern, the light receiving element 303_1 arranged in the upper right of FIG. 38 and the light receiving element 303_N arranged in the lower left have different times until the light receiving signal output reaches the TDC 306.

Figure 39:
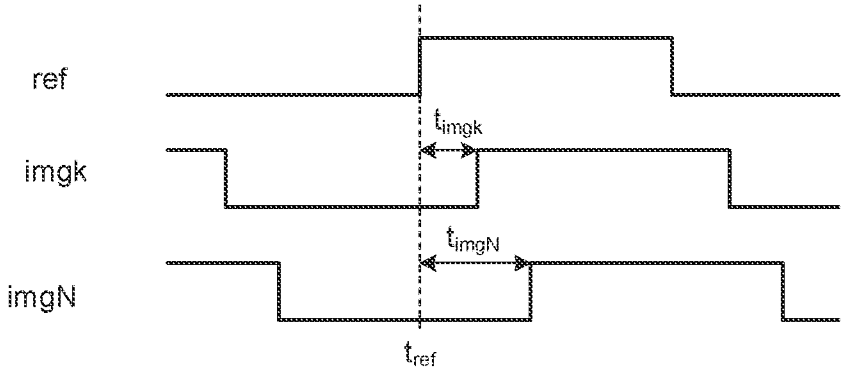
FIG. 39 is a diagram illustrating a signal delay of a light receiving signal according to the tenth embodiment of the present disclosure.

A signal delay of the light receiving signal will be described with reference to FIG. 39. FIG. 39 is a diagram illustrating a signal delay of the light receiving signal according to the tenth embodiment of the present disclosure. Here, in order to make the description easier to understand, it is assumed that all the light receiving elements 303 simultaneously output the light receiving signals.

For example, as illustrated in FIG. 39, it is assumed that a light receiving signal ref output from the light receiving element 303_1 in the upper right is input to the TDC 306_1 at time $t_{ref}$. In this case, a light receiving signal imgk output from the third light receiving element 303_*k* from the right and top is input to the TDC 306_*k* delayed by time $t_{imgk}$ from time $t_{ref}$. Furthermore, the light receiving signal imgN output from the light receiving element 303_N at the lower left is input to the TDC 306_N delayed by time $t_{imgN}$ from the time $t_{ref}$.

The times $t_{imgk}$ and $t_{imgN}$ are skews generated in the TDCs 306_*k* and 306_N, and are determined according to the wiring lengths between the light receiving elements 303_*k* and 303_N and the TDCs 306_*k* and 306_N. Hereinafter, the signal delay generated in the light receiving signal input to the TDC 306 is also referred to as a pixel skew.

The clock skew and the pixel skew occur in the TDC 306. For example, in the TDC 306_N, a skew obtained by skew$=-t_{csN}+t_{imgN}-t_{ref}$ occurs as compared with the TDC 306_1.

Here, in the conventional distance measuring device, in order to correct the signal delay generated in the distance measuring unit, the light receiving signal is corrected using two types of pixels that are the reference pixel and the distance measuring pixel. For example, the reference pixel is irradiated with reflected light having a distance of zero by using a stray light or the like. By correcting the light receiving signal output from the distance measuring pixel using the light receiving signal output from the reference pixel, it is possible to suppress an influence of the signal delay generated in the distance measuring unit.

However, the skew generated in the TDC 306 described above, particularly the pixel skew, is a skew generated in the pixel unit, and cannot be removed by the light receiving signal output from the reference pixel described above.

The skew can occur, for example, in the order of 100 ps. Therefore, an error of several centimeters occurs in the distance due to the influence of skew, and a distance measurement accuracy deteriorates. Note that a period (oscillation period) of the clock signal needs to be larger than the skew (oscillation period>skew).

As a method of suppressing the influence of skew, there is a method of performing calibration at the time of shipment. For example, a calibration plate is placed in front of the distance measuring device 301, and a distance to the calibration plate is calculated. When there is no skew, distances detected by the light receiving elements 303 will be equal. In other words, the distance calculated using the calibration plate is a value including the skew corresponding to each light receiving element 303. At the time of shipment, a skew correction amount is calculated in advance based on the above value, and when the distance is actually calculated, the influence of the skew can be reduced by correcting the distance using the skew correction amount. The skew correction amount is stored in, for example, a nonvolatile memory or the like.

However, the value of the skew changes due to voltage, temperature, aging, and the like. It is difficult to calculate the skew correction amount for every voltage and temperature, and it has been desired to perform skew calibration not only at the time of shipment but also, for example, at the time of distance measurement or every predetermined period.

As a method of calibrating the skew, for example, a method of generating a light receiving signal in a pseudo manner using the oscillation circuit and calibrating the skew using a pseudo light receiving signal generated can be considered. For example, the skew can be detected by simultaneously outputting the pseudo light receiving signal from a plurality of pixels and detecting time from when the pseudo light receiving signal is output to when the pixel reaches the TDC 306.

However, conventionally, it has been difficult to simultaneously output the pseudo light receiving signals from the plurality of pixels. For example, it is assumed that a signal generation circuit that generates the pseudo light receiving signal is arranged in the vicinity of each of the plurality of light receiving elements 303. In this case, skew occurs in the control signal for controlling the output of the pseudo reception signal to each signal generation circuit. Therefore, it has been difficult to cause all the signal generation circuits to simultaneously output the pseudo light receiving signals.

Figure 40:
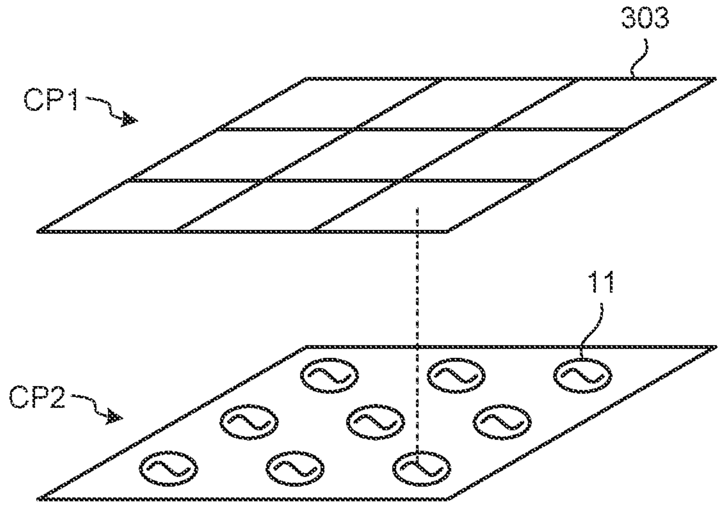
FIG. 40 is a diagram illustrating an arrangement example of an oscillator according to the tenth embodiment of the present disclosure.

Therefore, in the distance measuring device 301 according to the present embodiment, each oscillator 11 of the oscillation circuit 10 described above is arranged in the vicinity of the light receiving element 303 to generate the pseudo light receiving signal in the signal generation circuit. For example, as illustrated in FIG. 40, in a case where the pixel unit has a two-layer structure of an upper chip CP1 and a lower chip CP2, the light receiving element 303 is arranged on the upper chip CP1, and the oscillator 11 is arranged on the lower chip CP2. For example, the oscillator 11 is disposed immediately below the corresponding light receiving element 303. As described above, since the light receiving elements 303 are arranged in the two-dimensional lattice pattern, the oscillators 11 are also arranged in the two-dimensional lattice pattern.

The oscillators 11 are connected by the wiring 12 (not illustrated) such that the closed path passing through once each of the oscillators 11 is formed. As a result, the distance measuring device 301 can simultaneously output the pseudo light receiving signals (corresponding to oscillation signals) from the oscillators 11 of all the pixels. Note that FIG. 40 is a diagram illustrating an arrangement example of the oscillators 11 according to the tenth embodiment of the present disclosure.

The distance measuring device 301 according to the present embodiment further reduces the influence of the skew by correcting the skew using the pseudo light receiving signal as described above.

Note that, as a method of suppressing the influence of the skew described above, for example, a method of bringing the TDC 306 close to the light receiving element 303, in other words, a method of providing the TDC 306 in the pixel (e.g., in the substrate on which the light receiving element 303 is disposed) can also be considered. However, in this case, although the distance between the light receiving element 303 and the TDC 306 can be shortened, the distance between the PLL 311 and the TDC 306 becomes long. As a result, the clock skew increases, and thus the influence of the skew cannot be suppressed.

10.4. Calculation of Correction Amount

Figure 41:
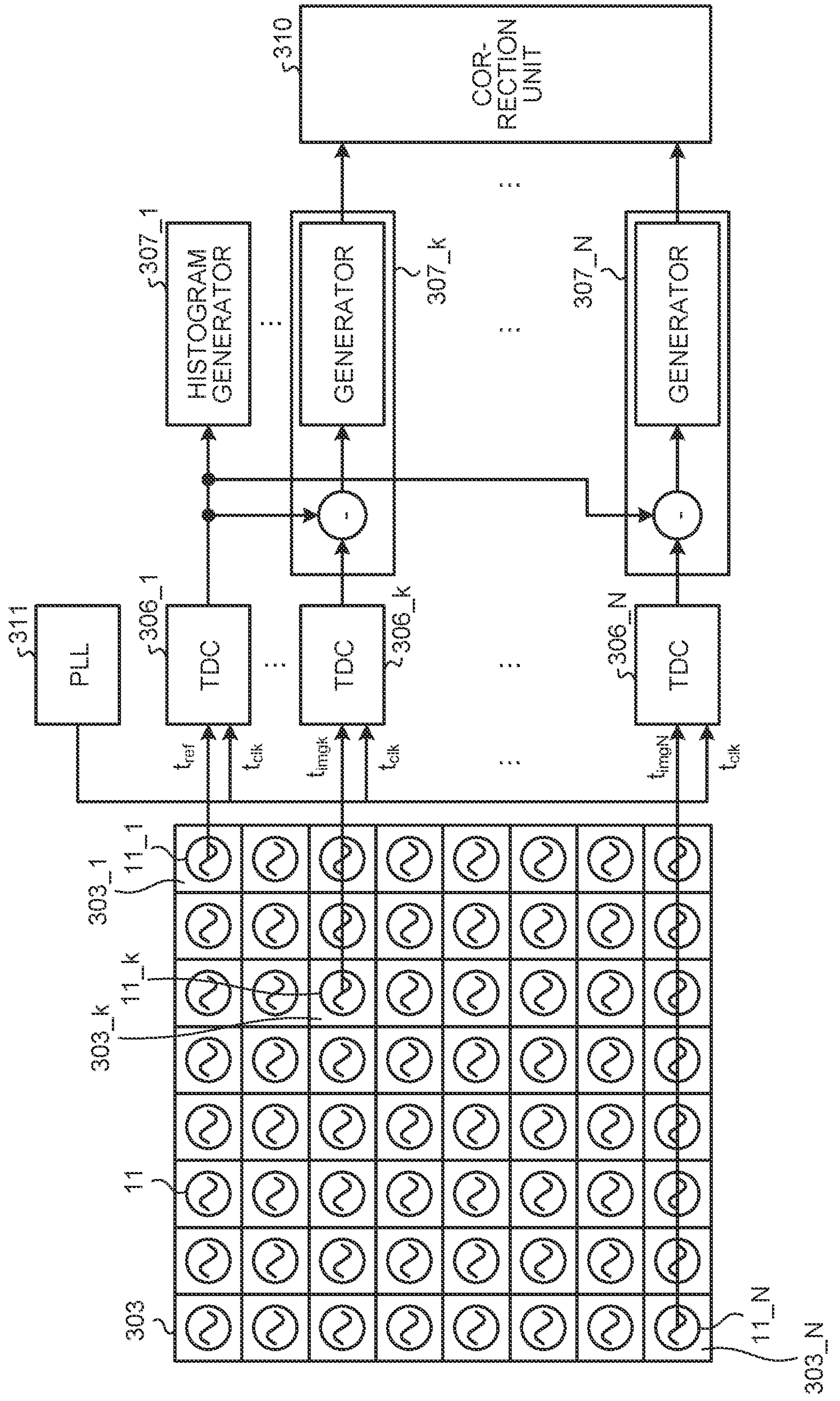
FIG. 41 is a diagram illustrating an example of correction amount calculation by the distance measuring device according to the tenth embodiment of the present disclosure.
Figure 42:
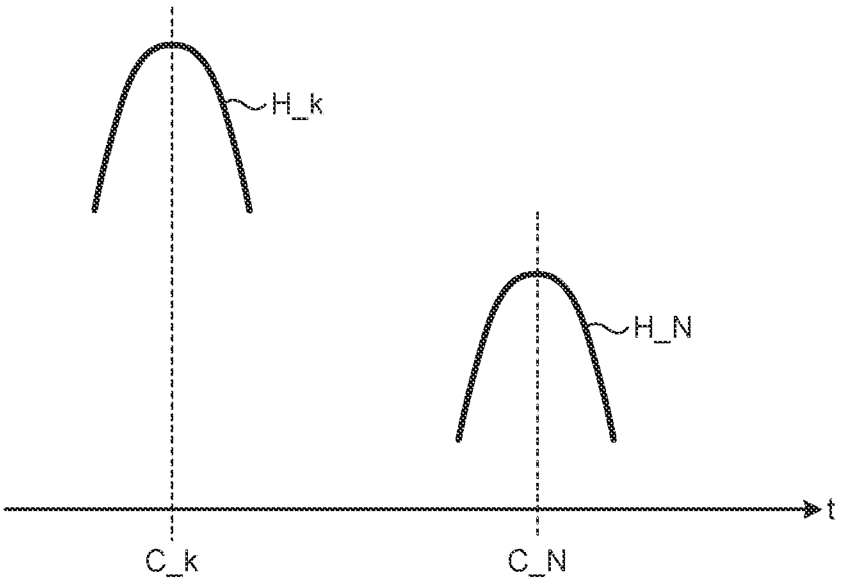
FIG. 42 is a diagram illustrating an example of correction amount calculation by the distance measuring device according to the tenth embodiment of the present disclosure.

Next, an example of a method of calculating a skew correction amount will be described with reference to FIGS. 41 and 42. FIGS. 41 and 42 are diagrams illustrating an example of calculating the correction amount by the distance measuring device 301 according to the tenth embodiment of the present disclosure.

FIG. 41 illustrates a case where the light receiving element 303 and the oscillator 11 are viewed from the upper chip side. As illustrated in FIG. 41, the oscillator 11 is disposed near the light receiving element 303. Note that, in FIG. 41, one oscillator 11 is arranged for one light receiving element 303, but one oscillator 11 may be arranged for a plurality of light receiving elements 303 such as four light receiving elements 303.

The oscillation signal generated by the oscillator 11 is input to the TDC 306 as a pseudo light receiving signal. The oscillator 11 is connected by the wiring 12 (not illustrated) so as to form the closed path that passes through once each of the oscillators 11. As a result, all the oscillators 11 output the pseudo light receiving signals whose frequencies and phases are synchronized.

A distance between the TDC 306 and each oscillator 11 is substantially equal to a distance between the TDC 306 and the light receiving element 303. Therefore, similarly to the light receiving signal, the pseudo light receiving signal affected by the pixel skew is input to the TDC 306 (see FIG. 40).

Based on the PLL 311, the TDC 306 measures a difference between the timing at which the light source 302 emits light and a timing at which the pseudo light receiving signal is input to the TDC 306. The TDC 306 measures the time affected by the skew including the clock skew and the pixel skew described above. The TDC 306 outputs measured time to the histogram generator 307.

For example, the histogram generator 307 calculates a histogram of a difference between the time measured by the TDC 306 based on the pseudo light receiving signal output from the reference pixel and the time measured by the TDC 306 based on the pseudo light receiving signal output from the distance measuring pixel.

More specifically, in the example in FIG. 41, it is assumed that the upper right pixel is the reference pixel and the remaining pixels are distance measuring pixels. Furthermore, the TDC 306_1 measures time based on the pseudo light receiving signal output from the oscillator 11_1 of the reference pixel, and the remaining TDCs **306_*k* (k=2 to N) measure time based on the pseudo light receiving signals output from the oscillators 11_*k*** of the distance measuring pixels.

In this case, the histogram generator **307_*k* includes a subtractor and a generator. The histogram generator 307_*k* uses the subtractor to subtract the time measured by the TDC 306_1 from the time measured by the TDC 306_*k*, and generates a histogram of a subtraction result. Time measurement using the pseudo light receiving signal is repeatedly performed for a predetermined number of times until the histogram generated by the histogram generator 307_*k*** has a sufficient normal distribution.

FIG. 42 illustrates an example of the histogram generated by the histogram generator 307. FIG. 42 illustrates an example of a histogram H_k generated by a histogram generator 307_*k* (here, k=2 to N−1) and a histogram H_N generated by a histogram generator 307_N.

The histogram H_k and the histogram H_N are generated to be shifted in a time direction according to the skew of the TDCs 306_*k* and 306_N. For example, in FIG. 42, the TDC 306_N is disposed farther from the light receiving element 303 and the PLL 311 than the TDC 306_*k*. Therefore, the histogram H_N is generated to be shifted in a direction in which time is delayed from the histogram H_k.

The correction unit 310 (see FIG. 41) calculates the skew correction amount based on the histogram generated by the histogram generator 307. For example, the correction unit 310 calculates an average of the histograms as the correction amount. In the case of the histogram H_k and the histogram H_N illustrated in FIG. 41, the correction unit 310 sets an average Ck of the histogram H_k and an average C_N of the histogram H_N as the skew correction amount of the corresponding light receiving element 303.

Note that a variance of the histogram is calculated by a variation due to jitter and a quantization error of the oscillator 11 (variance=jitter+quantization error variation of oscillator 11). However, since the jitter of the oscillator 11 is sufficiently large, even in a case where a resolution of the TDC 306 is not fine, the average of the histogram can be estimated by performing average calculation.

In addition, the oscillator 11 and the PLL 311 do not need to be synchronized. Since the oscillator 11 and the PLL 311 are asynchronous, the quantization error is converted into the jitter of the oscillator 11. As a result, the same as dither or ΔΣ modulation of the image occurs. Note that, since the number of samplings (the number of times of measurement of the pseudo light receiving signal by the TDC 306) can be made sufficiently large, the resolution of the TDC 306 does not become a problem.

10.5. Correction Process

Figure 43:
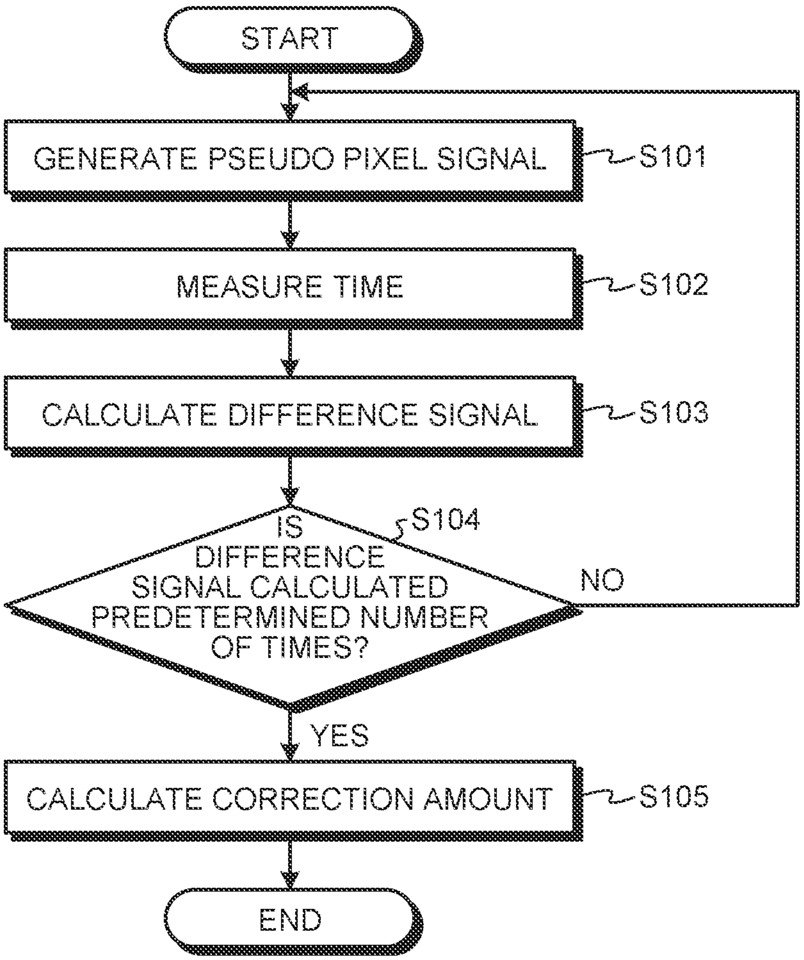
FIG. 43 is a flowchart illustrating an example of a correction process executed by the distance measuring device according to the tenth embodiment of the present disclosure.

FIG. 43 is a flowchart illustrating an example of a correction process executed by the distance measuring device 301 according to the tenth embodiment of the present disclosure. For example, the distance measuring device 301 executes the correction process illustrated in FIG. 43 before performing the distance measurement. Alternatively, the distance measuring device 301 executes the correction process illustrated in FIG. 43, for example, every lapse of a predetermined period.

First, the distance measuring device 301 generates the pseudo light receiving signal using the oscillator 11 (Step S101). Next, the distance measuring device 301 measures time between the pseudo light receiving signal and a predetermined signal (Step S102). The distance measuring device 301 calculates a difference signal that is a difference between the time measured based on the pseudo light receiving signal of the reference pixel and the time measured based on the pseudo light receiving signal of the distance measuring pixel (Step S103).

For example, the distance measuring device 301 determines whether or not the difference signal has been calculated a predetermined number of times for obtaining a histogram of sufficient normal distribution (Step S104). When the number of times of calculation of the difference signal is less than the predetermined number of times (Step S104; No), the process returns to Step S101.

On the other hand, when the difference signal is calculated the predetermined number of times (Step S104; Yes), the distance measuring device 301 calculates the skew correction amount from the histogram of the difference signal (Step S105).

As described above, the distance measuring device 301 according to the tenth embodiment uses the oscillation circuit 10 as the signal generation circuit that generates the pseudo light receiving signal of the light receiving element 303. Therefore, the distance measuring device 301 can generate the pseudo light receiving signal in which the phase and the frequency are synchronized using the oscillator 11. As a result, the distance measuring device 301 can more easily calculate the skew correction amount, and can further improve the distance measurement accuracy.

Note that, a case where the distance measuring device 301 performs the distance measurement by the direct ToF method has been described, but the present invention is not limited thereto. Even when the distance measuring device 301 performs the distance measurement by, for example, an indirect ToF method, the influence of skew can be further reduced by a similar method.

Even in the case of the indirect ToF method, skew occurs according to the wiring length between each light receiving element of the pixel unit and the distance measuring unit. In this case, similarly to the distance measuring device 301, the oscillator 11 is arranged in the vicinity of each light receiving element to generate the pseudo light receiving signal, and a difference in timing at which each light receiving signal is received by the distance measuring unit is detected, so that it is possible to detect skew and correct the skew in the distance measurement by the distance measuring unit.

11. Eleventh Embodiment

In the above-described tenth embodiment, the method of calibrating the skew using the pseudo light receiving signal output from the oscillator 11 has been described, but the method of suppressing the influence of the skew is not limited thereto. For example, the oscillation circuit 10 of the present disclosure may be used instead of the PLL 311 to generate a clock signal in the vicinity of the light receiving element 303.

Figure 44:
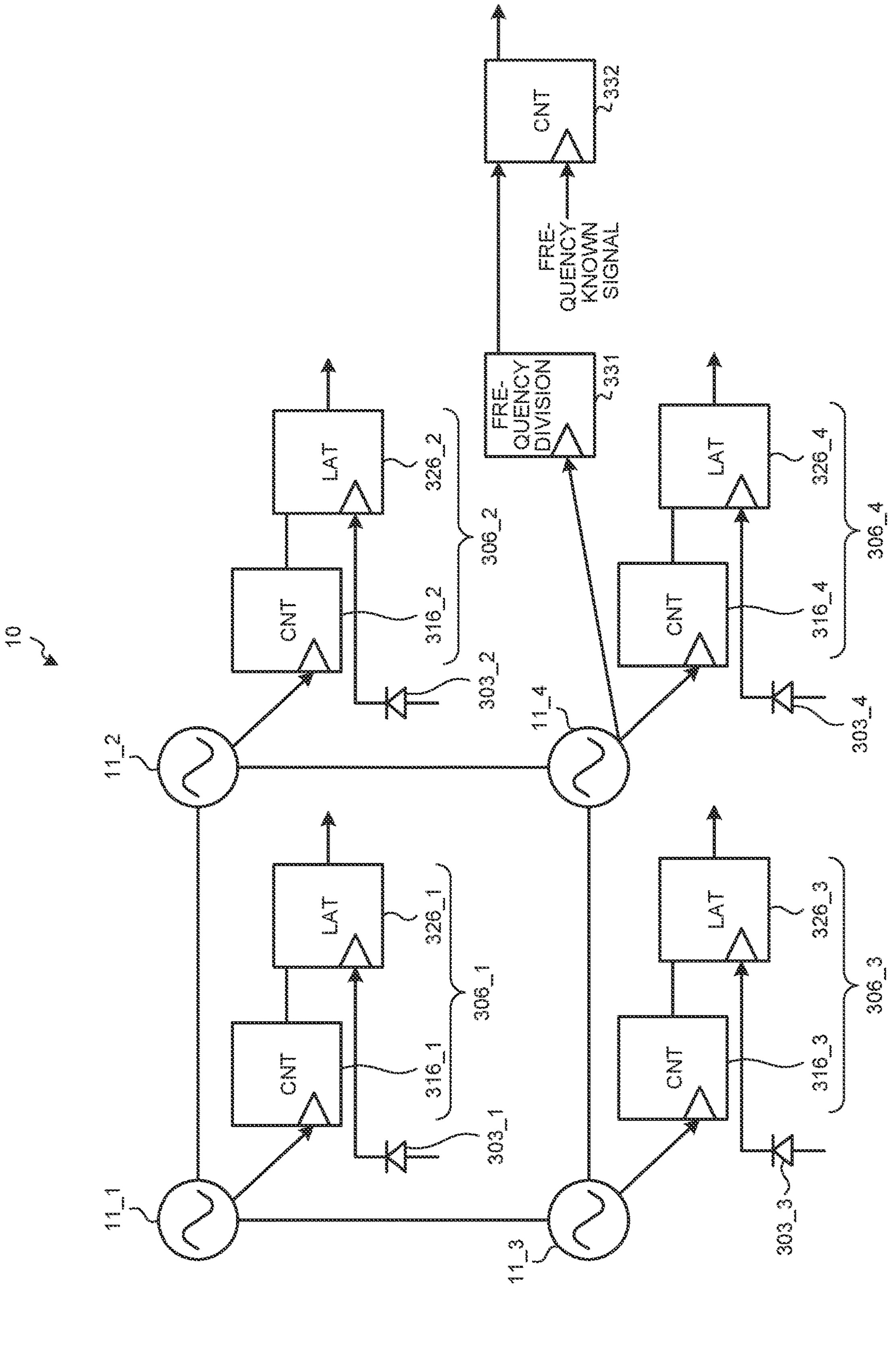
FIG. 44 is a diagram illustrating a TDC of a distance measuring device according to an eleventh embodiment of the present disclosure.

FIG. 44 is a diagram illustrating the TDC 306 of the distance measuring device 301 according to the eleventh embodiment of the present disclosure.

The distance measuring device 301 according to the present embodiment includes the oscillation circuit 10 including the oscillators 11_1 to 11_4 instead of the PLL 311 illustrated in FIG. 41.

The oscillation circuit 10 includes the plurality of oscillators 11_1 to 11_4. Note that FIG. 44 illustrates a case where the oscillation circuit 10 includes four oscillators 11, but the number of oscillators 11 included in the oscillation circuit 10 is not limited to four. The number of oscillators 11 may be two or more, and may be two, three, five or more.

The plurality of oscillators 11 is arranged in, for example, the two-dimensional lattice shape, and is connected by wiring so as to form the closed path passing through once each of the oscillators 11. In the example in FIG. 44, the plurality of oscillators 11 is arranged at respective vertexes of the quadrangular closed path and connected by wiring arranged on each side of the quadrangular closed path.

The oscillation signal generated by each oscillator 11 is input to the TDC 306 as the clock signal.

Here, the oscillator 11 and the TDC 306 are arranged in the vicinity of the light receiving element 303. For example, the TDC 306 and the oscillator 11 are arranged in a lower layer (lower chip CP2 in FIG. 40) of the upper chip CP1 in which the light receiving element 303 is arranged.

As a result, the distance between the TDC 306 and the oscillator 11 can be shortened, and the clock skew of the clock signals input to the plurality of TDCs 306 can be further reduced. Furthermore, the distance between the TDC 306 and the light receiving element 303 can be shortened, and the pixel skew of the light receiving signal input to the TDC 306 can be further reduced.

In the example illustrated in FIG. 44, the TDC 306 includes a counter circuit 316 and a latch circuit 326, and measures a time difference between the clock signal input to the counter circuit 316 and the light receiving signal input to the latch circuit 326.

Furthermore, in FIG. 44, the oscillation signal of the oscillator 11_4 is output, for example, via a frequency divider 331 and a counter 332. As a result, it is possible to calculate the oscillation cycle of the oscillation signal (clock signal) generated by the oscillator 11.

As described above, in the distance measuring device 301 according to the eleventh embodiment, the oscillation circuit 10 and the TDC 306 are arranged in the vicinity of the light receiving element 303 (e.g., on the same substrate), and the oscillation signal of each oscillator 11 is used as the clock signal of the corresponding TDC 306. As a result, the distance measuring device 301 can suppress the occurrence of skew and can further improve the distance measurement accuracy.

12. Twelfth Embodiment

In the above-described eleventh embodiment, the method of suppressing the skew of the distance measuring device 301 that performs the distance measurement by the direct ToF method has been described, but the present invention is not limited thereto. For example, even when the distance measurement is performed by the indirect ToF method, it is possible to suppress skew occurring between the light receiving element (imaging device) and the distance measuring unit. Hereinafter, as a twelfth embodiment, a distance measuring device 410 capable of suppressing skew when the distance measurement is performed by the indirect ToF method will be described.

12.1. Configuration Example of Distance Measuring Device

Prior to the description of the twelfth embodiment of the present disclosure, the indirect time of flight (ToF) method will be described, for easy understanding, as one of distance measuring methods applied to the twelfth embodiment. The indirect ToF method is a technique of irradiating a measurement object with light of the light source (e.g., laser light in infrared region) modulated by, for example, pulse width modulation (PWM), receiving reflected light by the light receiving element, and measuring a distance to the measurement object based on a phase difference in the reflected light received.

Figure 45:
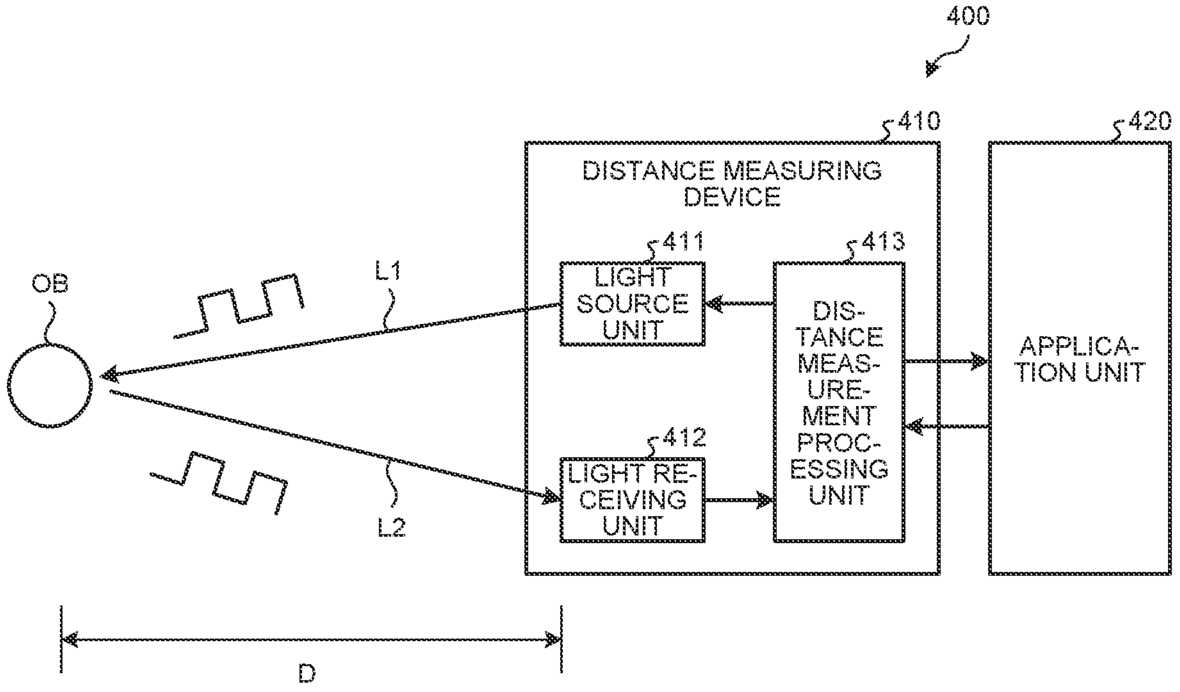
FIG. 45 is a block diagram illustrating a configuration example of an electronic apparatus using a distance measuring device applicable to a twelfth embodiment of the present disclosure.

FIG. 45 is a block diagram illustrating a configuration example of an electronic apparatus using the distance measuring device applicable to the twelfth embodiment of the present disclosure. In FIG. 45, an electronic apparatus 400 includes a distance measuring device 410 and an application unit 420. The application unit 420 is realized, for example, by a program operating on a central processing unit (CPU), and requests the distance measuring device 410 to execute distance measurement, and receives distance information or the like that is a result of the distance measurement from the distance measuring device 410.

The distance measuring device 410 includes a light source unit 411, a light receiving unit 412, and a distance measurement processing unit 413. The light source unit 411 includes, for example, a light emitting element that emits light having a wavelength in an infrared region, and a drive circuit that drives the light emitting element to emit light. For example, a light emitting diode (LED) may be applied as the light emitting element included in the light source unit 411. However, the present invention is not limited thereto, and a vertical cavity surface emitting laser (VCSEL) in which a plurality of light emitting elements are formed in an array may be applied as the light emitting element included in the light source unit 411. Hereinafter, unless otherwise specified, "the light emitting element of the light source unit 411 emits light" will be described as "the light source unit 411 emits light".

The light receiving unit 412 includes, for example, a light receiving element that detects light having a wavelength in an infrared region and generates a light receiving signal, and a signal processing circuit that outputs a pixel signal corresponding to the light detected by the light receiving element. A photodiode may be applied as the light receiving element included in the light receiving unit 412. Hereinafter, unless otherwise specified, "the light receiving element included in the light receiving unit 412 receives light" will be described as "the light receiving unit 412 receives light".

The distance measurement processing unit 413 executes, for example, a distance measurement process in the distance measuring device 410 in response to a distance measurement instruction from the application unit 420. For example, the distance measurement processing unit 413 generates a light source control signal for driving the light source unit 411 and supplies the light source control signal to the light source unit 411. Furthermore, the distance measurement processing unit 413 controls light reception by the light receiving unit 412 in synchronization with the light source control signal supplied to the light source unit 411. For example, the distance measurement processing unit 413 generates an exposure control signal (example of phase control signal) for controlling an exposure period in the light receiving unit 412 in synchronization with the light source control signal, and supplies the generated signal to the light receiving unit 412. The light receiving unit 412 outputs a valid pixel signal within the exposure period indicated by the exposure control signal.

The distance measurement processing unit 413 calculates distance information based on the pixel signal output from the light receiving unit 412 in response to light reception. Furthermore, the distance measurement processing unit 413 may generate predetermined image information based on the pixel signal. The distance measurement processing unit 413 passes the distance information and the image information calculated and generated based on the pixel signal to the application unit 420.

In such a configuration, the distance measurement processing unit 413 generates the light source control signal for driving the light source unit 411 in accordance with an instruction to execute the distance measurement from the application unit 420, for example, and supplies the light source control signal to the light source unit 411. Here, the distance measurement processing unit 413 generates the light source control signal modulated into a rectangular wave having a predetermined duty by PWM, and supplies the light source control signal to the light source unit 411. At the same time, the distance measurement processing unit 413 controls light reception by the light receiving unit 412 based on the exposure control signal synchronized with the light source control signal.

In the distance measuring device 410, the light source unit 411 emits light modulated according to the light source control signal generated by the distance measurement processing unit 413. In the example in FIG. 45, the light source unit 411 blinks and emits light according to a predetermined duty according to the light source control signal. The light emitted from the light source unit 411 is emitted from the light source unit 411 as the emission light L1. The emission light L1 is reflected by the measurement object OB, for example, and is received by the light receiving unit 412 as the reflected light L2. The light receiving unit 412 supplies the pixel signal corresponding to the reception of the reflected light L2 to the distance measurement processing unit 413.

The distance measurement processing unit 413 executes light reception by the light receiving unit 412 a plurality of times at different phases for each light receiving element. The distance measurement processing unit 413 calculates the distance D to the measurement object based on a difference between pixel signals due to light reception at different phases.

12.2. Outline of Distance Measurement by Indirect ToF Method

Figure 46:
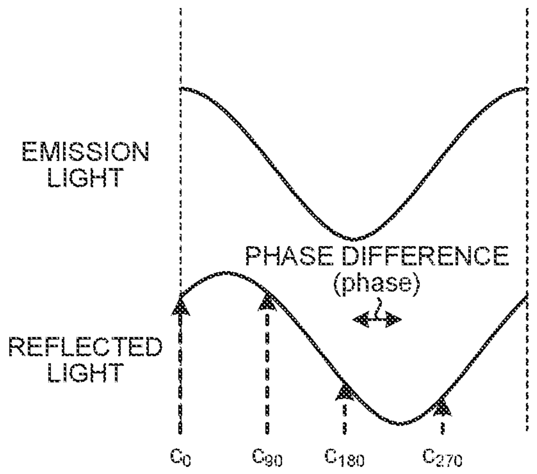
FIG. 46 is a diagram illustrating a principle of an indirect ToF method.

Next, the distance measurement by the indirect ToF method applied to the twelfth embodiment of the present disclosure will be described. FIG. 46 is a diagram illustrating the principle of the indirect ToF method. In FIG. 46, light modulated by a sine wave is used as the emission light L1 emitted by the light source unit 411. Ideally, the reflected light L2 is a sine wave having a phase difference (phase) corresponding to the distance D with respect to the emission light L1.

The distance measurement processing unit 413 performs sampling a plurality of times for each phase on the pixel signal that has received the reflected light L2, and acquires a light quantity value (value of the pixel signal) indicating a light quantity for each sampling. In the example in FIG. 46, light quantity values $C_0$, $C_{90}$, $C_{180}$, and $C_{270}$ are acquired in phases of 0 degrees, 90 degrees, 180 degrees, and 270 degrees that are different phases from the emission light L1 by 90 degrees. In the indirect ToF method, the distance information is calculated based on a difference between a set of light quantity values having a phase difference of 180 degrees among phases of 0 degrees, 90 degrees, 180 degrees, and 270 degrees.

Figure 47:
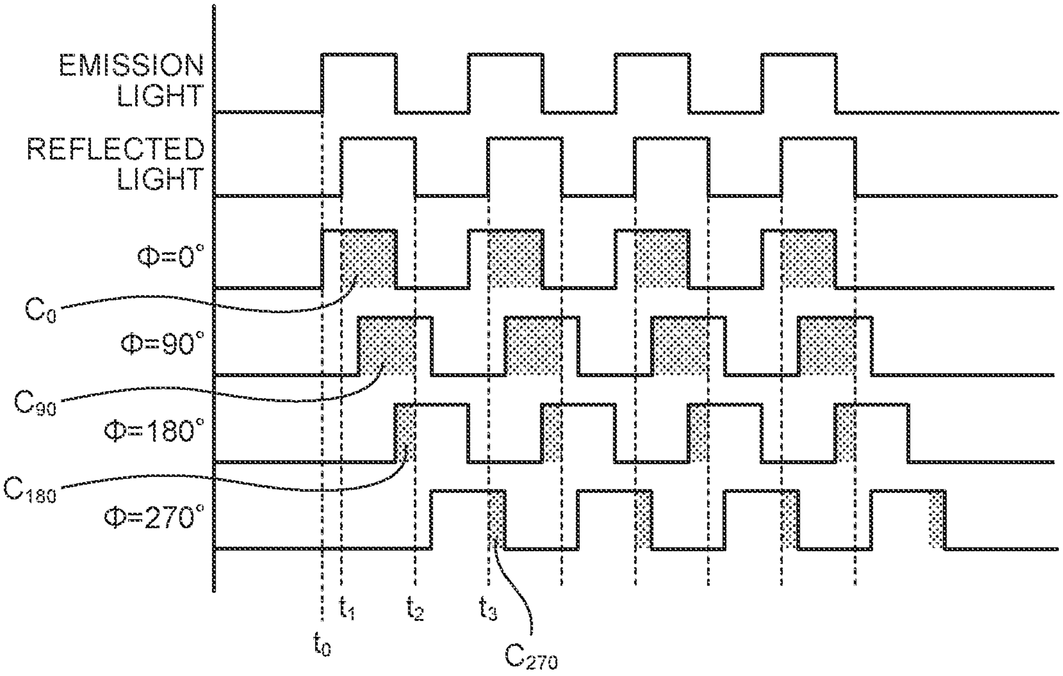
FIG. 47 is a diagram illustrating an example of a case where emission light L1 from a light source unit is a rectangular wave modulated by PWM.

A method of calculating the distance information in the indirect ToF method will be described more specifically with reference to FIG. 47. FIG. 47 is a diagram illustrating an example when the emission light L1 from the light source unit 411 is a rectangular wave modulated by PWM. In FIG. 47, the emission light L1 from the light source unit 411 and the reflected light L2 reaching the light receiving unit 412 are illustrated from an upper part. As illustrated in the upper part of FIG. 47, the light source unit 411 periodically flashes at a predetermined duty to emit the emission light L1.

FIG. 47 further illustrates exposure control signals at phases of 0 degrees (indicated as Φ=0 degrees), 90 degrees (indicated as Φ=90 degrees), 180 degrees (indicated as Φ=180 degrees), and 270 degrees (indicated as Φ=270 degrees) of the light receiving unit 412. For example, a period during which the exposure control signal is in a high state is an exposure period during which the light receiving element of the light receiving unit 412 outputs a valid pixel signal.

In the example in FIG. 47, the emission light L1 is emitted from the light source unit 411 at time $t_0$, and the reflected light L2 obtained by reflecting the emission light L1 by the measurement object reaches the light receiving unit 412 at time $t_1$ delayed according to a distance D from the time $t_0$ to the measurement object.

On the other hand, in accordance with the exposure control signal from the distance measurement processing unit 413, the light receiving unit 412 starts the exposure period with the phase of 0 degrees in synchronization with the time point $t_0$ of the emission timing of the emission light L1 in the light source unit 411. Similarly, the light receiving unit 412 starts the exposure periods of the phases of 90 degrees, 180 degrees, and 270 degrees in accordance with the exposure control signal from the distance measurement processing unit 413. Here, the exposure period in each phase follows the duty of the emission light L1. Note that, in the example in FIG. 47, the exposure periods of the respective phases are illustrated as being temporally parallel for the sake of explanation, but actually, in the light receiving unit 412, the exposure periods of the respective phases are sequentially designated to acquire the light quantity values $C_0$, $C_{90}$, $C_{180}$, and $C_{270}$ of the respective phases.

In the example in FIG. 47, an arrival timing of the reflected light L2 is the time points $t_1$, $t_2$, $t_3$, and so on and the light quantity value $C_0$ at the phase of 0 degrees is acquired as an integral value of the light reception quantity from the time point $t_o$ to an end time point of the exposure period including the time point to at the phase of 0 degrees. On the other hand, in the phase of 180 degrees in which the phase is different by 180 degrees with respect to the phase of 0 degrees, the light quantity value $C_{180}$ is acquired as an integral value of the received light quantity from a start time point of the exposure period at the phase of 180 degrees to the time point $t_2$ of the falling of the reflected light L2 included in the exposure period.

Also for the phase of 270 degrees that is different from the phase of 90 degrees by 180 degrees, with respect to a phase C90, the integral value of the received light quantity in a period in which the reflected light L2 arrives within each exposure period is acquired as the light quantity values $C_{90}$ and $C_{270}$, similarly to the case of the phases of 0 degrees and 180 degrees described above.

Among these light quantity values $C_0$, $C_{90}$, $C_{180}$, and $C_{270}$, as indicated in the following Expressions (2) and (3), a difference I and a difference Q are obtained based on a combination of light quantity values having the phase difference of 180 degrees.

$$I=C_0-C_{180} \tag{2}$$

$$Q=C_{90}-C_{270} \tag{3}$$

Based on these differences I and Q, the phase difference (phase) is calculated by the following Expression (4). In Expression (4), the phase difference (phase) is defined in a range of ($0 \le \text{phase} < 2\pi$).

$$\text{phase}=\tan^{-1}(Q/I) \tag{4}$$

Distance information Depth is calculated by the following Expression (5) using the phase difference (phase) and a predetermined coefficient (range).

$$\text{Depth}=(\text{phase}\times\text{range})/2\pi \tag{5}$$

12.3. Generation of Exposure Control Signal

In a conventional distance measuring device, the clock signal is generated by the PLL included in the distance measurement processing unit, and the light source control signal and the exposure control signal are generated based on the clock signal, thereby generating the exposure control signal synchronized with the light source control signal. The exposure control signal is phase-shifted by the distance measurement processing unit and input to the light receiving unit. Since the distance from the circuit that performs the phase shift to each light receiving element of the light receiving unit varies depending on arrangement location of each light receiving element, the above-described skew also occurs in the distance measuring device of the indirect ToF method.

Therefore, in the distance measuring device 410 according to the present embodiment, the skew is suppressed by generating the exposure control signal using an oscillation circuit 10X that can output the oscillation signals in four phases.

Figure 48:
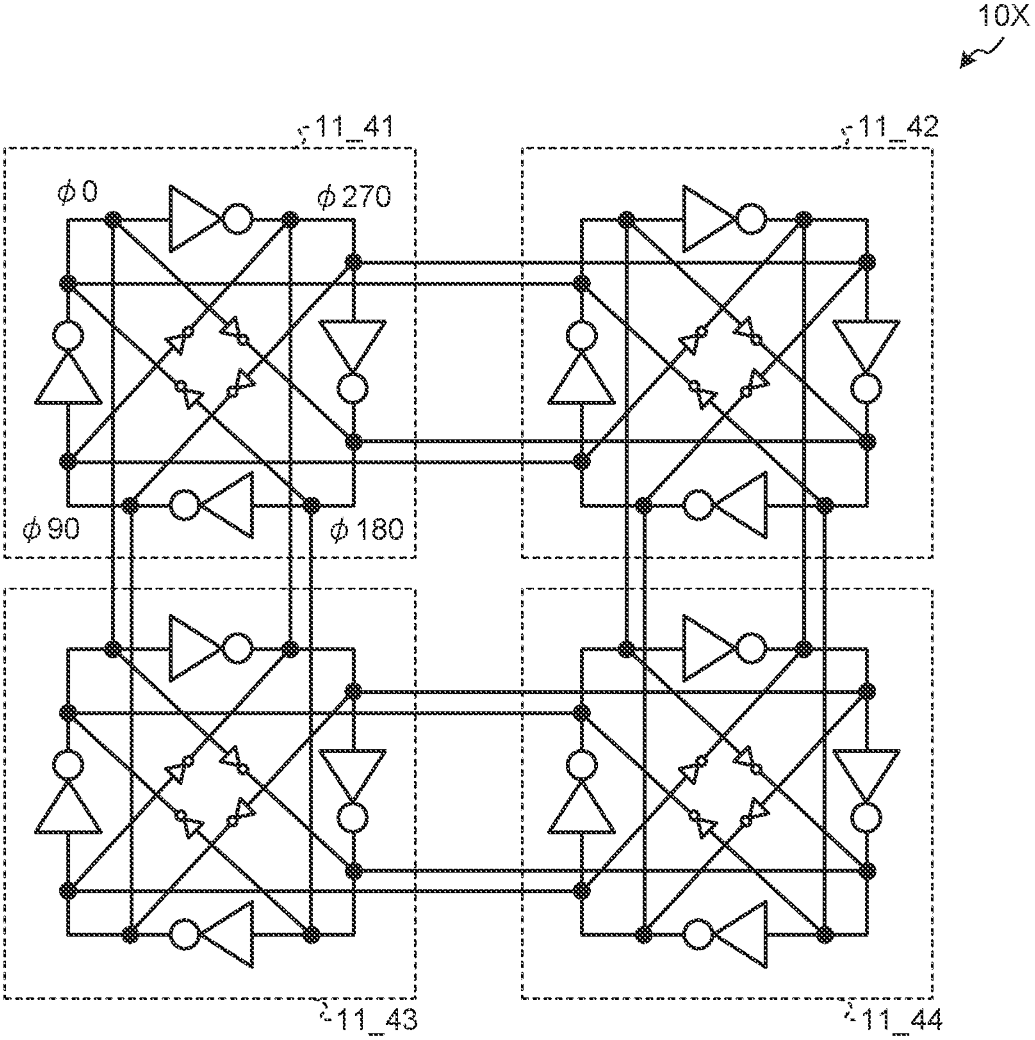
FIG. 48 is a diagram illustrating a configuration example of an oscillation circuit according to the twelfth embodiment of the present disclosure.

First, a configuration example of the oscillation circuit 10X will be described with reference to FIG. 48. FIG. 48 is a diagram illustrating a configuration example of an oscillation circuit 10X according to the twelfth embodiment of the present disclosure.

The oscillation circuit 10X illustrated in FIG. 48 includes a plurality of oscillators 11_41 to 11_44. The oscillators 11 are connected by wiring so as to form a closed path that passes through once each of the oscillators 11.

Each oscillator 11 illustrated in FIG. 48 includes four inverters connected in a ring shape. The intermediate node of each inverter is provided with an auxiliary inverter circuit having two inverters cross-coupled so as to connect diagonal intermediate nodes.

The oscillator 11 generates the oscillation signal whose phase is shifted by 90 degrees at each intermediate node. In the oscillator 11, inverters that generate the oscillation signals of the same phase are connected to each other. As described above, the oscillation circuit 10X can lock each of the phases of the oscillation signals that are shifted by 90 degrees by connecting the corresponding intermediate nodes of the plurality of oscillators 11 by the wiring.

Figure 49:
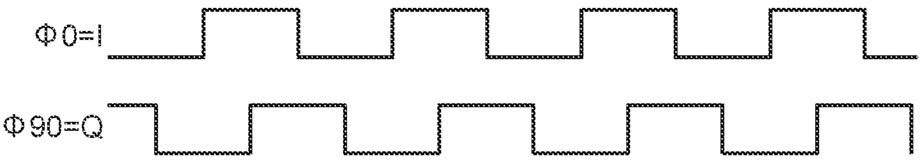
FIG. 49 is a diagram illustrating an example of an oscillation signal generated by an oscillator according to the twelfth embodiment of the present disclosure.

FIG. 49 is a diagram illustrating an example of the oscillation signal generated by the oscillator 11 according to the twelfth embodiment of the present disclosure.

FIG. 49 illustrates the oscillation signal having the phase of 0 degrees and the oscillation signal having the phase of 90 degrees. As described above, by outputting a signal from each intermediate node of the oscillators 11, the oscillation signal oscillating at a desired phase can be obtained.

For example, when the distance measuring device 410 performs the distance measurement by a two-tap method using the exposure control signals with the phase of 0 degrees and the phase of 90 degrees, the distance measuring device 410 controls the exposure of the light receiving element, more specifically, on/off of the gate of the pixel transistor that controls the light receiving element, using the oscillation signal with the phase of 0 degrees as an I signal and the oscillation signal with the phase of 90 degrees as a Q signal illustrated in FIG. 49.

Here, the distance measuring device 410 arranges the oscillators 11 of the oscillation circuit 10X illustrated in FIG. 48 in the vicinity of the light receiving elements. For example, the distance measuring device 410 arranges the oscillators 11 on the same substrate as the light receiving elements. More specifically, the oscillators 11 are disposed on the lower chip (FIG. 40) of the chip on which the light receiving elements are disposed, and the exposure control signal is input from the oscillators 11 to the light receiving elements.

As described above, the distance measuring device 410 generates the exposure control signals of the plurality of phases using the oscillators 11 arranged in the vicinity of the light receiving elements, so that the influence of the skew generated in the exposure control signal can be reduced.

Note that, although the case where the distance measuring device 410 uses the oscillation circuit 10X as the signal generation circuit that generates the exposure control signal has been described here, for example, the oscillation circuit 10X may be used as the signal generation circuit that generates the light source control signal.

13. Summary

Although the embodiments and modified examples of the present disclosure have been described in detail with reference to the accompanying drawings, the technical scope of the present disclosure is not limited thereto. It is obvious that a person having ordinary knowledge in the technical field of the present disclosure can conceive various changes or modifications within the scope of the technical idea described in the claims, and it is naturally understood that these also belong to the technical scope of the present disclosure.

Note that, in each of the above-described embodiments and modified examples of the present disclosure, the oscillation circuit 10 is applied to the distance measuring device, but the present disclosure is not limited thereto. For example, when a device including a circuit that receives the oscillation signal in which the phase and the frequency are synchronized as an input, the oscillation circuit described in each embodiment and each modified example can be applied to a device other than the distance measuring device.

In addition, the above-described embodiments and modified examples can be appropriately combined within a range that does not cause contradicting processes.

Furthermore, the effects described in the present specification are merely illustrative or exemplary, and are not restrictive. In other words, the technology according to the present disclosure can exhibit other effects obvious to those skilled in the art from the description of the present specification in addition to or instead of the above effects.

Note that the following configurations also belong to the technical scope of the present disclosure.

(1)

An oscillation circuit comprising:

a plurality of oscillators; and a wiring that connects the plurality of oscillators, wherein the wiring is arranged so as to form a closed path that passes through once each of the plurality of oscillators, and the plurality of oscillators is arranged such that impedance viewed from each of the plurality of oscillators in the closed path satisfies a predetermined condition.

(2)

The oscillation circuit according to (1), wherein the plurality of oscillators is arranged on the closed path such that the impedance is matched in the closed path.

(3)

The oscillation circuit according to (1) or (2), wherein the wiring forms the closed path that is bent a plurality of times, and the plurality of oscillators is arranged on the closed path.

(4)

The oscillation circuit according to any one of (1) to (3), wherein the wiring is arranged so as to form a plurality of closed paths, each of the plurality of closed paths passing through once each of at least two oscillators among the plurality of oscillators, and the plurality of oscillators is arranged to be included in at least one of the plurality of closed paths.

(5)

The oscillation circuit according to (4), further comprising a second wiring that connects at least two closed paths among the plurality of closed paths.

(6)

The oscillation circuit according to (5), wherein the second wiring has a resistance value smaller than a resistance value of the wiring.

(7)

The oscillation circuit according to any one of (4) to (6), wherein the plurality of oscillators has a different size for each of the plurality of closed paths.

(8)

The oscillation circuit according to (4), wherein the wiring is arranged so as to form a first closed path group including at least one first closed path passing through once each of k pieces of oscillators among the plurality of oscillators, and a second closed path group including at least one second closed path passing through once each of m pieces of oscillators among the plurality of oscillators, and the plurality of oscillators is arranged to be included in the first closed path and the second closed path.

(9)

The oscillation circuit according to any one of (1) to (8), wherein the plurality of oscillators is arranged three-dimensionally.

(10)

The oscillation circuit according to (9), wherein the plurality of oscillators is arranged in a three-dimensional curved shape.

(11)

The oscillation circuit according to any one of (1) to (10), wherein at least one of the plurality of oscillators is arranged on a different substrate, and the wiring includes a through electrode penetrating the different substrate to form the closed path.

(12)

The oscillation circuit according to any one of (1) to (11), wherein the wiring includes a plurality of switches that switches a connection state between the plurality of oscillators, and the connection state between the plurality of oscillators is switched by the switches so as to switch a configuration of the closed path.

(13)

The oscillation circuit according to any one of (1) to (12), wherein each of the plurality of oscillators includes a plurality of logic gate circuits, each of the plurality of logic gate circuits generating an oscillation signal having a different phase, and the wiring connects adjacent oscillators in the closed path by connecting the logic gate circuits that generate an oscillation signal having a same phase among the plurality of logic gate circuits included in the adjacent oscillators in the closed path.

(14)

The oscillation circuit according to any one of (1) to (13), further comprising an adjustment circuit that adjusts impedance viewed from at least one of the plurality of oscillators on the wiring.

(15)

The oscillation circuit according to any one of (1) to (14), wherein at least one of the plurality of oscillators receives an input of a synchronization signal and generates an oscillation signal that reduces a phase difference between the oscillation signal to be output and the synchronization signal when the input of the synchronization signal is received.

(16)

The oscillation circuit according to any one of (1) to (15), wherein at least one of the plurality of oscillators includes a variable resistance circuit and outputs an oscillation signal having a frequency corresponding to a resistance value of the variable resistance circuit.

(17)

The oscillation circuit according to (1), wherein the plurality of oscillators is two oscillators, and the wiring connects the plurality of oscillators.

(18)

An oscillation circuit according to (1) comprising:

a plurality of oscillators; and a wiring that connects the plurality of oscillators; wherein the wiring is arranged to pass through once each of the plurality of oscillators so as to form a closed path, the plurality of oscillators is arranged such that impedance viewed from each of the plurality of oscillators in the closed path satisfies a predetermined condition, and the plurality of oscillation circuits is arranged so as to be located at any one of substantially a center of a side, a vertex, and a substantially center of a surface of a polyhedron whose sides have substantially equal length.

(19)

A distance measuring device comprising:

a plurality of time measurement units that respectively measures time information indicating time from a light emission timing at which a light source emits light to a light reception timing at which a plurality of light receiving elements receives the light; and an oscillation circuit that supplies a clock signal to each of the plurality of time measurement units, wherein the oscillation circuit includes:

a plurality of oscillators that is formed, in a corresponding manner to the plurality of light receiving elements, on a same substrate as the plurality of light receiving elements, and respectively supplies the clock signal to the plurality of time measurement units that measures the time information corresponding to the light receiving elements, and a wiring that connects the plurality of oscillators, the wiring is disposed so as to form a closed path that passes through once each of the plurality of oscillators, and the plurality of oscillators is arranged such that impedance viewed from each of the oscillators in the closed path satisfies a predetermined condition.

(20)

A distance measuring device comprising:

a plurality of light receiving elements that generates a plurality of light receiving signals according to light emission from a light source;

a signal generation circuit that is arranged on a same substrate as the plurality of light receiving elements and generates a plurality of pseudo light receiving signals respectively corresponding to the plurality of light receiving elements;

a correction unit that detects a signal delay of the light receiving signals based on the plurality of pseudo light receiving signals and calculates a correction amount for correcting the signal delay; and a distance measuring unit that calculates distance information to a measurement object based on the light receiving signals and the correction amount, wherein the signal generation circuit includes:

a plurality of oscillators that is formed in a corresponding manner to the plurality of light receiving elements and generates the plurality of pseudo light receiving signals, and a wiring that connects the plurality of oscillators, the wiring is arranged so as to form a closed path that passes through once each of the plurality of oscillators, and the plurality of oscillators is arranged such that impedance viewed from each of the oscillators in the closed path satisfies a predetermined condition.

(21)

A distance measuring device comprising:

a plurality of light receiving elements that receives light in each phase indicated by a phase control signal according to light emission from a light source and generates a light receiving signal in the each phase;

a distance measuring unit that calculates distance information to a measurement object based on the light receiving signal; and a signal generation circuit that generates the phase control signal, wherein the signal generation circuit includes:

a plurality of oscillators that is formed, in a corresponding manner to the plurality of light receiving elements, on a same substrate as the plurality of light receiving elements, and generates the phase control signal for each phase, and a wiring that connects the plurality of oscillators, the wiring is disposed so as to form a closed path that passes through once each of the plurality of oscillators, and the plurality of oscillators is arranged such that impedance viewed from each of the oscillators in the closed path satisfies a predetermined condition.

(22)

A distance measuring method comprising:

generating, by a plurality of light receiving elements, a plurality of light receiving signals according to light emission from a light source;

generating, by a plurality of oscillators of a signal generation circuit, a plurality of pseudo light receiving signals respectively corresponding to the plurality of light receiving elements, the signal generation circuit including the plurality of oscillators that is formed, in a corresponding manner to the plurality of light receiving elements, on a same substrate as the plurality of light receiving elements, and a wiring connecting the plurality of oscillators so as to form a closed path that passes through once each of the plurality of oscillators, the plurality of oscillators being arranged such that impedance viewed from each of the plurality of oscillators in the closed path satisfies a predetermined condition;

calculating a correction amount for correcting a signal delay of the plurality of light receiving signals, the signal delay being detected based on the plurality of pseudo light receiving signals; and calculating distance information to a measurement object based on the plurality of light receiving signals and the correction amount.

REFERENCE SIGNS LIST

10 OSCILLATION CIRCUIT
11 OSCILLATOR
12 WIRING
100 PLL CIRCUIT
110 PHASE COMPARATOR
120 LOW PASS FILTER
130 FREQUENCY DIVIDER
301 DISTANCE MEASURING DEVICE
302 LIGHT SOURCE
303 LIGHT RECEIVING ELEMENT
304 LIGHT SOURCE DRIVE UNIT
305 LIGHT SOURCE CONTROL UNIT
306 TDC
307 HISTOGRAM GENERATOR
309 DISTANCE CALCULATOR
310 CORRECTION UNIT

The invention claimed is:

1. An oscillation circuit, comprising:

a plurality of oscillators; and a first wiring configured to:

connect the plurality of oscillators; and form a closed path that passes through once each oscillator of the plurality of oscillators, wherein the first wiring includes a plurality of switches configured to switch a connection state between the plurality of oscillators, the connection state between the plurality of oscillators is switched to switch a configuration of the closed path, and an impedance viewed from each oscillator of the plurality of oscillators in the closed path satisfies a specific condition.

2. The oscillation circuit according to claim 1, wherein the plurality of oscillators is on the closed path, and the impedance viewed from each oscillator of the plurality of oscillators is same in the closed path.

3. The oscillation circuit according to claim 1, wherein the closed path is bent a plurality of times, and the plurality of oscillators is on the closed path.

4. The oscillation circuit according to claim 1, wherein the first wiring is further configured to form a plurality of closed paths, the plurality of closed paths includes the closed path, each closed path of the plurality of closed paths passes through once each oscillator of at least two oscillators among the plurality of oscillators, and at least one closed path of the plurality of closed paths includes the plurality of oscillators.

5. The oscillation circuit according to claim 4, further comprising a second wiring configured to connect at least two closed paths among the plurality of closed paths.

6. The oscillation circuit according to claim 5, wherein the second wiring has a resistance value smaller than a resistance value of the first wiring.

7. The oscillation circuit according to claim 4, wherein the plurality of oscillators has a different size for each closed path of the plurality of closed paths.

8. The oscillation circuit according to claim 4, wherein the first wiring is further configured to form a first closed path group and a second closed path group, the first closed path group includes at least one first closed path passing through once each oscillator of k pieces of oscillators among the plurality of oscillators, the second closed path group includes at least one second closed path passing through once each oscillator of m pieces of oscillators among the plurality of oscillators, and the plurality of oscillators is included in the first closed path and the second closed path.

9. The oscillation circuit according to claim 1, wherein the plurality of oscillators is in three-dimensional configuration.

10. The oscillation circuit according to claim 9, wherein the plurality of oscillators is in a three-dimensional curved shape.

11. The oscillation circuit according to claim 1, further comprising:

a first substrate; and a second substrate different from the first substrate, wherein at least one oscillator of the plurality of oscillators is on the first substrate and the second substrate, and the first wiring further includes a through electrode configured to penetrate the first substrate and the second substrate to form the closed path.

12. The oscillation circuit according to claim 1, wherein each oscillator of the plurality of oscillators includes a plurality of first logic gate circuits, each logic gate circuit of the plurality of first logic gate circuits is configured to generate first oscillation signal having a different phase, adjacent oscillators of the plurality of oscillators include a plurality of second logic gate circuits configured to generate a second oscillation signal having a same phase, the plurality of second logic gate circuits is connected in the closed path, and the first wiring is configured to connect the adjacent oscillators in the closed path based on the connection of the plurality of second logic gate circuits in the closed path.

13. The oscillation circuit according to claim 1, further comprising an adjustment circuit configured to adjust a specific impedance viewed from at least one oscillator of the plurality of oscillators on the first wiring.

14. The oscillation circuit according to claim 1, wherein at least one oscillator of the plurality of oscillators is configured to:

receive an input of a synchronization signal; and generate an oscillation signal based on the reception of the input of the synchronization signal, and the oscillation signal reduces a phase difference between a specific oscillation signal to be output and the synchronization signal.

15. The oscillation circuit according to claim 1, wherein at least one oscillator of the plurality of oscillators includes a variable resistance circuit, and the at least one oscillator is configured to output an oscillation signal having a frequency corresponding to a resistance value of the variable resistance circuit.

16. The oscillation circuit according to claim 1, wherein the plurality of oscillators includes two oscillators.

17. An oscillation circuit, comprising:

a plurality of oscillators; and a wiring configured to:

connect a first oscillator of the plurality of oscillators with a second oscillator of the plurality of oscillators, wherein the first oscillator is adjacent to the second oscillator; and form a closed path that passes through once each oscillator of the plurality of oscillators, wherein the wiring includes a plurality of switches configured to switch a connection state between the plurality of oscillators, the connection state between the plurality of oscillators is switched to switch a configuration of the closed path, the plurality of oscillators is located at one of a substantially center of a side of a polyhedron, a vertex of the polyhedron, or a substantially center of a surface of the polyhedron, and sides of the polyhedron have substantially equal length.

18. A distance measuring device, comprising:

a light source configured to emit light;

a plurality of light receiving elements configured to receive the light;

a plurality of time measurement units configured to measure time information corresponding to the plurality of light receiving elements, wherein the time information indicates a time from a light emission timing at which the light is emitted by the light source to a light reception timing at which the plurality of light receiving elements receive the light; and an oscillation circuit configured to supply a clock signal to each measurement unit of the plurality of time measurement units, wherein the oscillation circuit includes:

a substrate;

a plurality of oscillators on the substrate, wherein the plurality of oscillators corresponds to the plurality of light receiving elements, and the plurality of oscillators is on the same substrate as the plurality of light receiving elements; and a wiring configured to:

connect the plurality of oscillators; and form a closed path that passes through once each oscillator of the plurality of oscillators, wherein the wiring includes a plurality of switches configured to switch a connection state between the plurality of oscillators, the connection state between the plurality of oscillators is switched to switch a configuration of the closed path, and an impedance viewed from each oscillator of the plurality of oscillators in the closed path satisfies a specific condition.

19. A distance measuring device, comprising:

a substrate;

a light source configured to emit light;

a plurality of light receiving elements configured to generate a plurality of light receiving signals based on the light emission from the light source, wherein the plurality of light receiving elements is on the substrate;

a signal generation circuit on the same substrate as the plurality of light receiving elements, wherein the signal generation circuit is configured to generate a plurality of pseudo light receiving signals corresponding to the plurality of light receiving elements;

a correction unit configured to:

detect a signal delay of the plurality of light receiving signals based on the plurality of pseudo light receiving signals; and calculate a correction amount to correct the signal delay; and a distance measuring unit configured to calculate distance information to a measurement object based on the plurality of light receiving signals and the correction amount, wherein the signal generation circuit includes:

a plurality of oscillators configured to generate the plurality of pseudo light receiving signals, wherein the plurality of oscillators corresponds to the plurality of light receiving elements; and a wiring configured to:

connect the plurality of oscillators; and form a closed path that passes through once each oscillator of the plurality of oscillators, wherein the wiring includes a plurality of switches configured to switch a connection state between the plurality of oscillators, the connection state between the plurality of oscillators is switched to switch a configuration of the closed path, and an impedance viewed from each oscillator of the plurality of oscillators in the closed path satisfies a specific condition.

20. A distance measuring device, comprising:

a substrate;

a light source configured to emit light;

a plurality of light receiving elements on the substrate, wherein the plurality of light receiving elements is configured to:

receive the emitted light in each phase indicated by a phase control signal; and generate a light receiving signal in the each phase;

a distance measuring unit configured to calculate distance information to a measurement object based on the light receiving signal;

a signal generation circuit configured to generate the phase control signal, wherein the signal generation circuit includes:

a plurality of oscillators that on the same substrate as the plurality of light receiving elements, wherein the plurality of oscillators is configured to generate the phase control signal for each phase, the plurality of oscillators corresponds to the plurality of light receiving elements; and a wiring configured to:

connect the plurality of oscillators; and form a closed path that passes through once each oscillator of the plurality of oscillators, wherein the wiring includes a plurality of switches configured to switch a connection state between the plurality of oscillator, the connection state between the plurality of oscillators is switched to switch a configuration of the closed path, and an impedance viewed from each oscillator of the plurality of oscillators in the closed path satisfies a specific condition.

21. A distance measuring method, comprising:

generating, by a plurality of light receiving elements, a plurality of light receiving signals based on light emission from a light source;

generating, by a plurality of oscillators of a signal generation circuit, a plurality of pseudo light receiving signals respectively corresponding to the plurality of light receiving elements, wherein the signal generation circuit includes:

a substrate;

the plurality of oscillators on the substrate, wherein plurality of oscillators corresponds to the plurality of light receiving elements, and the plurality of light receiving elements is on the same substrate; and a wiring configured to:

connect the plurality of oscillators; and form a closed path that passes through once each oscillator of the plurality of oscillators, wherein the wiring includes a plurality of switches configured to switch a connection state between the plurality of oscillators, the connection state between the plurality of oscillators is switched to switch a configuration of the closed path, and an impedance viewed from each oscillator of the plurality of oscillators in the closed path satisfies a specific condition;

calculating a correction amount for correcting a signal delay of the plurality of light receiving signals, the signal delay being detected based on the plurality of pseudo light receiving signals; and calculating distance information to a measurement object based on the plurality of light receiving signals and the correction amount.

22. An oscillation circuit, comprising:

a plurality of oscillators, wherein at least one oscillator of the plurality of oscillators includes a variable resistance circuit, and the at least one oscillator of the plurality of oscillators is configured to output an oscillation signal having a frequency corresponding to a resistance value of the variable resistance circuit; and a wiring configured to:

connect the plurality of oscillators; and form a closed path that passes through once each oscillator of the plurality of oscillators, wherein an impedance viewed from each oscillator of the plurality of oscillators in the closed path satisfies a specific condition.

* * * * *